US012796264B2

(12) United States Patent
Hodo et al.

(10) Patent No.: US 12,796,264 B2
(45) Date of Patent: Nov. 10, 2026

(54) DISPLAY APPARATUS, DISPLAY MODULE, ELECTRONIC DEVICE, AND METHOD OF MANUFACTURING DISPLAY APPARATUS

(71) Applicant: SEMICONDUCTOR ENERGY LABORATORY CO., LTD., Atsugi (JP)

(72) Inventors: Ryota Hodo, Atsugi (JP); Shinya Sasagawa, Chigasaki (JP); Yoshikazu Hiura, Atsugi (JP); Takahiro Fujie, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 560 days.

(21) Appl. No.: 18/548,186

(22) PCT Filed: Feb. 24, 2022

(86) PCT No.: PCT/IB2022/051611
§ 371 (c)(1),
(2) Date: Aug. 28, 2023

(87) PCT Pub. No.: WO2022/185149
PCT Pub. Date: Sep. 9, 2022

(65) Prior Publication Data

US 2024/0138204 A1 Apr. 25, 2024
US 2024/0237425 A9 Jul. 11, 2024

(30) Foreign Application Priority Data

Mar. 5, 2021 (JP) ................................ 2021-035224

(51) Int. Cl.
*H10K 59/35* (2023.01)
*H10K 50/17* (2023.01)
(Continued)

(52) U.S. Cl.
CPC ......... *H10K 59/35* (2023.02); *H10K 59/1201* (2023.02); *H10K 59/122* (2023.02); *H10K 59/353* (2023.02); *H10K 50/17* (2023.02)

(58) Field of Classification Search
CPC .. H10K 59/35; H10K 59/1201; H10K 59/122; H10K 59/353; H10K 59/124;
(Continued)

(56) References Cited

U.S. PATENT DOCUMENTS 4,187,534 A * 2/1980 Tichenor ................ F21V 17/02 362/268
5,953,985 A 9/1999 Kobayashi
(Continued)

FOREIGN PATENT DOCUMENTS

CN 001628492 A 6/2005
CN 102450101 A 5/2012
(Continued)

OTHER PUBLICATIONS

International Search Report (Application No. PCT/IB2022/051611) Dated May 31, 2022.
(Continued)

*Primary Examiner* — Mary Ellen Bowman
(74) *Attorney, Agent, or Firm* — Fish & Richardson P.C.

(57) ABSTRACT

A high-definition and high-resolution display apparatus is provided. A conductive film, a first layer, and a first sacrificial layer are formed. The first layer and the first sacrificial layer are processed to expose part of the conductive film. A second layer and a second sacrificial layer are formed over the first sacrificial layer and the conductive film. The second layer and the second sacrificial layer are processed to expose part of the conductive film. The conductive film is processed to form a first pixel electrode overlapping with the first sacrificial layer and a second pixel electrode overlapping
(Continued)

with the second sacrificial layer. Two insulating films covering at least a side surface of the first pixel electrode, a side surface of the second pixel electrode, a side surface of the first layer, a side surface of the second layer, a side surface and a top surface of the first sacrificial layer, and a side surface and atop surface of the second sacrificial layer are formed. The two insulating films are processed to form a sidewall covering at least the side surface of the first pixel electrode and the side surface of the first layer. The first sacrificial layer and the second sacrificial layer are removed. A common electrode is formed over the first layer and the second layer.

7 Claims, 32 Drawing Sheets

(51) Int. Cl.
*H10K 59/12* (2023.01)
*H10K 59/122* (2023.01)

(58) Field of Classification Search
CPC ........ H10K 59/32; H10K 50/17; H10K 50/15; H10K 50/16; G09F 9/00; G09F 9/30; G09F 9/302; H05B 33/10; H05B 33/12; H05B 33/22
See application file for complete search history.

(56) References Cited

U.S. PATENT DOCUMENTS 6,120,338 A 9/2000 Hirano et al.
6,244,730 B1* 6/2001 Goldberg ................ F21V 17/20 362/268
8,502,202 B2 8/2013 Nowatari et al.
8,791,881 B2 7/2014 Kanegae et al.
9,343,689 B2 5/2016 Nowatari et al.
10,050,221 B2 8/2018 Nowatari et al.
10,700,140 B2 6/2020 Lim et al.
10,749,123 B2 8/2020 Premutico et al.
10,777,762 B2 9/2020 Seo et al.
10,790,462 B2 9/2020 Seo et al.
10,910,579 B2 2/2021 Nowatari et al.
10,910,590 B2 2/2021 Harikrishna Mohan et al.
11,011,724 B2 5/2021 Lim et al.
11,268,677 B2* 3/2022 Mei ......................... F21V 14/02
11,545,642 B2 1/2023 Seo et al.
11,678,550 B2 6/2023 Kato
12,096,671 B2 9/2024 Kato
2002/0072139 A1 6/2002 Kashiwabara
2005/0012094 A1 1/2005 Park
2008/0137345 A1* 6/2008 Wimberly ............... F21V 14/02 362/368
2010/0301317 A1* 12/2010 Nowatari ............... H10K 50/13 257/E51.028
2010/0309101 A1* 12/2010 Kanegae .............. H10K 59/122 438/34
2011/0148290 A1 6/2011 Oota
2012/0256204 A1 10/2012 Yoshizumi et al.
2012/0273804 A1 11/2012 Hatano
2012/0276484 A1 11/2012 Izumi et al.
2013/0084531 A1 4/2013 Hamaguchi et al.
2013/0084664 A1 4/2013 Yoshitoku et al.
2013/0084666 A1 4/2013 Oshige
2013/0280839 A1 10/2013 Sonoda et al.
2013/0295705 A1 11/2013 Sonoda et al.
2014/0004640 A1 1/2014 Hamaguchi et al.
2014/0004642 A1 1/2014 Otsuka et al.
2015/0060826 A1 3/2015 Matsumoto et al.
2015/0069360 A1 3/2015 Sato
2015/0076476 A1 3/2015 Odaka et al.
2015/0280170 A1 10/2015 Harikrishna mohan et al.
2015/0349285 A1 12/2015 Seo et al.
2016/0172595 A1 6/2016 Malinowski et al.
2016/0315133 A1 10/2016 Sato
2016/0352878 A1* 12/2016 Kim ...................... G06F 1/1626
2017/0141167 A1 5/2017 Naganuma
2017/0256754 A1 9/2017 Defranco et al.
2018/0190908 A1 7/2018 Ke et al.
2019/0067394 A1 2/2019 Cheon et al.
2020/0006694 A1 1/2020 Lim et al.
2020/0203662 A1 6/2020 Mollard et al.
2020/0370729 A1* 11/2020 Eidam ..................... F21V 17/02
2021/0119175 A1 4/2021 Harikrishna mohan et al.
2021/0143354 A1 5/2021 Nowatari et al.
2022/0209162 A1 6/2022 Seo et al.
2022/0320184 A1* 10/2022 Okazaki ................. H10K 59/38
2023/0125419 A1 4/2023 Seo et al.
2025/0008802 A1 1/2025 Kato.

FOREIGN PATENT DOCUMENTS

CN 104952904 A 9/2015
CN 106465507 A 2/2017
CN 109509765 A 3/2019
CN 110660827 A 1/2020
EP 2927985 A 10/2015
EP 3496176 A 6/2019
JP 2000-036385 A 2/2000
JP 2000-113981 A 4/2000
JP 2003-059663 A 2/2003
JP 2005-518080 6/2005
JP 2008-098106 A 4/2008
JP 2008-147072 A 6/2008
JP 2008-251270 A 10/2008
JP 2010-033936 A 2/2010
JP 2011-009199 A 1/2011
JP 2012-160473 A 8/2012
JP 2014-120218 A 6/2014
JP 2014-135251 A 7/2014
JP 2014-232568 A 12/2014
JP 2015-115178 A 6/2015
JP 2015-191891 A 11/2015
JP 2016-006768 A 1/2016
JP 2016-197494 A 11/2016
JP 2019-179696 A 10/2019
JP 2020-004723 A 1/2020
JP 2020-047602 A 3/2020
JP 2020-160305 A 10/2020
JP 2021-007104 A 1/2021
KR 2002-0025917 A 4/2002
KR 2012-0027420 A 3/2012
KR 2015-0112885 A 10/2015
KR 2017-0010861 A 2/2017
KR 2019-0066359 A 6/2019
KR 2020-0001694 A 1/2020
TW 201103169 1/2011
TW 201601306 1/2016
TW 201608714 3/2016
WO WO-2003/069960 8/2003
WO WO-2009/133680 11/2009
WO WO-2010/137477 12/2010
WO WO-2015/181678 12/2015
WO WO-2018/087625 5/2018
WO WO-2020/004086 1/2020

OTHER PUBLICATIONS

Written Opinion (Application No. PCT/IB2022/051611) Dated May 31, 2022.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Ke. T et al., "Island and Hole Fabrication on OLED Stack for High-Resolution Sensor in Display Application", IDW '20 : Pro-

(56) References Cited

OTHER PUBLICATIONS ceedings of the 27th International Display Workshops, Dec. 9, 2020, vol. 27, pp. 902-905.
Malinowski.P et al., “Organic photolithography for displays with integrated fingerprint scanner”, SID Digest ’19 : SID International Symposium Digest of Technical Papers, May 29, 2019, vol. 50, No. 1, pp. 1007-1010.
Malinowski.P et al., “Integration of additional functionalities into the frontplane of AMOLED displays”, SID Digest ’20 : SID International Symposium Digest of Technical Papers, Aug. 1, 2020, vol. 51, No. 1, pp. 646-649.
Ke.T et al., “Technology Developments in High-Resolution FMM-free OLED and BEOL IGZO TFTs for Power-Efficient Microdisplays”, SID Digest ’21 : SID International Symposium Digest of Technical Papers, May 1, 2021, vol. 52, No. 1, pp. 127-130.
Papadopoulos.N et al., “AMOLED Displays with In-Pixel Photodetector”, Liquid Crystals and Display Technology, Jul. 9, 2020, pp. 1-19.
Malinowski.P et al., “Multicolor 1250 ppi OLED Arrays Patterened by Photolithography”, SID Digest ’16 : SID International Symposium Digest of Technical Papers, May 22, 2016, vol. 47, No. 1, pp. 1009-1012.
Malinowski.P et al., “Photolithographic patterning of organic photodetectors with a non-fluorinated photoresist system”, Organic Electronics, Jul. 12, 2014, vol. 15, No. 10, pp. 2355-2359.
Malinowski.P et al., “High resolution photolithography for direct view active matrix organic light-emitting diode augmented reality displays”, J. Soc. Inf. Display (Journal of the Society for Information Display), Apr. 2, 2018, vol. 26, No. 3, pp. 128-136.
Zakhidov.A et al., “Orthogonal processing: A new strategy for organic electronics”, Chem. Sci. (Chemical Science), Apr. 7, 2011, vol. 2, No. 6, pp. 1178-1182.

* cited by examiner 119a
118a
111
101
X1
X2
Y1
Y2
181A
182A
183A
140
113a
183a
182a
181a
190b
181B
182B
183B
118B
119B X1
X2
Y1
Y2
101
111a
113a
113b
111b
111c
113c
125a
125b
114
115
123
140

FIG. 20A
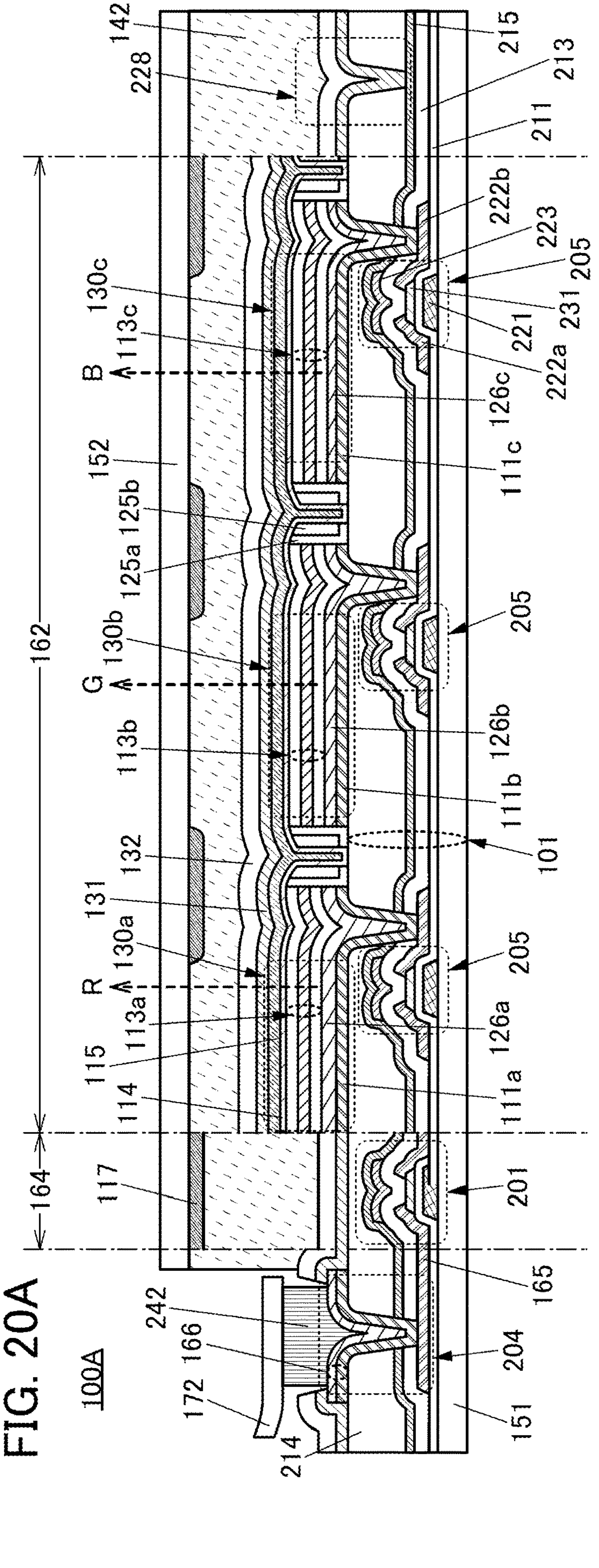
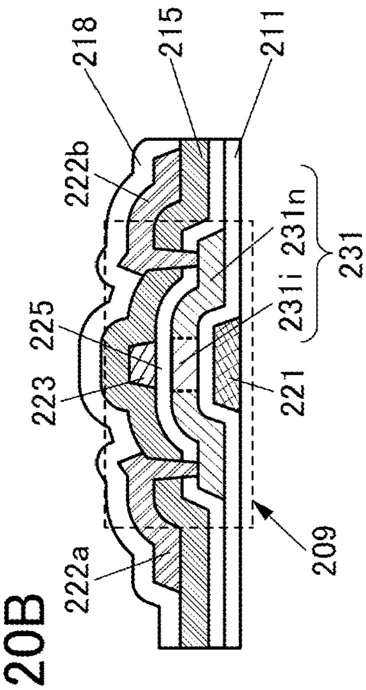
FIG. 20B
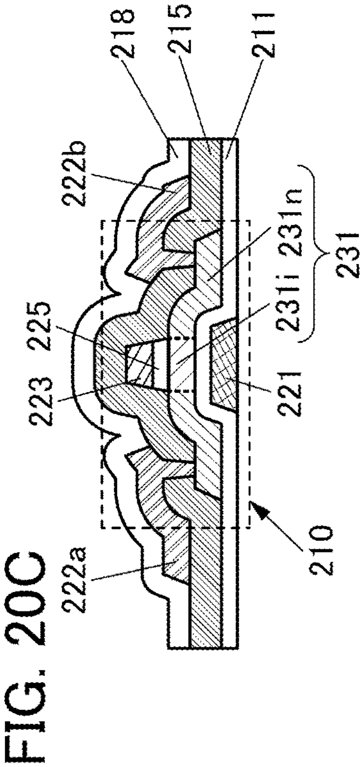
FIG. 20C

DISPLAY APPARATUS, DISPLAY MODULE, ELECTRONIC DEVICE, AND METHOD OF MANUFACTURING DISPLAY APPARATUS

CROSS REFERENCE TO RELATED APPLICATIONS

This application is a U.S. National Phase Application under 35 U.S.C. § 371 of International Application PCT/IB2022/051611, filed on Feb. 24, 2022, which is incorporated by reference and claims the benefit of a foreign priority application filed in Japan on Mar. 5, 2021, as Application No. 2021-035224.

TECHNICAL FIELD

One embodiment of the present invention relates to a display apparatus, a display module, and an electronic device. One embodiment of the present invention relates to a method of manufacturing a display apparatus.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method of driving any of them, and a method of manufacturing any of them.

BACKGROUND ART

In recent years, display apparatuses have been expected to be applied to a variety of uses. Examples of uses for a large display apparatus include a television device for home use (also referred to as a TV or a television receiver), digital signage, and a PID (Public Information Display). In addition, a smartphone, a tablet terminal, and the like including a touch panel are being developed as portable information terminals.

Furthermore, display apparatuses have been required to have higher definition. For example, devices for virtual reality (VR), augmented reality (AR), substitutional reality (SR), or mixed reality (MR) are given as devices requiring high-definition display apparatuses and have been actively developed.

Light-emitting apparatuses including light-emitting devices (also referred to as light-emitting elements) have been developed as display apparatuses, for example. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display apparatuses.

Patent Document 1 discloses a display apparatus using an organic EL device (also referred to as an organic EL element) for VR.

REFERENCE

Patent Document

[Patent Document 1] PCT International Publication No. 2018/087625

SUMMARY OF THE INVENTION

Problems to be Solved by the Invention

In the case of manufacturing a display apparatus including a plurality of organic EL devices emitting light of different colors, the light-emitting layers emitting light of different colors each need to be formed into an island shape.

For example, an island-shaped light-emitting layer can be formed by a vacuum evaporation method using a metal mask (also referred to as a shadow mask). However, this method causes a deviation from the designed shape and position of an island-shaped light-emitting layer due to various influences such as the low accuracy of the metal mask position, the positional deviation between the metal mask and a substrate, a warp of the metal mask, and the vapor-scattering-induced expansion of outline of the deposited film; accordingly, it is difficult to achieve high definition and a high aperture ratio of the display apparatus. In addition, the outline of the layer may blur during vapor deposition, whereby the thickness of an end portion may be small. That is, the thickness of the island-shaped light-emitting layer may vary from area to area. In the case of manufacturing a display apparatus with a large size, high resolution, or high definition, the manufacturing yield might be reduced because of low dimensional accuracy of the metal mask and deformation due to heat or the like.

In the case where a display apparatus is manufactured by a vacuum evaporation method using a metal mask, the metal mask needs to be cleaned on a regular basis and the cleaning stops a process. For this reason, at least two or more manufacturing equipment lines are preferably prepared so that one of the equipment lines is used for device fabrication while the other equipment line is being under maintenance; in consideration of mass production, a plurality of manufacturing equipment lines are required. Thus, the issue is that the initial investment for introducing manufacturing equipment significantly increases.

An object of one embodiment of the present invention is to provide a high-definition display apparatus. An object of one embodiment of the present invention is to provide a high-resolution display apparatus. An object of one embodiment of the present invention is to provide a large display apparatus. An object of one embodiment of the present invention is to provide a small display apparatus. An object of one embodiment of the present invention is to provide a highly reliable display apparatus.

An object of one embodiment of the present invention is to provide a method of manufacturing a high-definition display apparatus. An object of one embodiment of the present invention is to provide a method of manufacturing a high-resolution display apparatus. An object of one embodiment of the present invention is to provide a method of manufacturing a large display apparatus. An object of one embodiment of the present invention is to provide a method of manufacturing a small display apparatus. An object of one embodiment of the present invention is to provide a method of manufacturing a highly reliable display apparatus. An object of one embodiment of the present invention is to provide a method of manufacturing a display apparatus with high yield.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a method of manufacturing a display apparatus, including the steps of forming an insulating layer; forming a conductive film over the insulating layer; forming a first layer over the conductive film; forming a first sacrificial layer over the first layer; processing the first layer and the first sacrificial layer to expose part of the conductive film; forming a second layer over the first sacrificial layer and the conductive film; forming a second sacrificial layer over the second layer; processing the second layer and the second sacrificial layer to expose part of the conductive film; processing the conductive film to form a first pixel electrode overlapping with the first sacrificial layer and a second pixel electrode overlapping with the second sacrificial layer; forming a first insulating film covering at least a side surface of the first pixel electrode, a side surface of the second pixel electrode, a side surface of the first layer, a side surface of the second layer, a side surface and a top surface of the first sacrificial layer, and a side surface and a top surface of the second sacrificial layer; forming a second insulating film over the first insulating film; processing the first insulating film and the second insulating film to form a first sidewall covering at least the side surface of the first pixel electrode and the side surface of the first layer and a second sidewall over the first sidewall; removing the first sacrificial layer and the second sacrificial layer; and forming a common electrode over the first layer and the second layer.

It is preferable that a first sacrificial film and a second sacrificial film over the first sacrificial film be formed as the first sacrificial layer; a first resist mask be formed over the second sacrificial film, and then the second sacrificial film be processed by using the first resist mask; the first resist mask be removed; the first sacrificial film be processed by using the processed second sacrificial film as a hard mask; and the first layer be processed by using the processed first sacrificial film as a hard mask.

The conductive film is preferably processed with use of the first sacrificial layer and the second sacrificial layer as hard masks.

The first layer may include a first light-emitting unit, a charge-generation layer over the first light-emitting unit, and a second light-emitting unit over the charge-generation layer. The first light-emitting unit and the second light-emitting unit may include light-emitting layers emitting light of the same color.

After the removal of the first sacrificial layer and the second sacrificial layer, a third sacrificial layer may be formed over the first layer and the second layer, and a common electrode may be formed over the third layer.

A depressed portion may be formed on the insulating layer in the step of processing the conductive film.

One embodiment of the present invention is a display apparatus including a first light-emitting device, a second light-emitting device, a first sidewall, and a second sidewall. The first light-emitting device includes a first pixel electrode, a first light-emitting layer over the first pixel electrode, and a common electrode over the first light-emitting layer. The second light-emitting device includes a second pixel electrode, a second light-emitting layer over the second pixel electrode, and the common electrode over the second light-emitting layer. The first light-emitting device and the second light-emitting device have a function of emitting light of different colors. The first sidewall covers at least a side surface of the first pixel electrode and a side surface of the first light-emitting layer. The second sidewall covers at least the side surface of the first pixel electrode and the side surface of the first light-emitting layer with the first sidewall positioned therebetween.

The first light-emitting device can include a first hole-injection layer over the first pixel electrode, a first hole-transport layer over the first hole-injection layer, and a first electron-transport layer over the first light-emitting layer. Side surfaces of the first hole-injection layer, the first hole-transport layer, and the first electron-transport layer are covered with the first sidewall. The first light-emitting device can further include an electron-injection layer over the first electron-transport layer. Alternatively, the first light-emitting device can include a first hole-injection layer over the first pixel electrode, a first hole-transport layer over the first hole-injection layer, a first electron-transport layer over the first light-emitting layer, and a first electron-injection layer over the first electron-transport layer. Side surfaces of the first hole-injection layer, the first hole-transport layer, the first electron-transport layer, and the first electron-injection layer are covered with the first sidewall.

One embodiment of the present invention is a display apparatus including a first light-emitting device, a second light-emitting device, a first sidewall, and a second sidewall. The first light-emitting device includes a first pixel electrode, a first light-emitting unit over the first pixel electrode, a first charge-generation layer over the first light-emitting unit, a second light-emitting unit over the first charge-generation layer, and a common electrode over the second light-emitting unit. The second light-emitting device includes a second pixel electrode, a third light-emitting unit over the second pixel electrode, a second charge-generation layer over the third light-emitting unit, a fourth light-emitting unit over the second charge-generation layer, and the common electrode over the fourth light-emitting unit. The first light-emitting device and the second light-emitting device have a function of emitting light of different colors. The first sidewall covers at least a side surface of the first pixel electrode and a side surface of the first charge-generation layer. The second sidewall overlaps with the side surface of the first pixel electrode and the side surface of the first charge-generation layer with the first sidewall positioned therebetween.

It is preferable that the first light-emitting unit and the second light-emitting unit emit light of a first color, and the third light-emitting unit and the fourth light-emitting unit emit light of a second color.

One embodiment of the present invention is a display apparatus including a first light-emitting device, a second light-emitting device, a third light-emitting device, a first sidewall, and a second sidewall. The first light-emitting device includes a first pixel electrode, a first light-emitting unit over the first pixel electrode, a first charge-generation layer over the first light-emitting unit, a second light-emitting unit over the first charge-generation layer, and a common electrode over the second light-emitting unit. The second light-emitting device includes a second pixel electrode, a third light-emitting unit over the second pixel electrode, a second charge-generation layer over the third light-emitting unit, a fourth light-emitting unit over the second charge-generation layer, and the common electrode over the fourth light-emitting unit. The third light-emitting device includes a third pixel electrode, a fifth light-emitting unit over the third pixel electrode, a third charge-generation layer over the fifth light-emitting unit, a sixth light-emitting unit over the third charge-generation layer, and the common electrode over the sixth light-emitting unit. The first light-emitting device, the second light-emitting device, and the third light-emitting device have a function of emitting light of different colors. The first sidewall covers at least a side surface of the first pixel electrode and a side surface of the first charge-generation layer. The second sidewall overlaps with the side surface of the first pixel electrode and the side surface of the first charge-generation layer with the first sidewall positioned therebetween.

It is preferable that the first light-emitting unit and the second light-emitting unit emit light of a first color, the third light-emitting unit and the fourth light-emitting unit emit light of a second color, and the fifth light-emitting unit and the sixth light-emitting unit emit light of a third color. It is preferable that the first color be red, the second color be green, and the third color be blue.

A protective layer is preferably formed over the common electrode.

The first light-emitting device and the second light-emitting device may be provided over an insulating layer including a depressed portion.

A space may be provided between the first light-emitting device and the second light-emitting device.

One embodiment of the present invention is a display module including the display apparatus having any of the above-described structures and is, for example, a display module provided with a connector such as a flexible printed circuit (hereinafter referred to as an FPC) or a TCP (Tape Carrier Package), or a display module on which an integrated circuit (IC) is mounted by a COG (Chip On Glass) method, a COF (Chip On Film) method, or the like.

One embodiment of the present invention is an electronic device including the above display module and at least one of a housing, a battery, a camera, a speaker, and a microphone.

Effect of the Invention

With one embodiment of the present invention, a high-definition display apparatus can be provided. With one embodiment of the present invention, a high-resolution display apparatus can be provided. With one embodiment of the present invention, a large display apparatus can be provided. With one embodiment of the present invention, a small display apparatus can be provided. With one embodiment of the present invention, a highly reliable display apparatus can be provided.

With one embodiment of the present invention, a method of manufacturing a high-definition display apparatus can be provided. With one embodiment of the present invention, a method of manufacturing a high-resolution display apparatus can be provided. With one embodiment of the present invention, a method of manufacturing a large display apparatus can be provided. With one embodiment of the present invention, a method of manufacturing a small display apparatus can be provided. With one embodiment of the present invention, a method of manufacturing a highly reliable display apparatus can be provided. With one embodiment of the present invention, a method of manufacturing a display apparatus with high yield can be provided.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIG. 20A is a cross-sectional view illustrating an example of a display apparatus. FIG. 20B and FIG. 20C are cross-sectional views illustrating examples of a transistor.

MODE FOR CARRYING OUT THE INVENTION

Figure 1A:
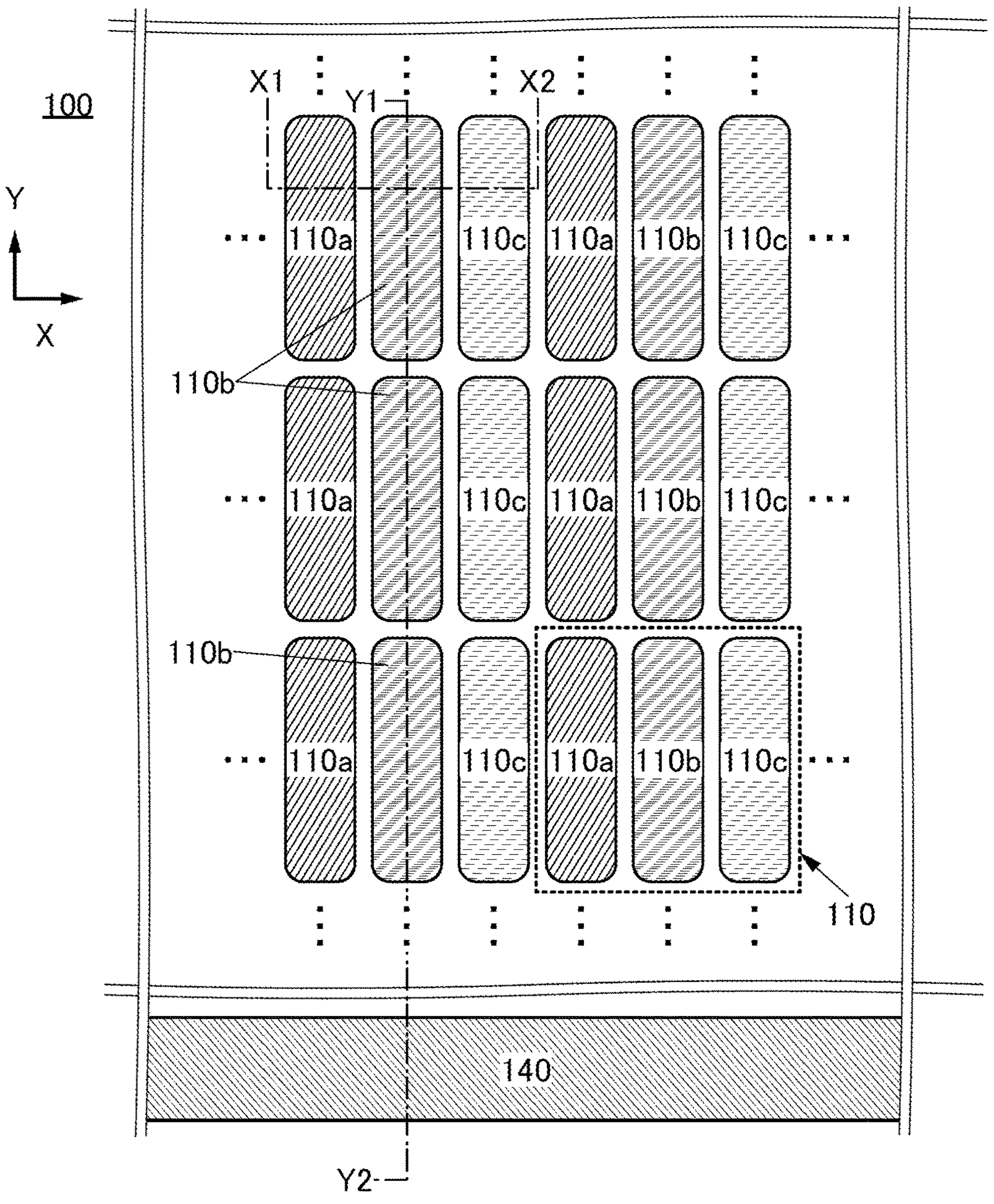
FIG. 1A is a top view illustrating an example of a display apparatus.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatching pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

The term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display apparatus of one embodiment of the present invention and a manufacturing method thereof are described with reference to FIG. 1 to FIG. 14.

In a method of manufacturing a display apparatus of one embodiment of the present invention, a conductive film is formed, a first layer (also referred to as an EL layer or part of an EL layer) including a light-emitting layer emitting light of a first color is formed over the entire surface, and then a first sacrificial layer is formed over the first layer. Then, a first resist mask is formed over the first sacrificial layer and the first layer and the first sacrificial layer are processed using the first resist mask, whereby the first layer is formed into an island shape. Next, in a manner similar to that for the first layer, a second layer (also referred to as an EL layer or part of an EL layer) including a light-emitting layer emitting light of a second color is processed into an island shape using a second sacrificial layer and a second resist mask.

As described above, in the method of manufacturing a display apparatus of one embodiment of the present invention, the island-shaped EL layers are formed not by using a metal mask having a fine pattern but by processing an EL layer deposited over the entire surface. Accordingly, a high-definition display apparatus or a display apparatus with a high aperture ratio, which has been difficult to achieve, can be manufactured. Moreover, EL layers can be formed separately for the respective colors, enabling the display apparatus to perform extremely clear display with high contrast and high display quality. In addition, the sacrificial layers (also referred to as mask layers) provided over the EL layers can reduce damage to the EL layers during the manufacturing process of the display apparatus, increasing the reliability of a light-emitting device.

It is difficult to set the distance between adjacent light-emitting devices to be less than m with a formation method using a metal mask, for example; however, with the above method, the distance can be decreased to less than 10 μm, 5 μm or less, 3 μm or less, 2 μm or less, or 1 μm or less. Furthermore, for example, with the use of a light exposure tool for LSI, the interval can be reduced to be 500 nm or less, 200 nm or less, 100 nm or less, or even 50 nm or less. Accordingly, the area of a non-light-emitting region that could exist between two light-emitting devices can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90%; that is, an aperture ratio lower than 100% can be achieved.

Furthermore, a pattern of the EL layer itself (also referred to as a processing size) can be made much smaller than that in the case of using a metal mask. For example, in the case of using a metal mask for forming EL layers separately, a variation in the thickness occurs between the center and the edge of the EL layer, which causes a reduction in an effective area that can be used as a light-emitting region with respect to the area of the EL layer. In contrast, in the above manufacturing method, a film deposited to have a uniform thickness is processed, so that island-shaped EL layers can be formed to have a uniform thickness. Accordingly, even in a fine pattern, almost the whole area can be used as a light-emitting region. Thus, a display apparatus having both high definition and a high aperture ratio can be manufactured.

After the EL layers emitting light of the respective colors are formed, the conductive film is processed with the sacrificial layers remaining over the EL layers used as a hard mask, whereby pixel electrodes can be formed. A mask for forming island-shaped pixel electrodes does not need to be provided additionally, reducing the manufacturing costs of the display apparatus. Furthermore, an insulating layer covering end portions of the pixel electrodes does not need to be provided between the pixel electrodes and the EL layers, so that the distance between adjacent light-emitting devices can be extremely narrowed. As a result, higher definition or higher resolution of the display apparatus can be achieved. In addition, a mask for forming the insulating layer is not needed, which leads to a reduction in manufacturing cost of the display apparatus.

Here, each of the first layer and the second layer includes at least a light-emitting layer and preferably consists of a plurality of layers. Specifically, one or more layers are preferably formed over the light-emitting layer. A layer between the light-emitting layer and the sacrificial layer can inhibit the light-emitting layer from being exposed on the outermost surface during the manufacturing process of the display apparatus and can reduce damage to the light-emitting layer. Accordingly, the reliability of the light-emitting device can be increased. Thus, the first layer and the second layer each preferably include the light-emitting layer and a carrier-transport layer (an electron-transport layer or a hole-transport layer) over the light-emitting layer.

Note that it is not necessary to form all layers included in the EL layers separately between the light-emitting devices emitting light of different colors from each other, and some layers of the EL layers can be formed in the same step. In the method of manufacturing a display apparatus of one embodiment of the present invention, after some layers included in the EL layers are formed into an island shape separately for each color, the sacrificial layer is removed and then other layers included in the EL layers and a common electrode (also referred to as an upper electrode) are formed so as to be shared (as one film) by the light-emitting devices of different colors. For example, a carrier-injection layer and a common electrode can be formed so as to be shared by the light-emitting devices of different colors. Meanwhile, the carrier-injection layer is often a layer having relatively high conductivity in the EL layers. Therefore, when the carrier-injection layer is in contact with a side surface of any layer of the EL layers formed into an island shape or a side surface of the pixel electrode, the light-emitting device might be short-circuited. Note that also in the case where the carrier-injection layer is formed into an island shape and the common electrode is formed to be shared by the light-emitting devices of different colors, the light-emitting device might be short-circuited when the common electrode is in contact with the side surface of the EL layer or the side surface of the pixel electrode.

In view of the above, the display apparatus of one embodiment of the present invention includes a sidewall (also referred to as a sidewall protective layer, a sidewall insulating film, an insulating layer, or the like) that covers a side surface of an island-shaped light-emitting layer and the side surface of the pixel electrode.

This can inhibit at least some layers of the island-shaped EL layers and the pixel electrodes from being in contact with the carrier-injection layer or the common electrode. Thus, a short circuit in the light-emitting device is inhibited, and the reliability of the light-emitting device can be improved.

The display apparatus of one embodiment of the present invention includes a pixel electrode functioning as an anode; an island-shaped hole-injection layer, an island-shaped hole-transport layer, an island-shaped light-emitting layer, and an island-shaped electron-transport layer that are provided in this order over the pixel electrode; a sidewall provided to cover side surfaces of the pixel electrode, the hole-injection layer, the hole-transport layer, the light-emitting layer, and the electron-transport layer; an electron-injection layer provided over the electron-transport layer; and a common electrode that is provided over the electron-injection layer and functions as a cathode.

Alternatively, the display apparatus of one embodiment of the present invention includes a pixel electrode functioning as a cathode; an island-shaped electron-injection layer, an island-shaped electron-transport layer, an island-shaped light-emitting layer, and an island-shaped hole-transport layer that are provided in this order over the pixel electrode; a sidewall provided to cover side surfaces of the pixel electrode, the electron-injection layer, the electron-transport layer, the light-emitting layer, and the hole-transport layer; a hole-injection layer provided over the hole-transport layer; and a common electrode that is provided over the hole-injection layer and functions as an anode.

Alternatively, the display apparatus of one embodiment of the present invention includes a pixel electrode, a first light-emitting unit over the pixel electrode, a charge-generation layer (also referred to as an intermediate layer) over the first light-emitting unit, a second light-emitting unit over the charge-generation layer, a sidewall provided to cover side surfaces of the pixel electrode, the first light-emitting unit, the charge-generation layer, and the second light-emitting unit, and a common electrode provided over the second light-emitting unit. Note that one or both of an electron-transport layer and an electron-injection layer may be provided between the second light-emitting unit and the common electrode as a common layer shared by the light-emitting devices of different colors.

The hole-injection layer, the electron-injection layer, and the charge-generation layer, for example, often have relatively high conductivity in the EL layer. Since the side surfaces of these layers are covered with the insulating layer in the display apparatus of one embodiment of the present invention, these layers can be prevented from being in contact with the common electrode or the like. Consequently, a short circuit of the light-emitting device can be suppressed, and the reliability of the light-emitting device can be increased.

With such a structure, a highly reliable display apparatus with high definition or high resolution can be manufactured. It is not necessary to increase the definition in a pseudo manner by using a special pixel arrangement method such as a pentile method, for example; even an arrangement method where one pixel consists of three or more subpixels enables a display apparatus with ultra-high definition. For example, it is possible to achieve a display apparatus that employs what is called a stripe arrangement in which R, G, and B pixels are arranged in one direction and has definition higher than or equal to 500 ppi, higher than or equal to 1000 ppi, higher than or equal to 2000 ppi, higher than or equal to 3000 ppi, or higher than or equal to 5000 ppi.

The sidewall may have a single-layer structure or a stacked-layer structure. In particular, a sidewall having a two-layer structure is preferably used. For example, the first layer of the sidewall is preferably formed by an atomic layer deposition (ALD) method that causes less deposition damage because of being formed in contact with the EL layer. The second layer of the sidewall is preferably formed by a sputtering method, a chemical vapor deposition (CVD) method, or a plasma-enhanced chemical vapor deposition (PECVD) method, which have higher deposition speed than an ALD method. In that case, a highly reliable display apparatus can be manufactured with high productivity.

For example, an aluminum oxide film formed by an ALD method can be used as the first layer of the sidewall and a silicon nitride film or a silicon nitride oxide film formed by a sputtering method or a PECVD method can be used as the second layer of the sidewall.

Structure Example 1 of Display Apparatus

Figure 1B:
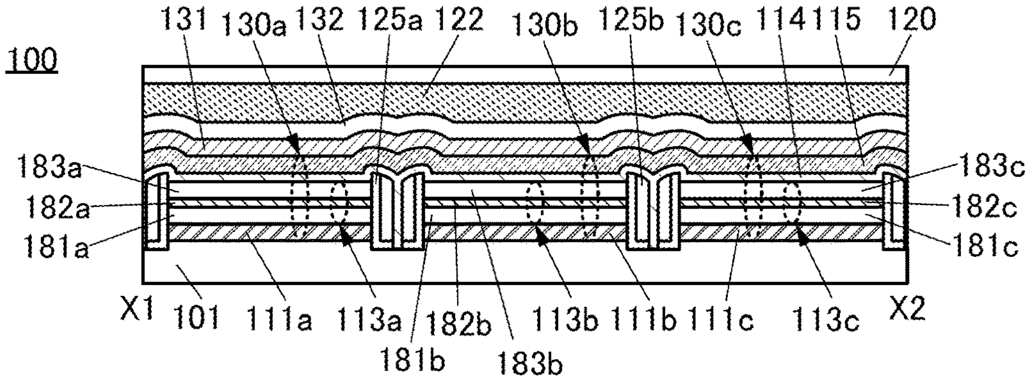
FIG. 1B is a cross-sectional view illustrating an example of the display apparatus.

FIG. 1A and FIG. 1B illustrate a display apparatus of one embodiment of the present invention.

FIG. 1A illustrates a top view of a display apparatus 100. The display apparatus 100 includes a display portion in which a plurality of pixels 110 are arranged in a matrix, and a connection portion 140 outside the display portion. The connection portion 140 can also be referred to as a cathode contact portion.

The pixel 110 illustrated in FIG. 1A employs stripe arrangement. Each of the pixels 110 illustrated in FIG. 1A consists of three subpixels 110*a*, 110*b*, and 110*c*. The subpixels 110*a*, 110*b*, and 110*c* include light-emitting devices that emit light of different colors. The subpixels 110*a*, 110*b*, and 110*c* can be of three colors of red (R), green (G), and blue (B) or of three colors of yellow (Y), cyan (C), and magenta (M), for example.

The top surface shapes of the subpixels illustrated in FIG. 1A correspond to the top surface shapes of light-emitting regions.

The range of the circuit layout for forming the subpixels is not limited to the range of the subpixels illustrated in FIG. 1A and may be placed outside the subpixels. For example, some or all of transistors included in the subpixel 110*a* may be positioned outside the range of the subpixel 110*a* illustrated in FIG. 1A. For example, transistors included in the subpixel 110*a* may include a portion positioned within the range of the subpixel 110*b*, or may include a portion positioned within the range of the subpixel 110*c*.

Although the subpixels 110*a*, 110*b*, and 110*c* have the same or substantially the same aperture ratio (also referred to as size or size of a light-emitting region) in FIG. 1A, one embodiment of the present invention is not limited thereto. The aperture ratio of each of the subpixels 110*a*, 110*b*, and 110*c* can be determined as appropriate. The subpixels 110*a*, 110*b*, and 110*c* may have different aperture ratios, or two or more of the subpixels 110*a*, 110*b*, and 110*c* may have the same or substantially the same aperture ratio.

FIG. 1A illustrates an example in which subpixels of different colors are aligned in the X direction and subpixels of the same color are aligned in the Y direction. Note that subpixels of different colors may be aligned in the Y direction, and subpixels of the same color may be aligned in the X direction.

Although the top view of FIG. 1A illustrates an example in which the connection portion 140 is positioned in the lower side of the display portion, one embodiment of the present invention is not limited thereto. The connection portion 140 only needs to be provided in at least one of the upper side, the right side, the left side, and the lower side of the display portion in the top view, or may be provided so as to surround the four sides of the display portion. The number of connection portions 140 may be one or more.

FIG. 1B is a cross-sectional view taken along the dashed-dotted line X1-X2 in FIG. 1A.

As illustrated in FIG. 1B, in the display apparatus 100, light-emitting devices 130*a*, 130*b*, and 130*c* are provided over a layer 101 including transistors and protective layers 131 and 132 are provided to cover these light-emitting devices. A substrate 120 is bonded to the protective layer 132 with a resin layer 122. In a region between adjacent light-emitting devices, a sidewall 125*a* and a sidewall 125*b* over the sidewall 125*a* are provided.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including transistors can employ a stacked-layer structure in which a plurality of transistors are provided over a substrate and an insulating layer is provided to cover these transistors, for example. The layer 101 including transistors may have a depressed portion between adjacent light-emitting devices. For example, an insulating layer positioned on the outermost surface of the layer 101 including transistors may have a depressed portion. Structure examples of the layer 101 including transistors will be described in Embodiments 3 and 4.

The light-emitting devices 130*a*, 130*b*, and 130*c* emit light of different colors from each other. Preferably, the light-emitting devices 130*a*, 130*b*, and 130*c* emit light of three colors, red (R), green (G), and blue (B), for example.

As the light-emitting devices 130*a*, 130*b*, and 130*c*, an OLED (Organic Light Emitting Diode) or a QLED (Quantum-dot Light Emitting Diode) is preferably used. Examples of a light-emitting substance (also referred to as a light-emitting material) contained in the light-emitting device include a substance that emits fluorescent light (a fluorescent material), a substance that emits phosphorescent light (a phosphorescent material), a substance that exhibits thermally activated delayed fluorescence (a thermally activated delayed fluorescent (TADF) material), and the like. Note that as a TADF material, a material that is in a thermal equilibrium state between a singlet excited state and a triplet excited state may be used. Since such a TADF material enables a short emission lifetime (excitation lifetime), an efficiency decrease of a light-emitting device in a high-luminance region can be inhibited. An inorganic compound (e.g., a quantum dot material) may also be used as the light-emitting substance included in the light-emitting device.

Each of the light-emitting devices includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. Hereinafter, the case where the pixel electrode functions as an anode and the common electrode functions as a cathode is described as an example.

The light-emitting device 130*a* includes a pixel electrode 111*a* over the layer 101 including transistors, a first layer 113*a* having an island shape over the pixel electrode 111*a*, a fifth layer 114 over the first layer 113*a*, and a common electrode 115 over the fifth layer 114.

In this embodiment, the case where the light-emitting device has a tandem structure is described as an example. Thus, the light-emitting device of this embodiment includes a plurality of light-emitting units each including a light-emitting layer and includes a charge-generation layer between two of the light-emitting units. The structure of the light-emitting device is not particularly limited and may be a single structure. Note that structure examples of the light-emitting device will be described later in Embodiment 2.

The first layer 113*a* includes a first light-emitting unit 181*a* over the pixel electrode 111*a*, a charge-generation layer 182*a* over the first light-emitting unit 181*a*, and a second light-emitting unit 183*a* over the charge-generation layer 182*a*. In the light-emitting device 130*a*, the first layer 113*a* and the fifth layer 114 can be collectively referred to as an EL layer. The first light-emitting unit 181*a* and the second light-emitting unit 183*a* may be configured to emit light of the same color or emit light of different colors.

The light-emitting device 130*b* includes a pixel electrode 111*b* over the layer 101 including transistors, an island-shaped second layer 113*b* over the pixel electrode 111*b*, the fifth layer 114 over the island-shaped second layer 113*b*, and the common electrode 115 over the fifth layer 114. The second layer 113*b* includes a first light-emitting unit 181*b* over the pixel electrode 111*b*, a charge-generation layer 182*b* over the first light-emitting unit 181*b*, and a second light-emitting unit 183*b* over the charge-generation layer 182*b*. In the light-emitting device 130*b*, the second layer 113*b* and the fifth layer 114 can be collectively referred to as an EL layer. The first light-emitting unit 181*b* and the second light-emitting unit 183*b* may be configured to emit light of the same color or emit light of different colors.

The light-emitting device 130*c* includes a pixel electrode 111*c* over the layer 101 including transistors, an island-shaped third layer 113*c* over the pixel electrode 111*c*, the fifth layer 114 over the island-shaped third layer 113*c*, and the common electrode 115 over the fifth layer 114. The third layer 113*c* includes a first light-emitting unit 181*c* over the pixel electrode 111*c*, a charge-generation layer 182*c* over the first light-emitting unit 181*c*, and a second light-emitting unit 183*c* over the charge-generation layer 182*c*. In the light-emitting device 130*c*, the third layer 113*c* and the fifth layer 114 can be collectively referred to as an EL layer. The first light-emitting unit 181*c* and the second light-emitting unit 183*c* may be configured to emit light of the same color or emit light of different colors.

The light-emitting devices of different colors share one film serving as the common electrode. The common electrode shared by the light-emitting devices of different colors is electrically connected to a conductive layer provided in the connection portion 140.

A conductive film that transmits visible light is used as the electrode through which light is extracted among the pixel electrode and the common electrode. A conductive film that reflects visible light is preferably used as the electrode through which light is not extracted.

As a material that forms the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy containing silver such as an alloy of silver and magnesium and an alloy of silver, palladium, and copper (Ag—Pd—Cu, also referred to as APC). In addition, it is possible to use a metal such as aluminum (Al), magnesium (Mg), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting devices preferably employ a microcavity structure. Therefore, one of the pair of electrodes of the light-emitting devices is preferably an electrode having properties of transmitting and reflecting visible light (a semi-transmissive and semi-reflective electrode), and the other is preferably an electrode having a property of reflecting visible light (a reflective electrode). When the light-emitting devices have a microcavity structure, light obtained from the light-emitting layers can be resonated between the electrodes, whereby light emitted from the light-emitting devices can be intensified.

Note that the semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity lower than or equal to $1\times10^{-2}$ Ωcm.

The first layer 113*a*, the second layer 113*b*, and the third layer 113*c* are each provided to have an island shape. The first layer 113*a*, the second layer 113*b*, and the third layer 113*c* each include a light-emitting layer. The first layer 113*a*, the second layer 113*b*, and the third layer 113*c* preferably include light-emitting layers that emit light of different colors.

The light-emitting layer is a layer containing a light-emitting substance. The light-emitting layer can contain one or more kinds of light-emitting substances. As the light-emitting substance, a substance that exhibits an emission color of blue, violet, bluish violet, green, yellowish green, yellow, orange, red, or the like is appropriately used. A substance that emits near-infrared light can also be used as the light-emitting substance.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. As one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting device can be achieved at the same time.

In addition to the light-emitting layer, the first layer 113*a*, the second layer 113*b*, and the third layer 113*c* may further include a layer containing any of a substance with a high hole-injection property, a substance with a high hole-transport property (also referred to as a hole-transport material), a hole-blocking material, a substance with a high electron-transport property (also referred to as an electron-transport material), a substance with a high electron-injection property, an electron-blocking material, a substance with a bipolar property (a substance with a high electron-transport property and a high hole-transport property, also referred to as a bipolar material), and the like.

For example, the first layer 113*a*, the second layer 113*b*, and the third layer 113*c* may each include one or more of a hole-injection layer, a hole-transport layer, a hole-blocking layer, an electron-blocking layer, an electron-transport layer, and an electron-injection layer.

In the EL layer, one or more of a hole-injection layer, a hole-transport layer, a hole-blocking layer, an electron-blocking layer, an electron-transport layer, and an electron-injection layer can be formed as a layer common to the light-emitting devices. For example, a carrier-injection layer (a hole-injection layer or an electron-injection layer) may be formed as the fifth layer 114. Note that all the layers in the EL layer may be separately formed from those in light-emitting devices of different colors. That is, the EL layer does not necessarily include a layer common to light-emitting devices of different colors.

The second light-emitting units 183*a*, 183*b*, and 183*c* each preferably include a light-emitting layer and a carrier-transport layer over the light-emitting layer. Accordingly, the light-emitting layer is inhibited from being exposed on the outermost surface in the process of manufacturing the display apparatus 100, so that damage to the light-emitting layer can be reduced. Thus, the reliability of the light-emitting device can be increased.

The side surfaces of the pixel electrodes 111*a*, 111*b*, and 111*c*, the first layer 113*a*, the second layer 113*b*, and the third layer 113*c* are covered with the sidewalls 125*a* and 125*b*, and the sidewalls 125*a* and 125*b* are positioned between the side surfaces of these layers and the fifth layer 114 (or the common electrode 115). Thus, the fifth layer 114 (or the common electrode 115) can be prevented from being in contact with any of the side surfaces of the pixel electrodes 111*a*, 111*b*, and 111*c*, the first layer 113*a*, the second layer 113*b*, and the third layer 113*c*, whereby a short circuit of the light-emitting device can be inhibited.

A hole-injection layer is a layer injecting holes from an anode to a hole-transport layer, and a layer containing a substance with a high hole-injection property. Examples of the substance with a high hole-injection property include an aromatic amine compound and a composite material containing a hole-transport material and an acceptor material (electron-accepting material).

The hole-transport layer is a layer transporting holes, which are injected from an anode by a hole-injection layer, to a light-emitting layer. The hole-transport layer is a layer containing a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, substances having a high hole-transport property, such as a κ-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by an electron-injection layer, to a light-emitting layer. The electron-transport layer is a layer containing an electron-transport material. As the electron-transport material, a substance having an electron mobility greater than or equal to $1\times10^{-6}$ cm$^2$/Vs is preferable. Note that other substances can also be used as long as they have a property of transporting more electrons than holes. As the electron-transport material, it is possible to use a substance having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, ytterbium, lithium fluoride (LiF), cesium fluoride (CsF), calcium fluoride ($CaF_x$, X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used. The electron-injection layer may have a stacked-layer structure of two or more layers. In the stacked-layer structure, for example, lithium fluoride can be used for the first layer and ytterbium can be used for the second layer.

Alternatively, an electron-transport material may be used for the electron-injection layer. For example, a compound having an unshared electron pair and having an electron deficient heteroaromatic ring can be used as the electron-transport material. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), or 2,4,6-tris[3'-(pyridin-3-yl)biphenyl-3-yl]-1,3,5-triazine (abbreviation: TmPPPyTz) can be used as the organic compound having an unshared electron pair. Note that NBPhen has a higher glass transition temperature (Tg) than BPhen and thus has high heat resistance.

In the case of manufacturing a tandem light-emitting device, a charge-generation layer is provided between two light-emitting units. The charge-generation layer includes at least a charge-generation region. The charge-generation layer has a function of injecting electrons into one of the two light-emitting units and injecting holes into the other when voltage is applied between the pair of electrodes.

As described above, the charge-generation layer includes at least a charge-generation region. The charge-generation region preferably contains an acceptor material, and for example, preferably contains a hole-transport material and an acceptor material which can be used for the hole-injection layer.

In addition, the charge-generation layer preferably includes a layer containing a substance having a high electron-injection property. The layer can also be referred to as an electron-injection buffer layer. The electron-injection buffer layer is preferably provided between the charge-generation region and the electron-transport layer. By provision of the electron-injection buffer layer, an injection barrier between the charge-generation region and the electron-transport layer can be lowered; thus, electrons generated in the charge-generation region can be easily injected into the electron-transport layer.

The electron-injection buffer layer preferably contains an alkali metal or an alkaline earth metal, and for example, can contain an alkali metal compound or an alkaline earth metal compound. Specifically, the electron-injection buffer layer preferably contains an inorganic compound containing an alkali metal and oxygen or an inorganic compound containing an alkaline earth metal and oxygen, further preferably contains an inorganic compound containing lithium and oxygen (e.g., lithium oxide ($Li_2O$)). Alternatively, a material that can be used for the electron-injection layer can be used for the electron-injection buffer layer.

The charge-generation layer preferably includes a layer containing a substance having a high electron-transport property. The layer can also be referred to as an electron-relay layer. The electron-relay layer is preferably provided between the charge-generation region and the electron-injection buffer layer. In the case where the charge-generation layer does not include an electron-injection buffer layer, the electron-relay layer is preferably provided between the charge-generation region and the electron-transport layer. The electron-relay layer has a function of preventing interaction between the charge-generation region and the electron-injection buffer layer (or the electron-transport layer) and smoothly transferring electrons.

A phthalocyanine-based material such as copper(II) phthalocyanine (abbreviation: CuPc) or a metal complex having a metal-oxygen bond and an aromatic ligand is preferably used for the electron-relay layer.

Note that the charge-generation region, the electron-injection buffer layer, and the electron-relay layer cannot be clearly distinguished from each other in some cases depending on the cross-sectional shapes, the characteristics, or the like.

Note that the charge-generation layer may contain a donor material instead of an acceptor material. For example, the charge-generation layer may include a layer containing an electron-transport material and a donor material, which can be used for the electron-injection layer.

When the light-emitting units are stacked, provision of a charge-generation layer between two light-emitting units can suppress an increase in driving voltage.

Either a low molecular compound or a high molecular compound can be used for the light-emitting device, and an inorganic compound may also be included. Each of the layers included in the light-emitting device can be formed by an evaporation method (including a vacuum evaporation method), a transfer method, a printing method, an ink-jet method, a coating method, or the like.

As the sidewalls **125*a* and 125*b***, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Note that in this specification and the like, oxynitride refers to a material that contains more oxygen than nitrogen, and nitride oxide refers to a material that contains more nitrogen than oxygen.

The sidewall **125*a* is preferably formed by an ALD method that causes less deposition damage because of being formed in contact with the first layer 113*a*, the second layer 113*b*, and the third layer 113*c*. For example, an aluminum oxide film formed by an ALD method is preferably used as the sidewall 125*a***.

The sidewall **125*b* is preferably formed by a sputtering method, a CVD method, a PECVD method, or the like which has higher deposition speed than an ALD method. For example, a silicon nitride film formed by a sputtering method or a silicon nitride oxide film formed by a PECVD method can be used as the sidewall 125*b***. In that case, a highly reliable display apparatus can be manufactured with high productivity.

The protective layers 131 and 132 are preferably provided over the light-emitting devices **130*a*, 130*b*, and 130*c*. Providing the protective layers 131 and 132 can improve the reliability of the light-emitting devices. Although this embodiment describes a two-layer structure of the protective layers 131 and 132** as an example, the protective layer may have a single layer structure or a stacked-layer structure of three or more layers.

There is no limitation on the conductivity of the protective layers 131 and 132. As the protective layers 131 and 132, at least one type of insulating films, semiconductor films, and conductive films can be used.

The protective layers 131 and 132 including inorganic films can inhibit deterioration of the light-emitting devices by preventing oxidation of the common electrode 115 and inhibiting entry of impurities (e.g., moisture and oxygen)

into the light-emitting devices 130*a*, 130*b*, and 130*c*, for example; thus, the reliability of the display apparatus can be improved.

As the protective layers 131 and 132, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Each of the protective layers 131 and 132 preferably includes a nitride insulating film or a nitride oxide insulating film, and further preferably includes a nitride insulating film.

As the protective layers 131 and 132, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layers 131 and 132, the protective layers 131 and 132 preferably have a high visible-light-transmitting property. For example, ITO, IGZO, and aluminum oxide are preferable because they are inorganic materials having a high visible-light-transmitting property.

The protective layers 131 and 132 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layer.

Furthermore, the protective layers 131 and 132 may each include an organic film. For example, the protective layer 132 may include both an organic film and an inorganic film.

The protective layer 131 and the protective layer 132 may be formed by different deposition methods. Specifically, the protective layer 131 and the protective layer 132 may be formed by an atomic layer deposition (ALD) method and a sputtering method, respectively.

End portions of top surfaces of the pixel electrodes 111*a*, 111*b*, and 111*c* are not covered with an insulating layer. This allows the distance between adjacent light-emitting devices to be extremely narrowed. As a result, the display apparatus can have high definition or high resolution.

In this specification and the like, a device formed using a metal mask or an FMM (fine metal mask, high-resolution metal mask) may be referred to as a device having an MM (metal mask) structure. In this specification and the like, a device formed without using a metal mask or an FMM may be referred to as a device having an MML (metal maskless) structure.

Note that in this specification and the like, a structure in which light-emitting layers in light-emitting devices of different colors (here, blue (B), green (G), and red (R)) are separately formed or separately patterned may be referred to as an SBS (Side By Side) structure. The SBS structure can optimize materials and structures of light-emitting devices and thus can extend freedom of choice of materials and structures, whereby the luminance and the reliability can be easily improved.

In this specification and the like, a light-emitting device capable of emitting white light may be referred to as a white-light-emitting device. Note that a combination of white-light-emitting devices with coloring layers (e.g., color filters) enables a full-color display apparatus.

Structures of light-emitting devices can be classified roughly into a single structure and a tandem structure. A device having a single structure includes one light-emitting unit between a pair of electrodes, and the light-emitting unit preferably includes one or more light-emitting layers. In the case of obtaining white light emission with use of two light-emitting layers, the two light-emitting layers may be selected such that their emission colors are complementary colors. For example, when the emission color of a first light-emitting layer and the emission color of a second light-emitting layer are complementary colors, the light-emitting device can be configured to emit white light as a whole. In the case of obtaining white light emission with use of three or more light-emitting layers, a light-emitting device may be configured to emit white color as a whole by combining colors emitted from the three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to a structure in the case of a single structure. In the device having a tandem structure, it is suitable that a charge-generation layer is provided between a plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

In the display apparatus of this embodiment, the distance between the light-emitting devices can be narrowed. Specifically, the distance between the light-emitting devices, the distance between the EL layers, or the distance between pixel electrodes can be less than 10 μm, less than or equal to 5 μm, less than or equal to 3 μm, less than or equal to 2 μm, less than or equal to 1 μm, less than or equal to 500 nm, less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the display apparatus includes a region where the distance between a side surface of the first layer 113*a* and a side surface of the second layer 113*b* or the distance between a side surface of the second layer 113*b* and a side surface of the third layer 113*c* is less than or equal to 1 μm, preferably less than or equal to 0.5 μm (500 nm), further preferably less than or equal to 100 nm.

A light-blocking layer may be provided on the surface of the substrate 120 on the resin layer 122 side. A variety of optical members can be arranged on the outer surface of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be arranged on the outer surface of the substrate 120.

For the substrate 120, glass, quartz, ceramics, sapphire, a resin, a metal, an alloy, a semiconductor, or the like can be used. The substrate on the side from which light from the light-emitting device is extracted is formed using a material that transmits the light. When the substrate 120 is formed using a flexible material, the flexibility of the display apparatus can be increased and a flexible display can be achieved. Furthermore, a polarizing plate may be used as the substrate 120.

For the substrate 120, any of the following can be used: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the resin layer 122, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As materials for a gate, a source, and a drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

Figure 2A:
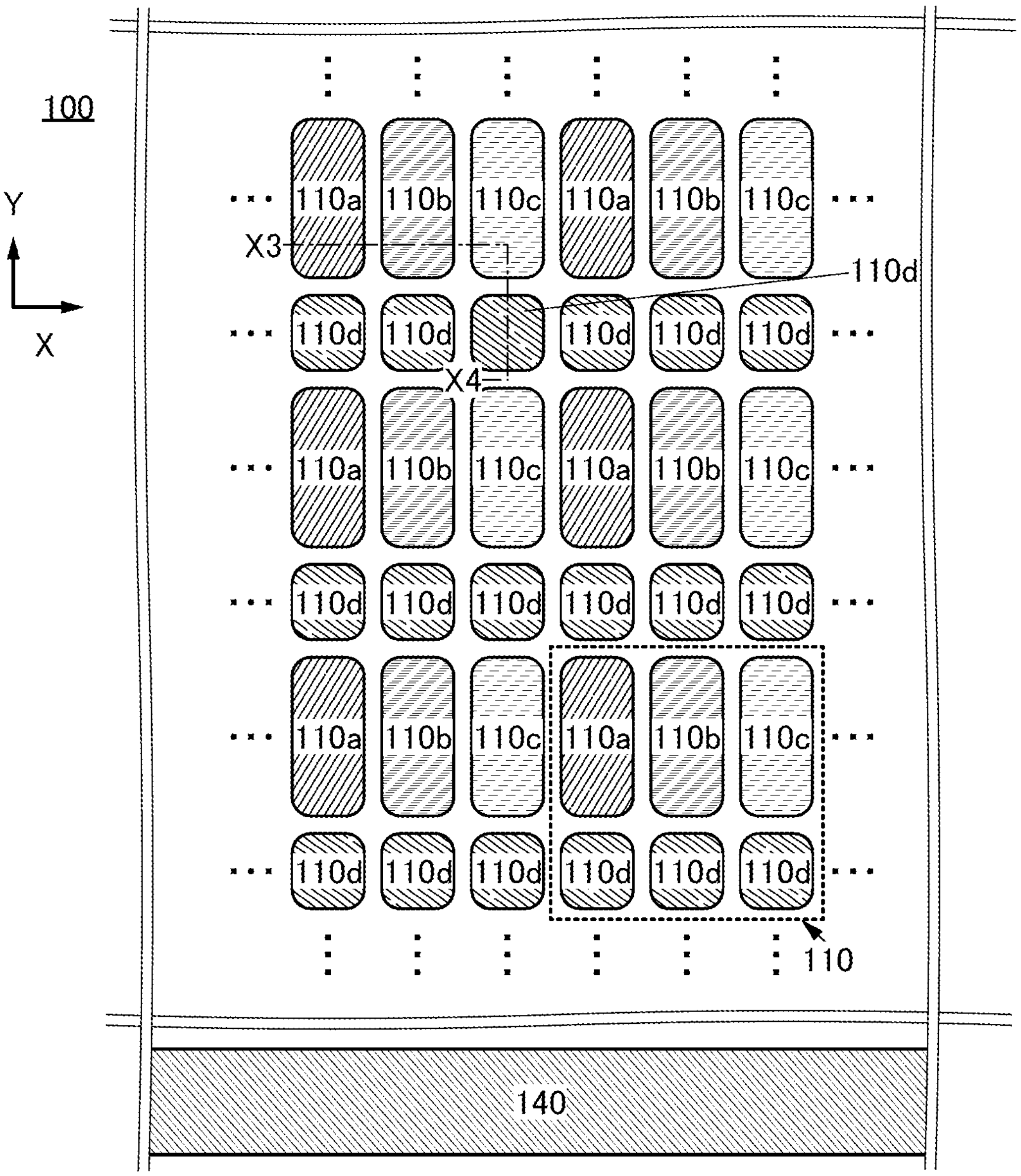
FIG. 2A is atop view illustrating an example of a display apparatus.

As illustrated in FIG. 2A, the pixel can include four types of subpixels.

FIG. 2A illustrates the top view of the display apparatus 100. The display apparatus 100 includes a display portion in which a plurality of pixels 110 are arranged in a matrix, and a connection portion 140 outside the display portion.

The pixel 110 illustrated in FIG. 2A consists of four subpixels 110*a*, 110*b*, 110*c*, and 110*d*. The subpixels 110*a*, 110*b*, 110*c*, and 110*d* include light-emitting devices that emit light of different colors. The subpixels 110*a*, 110*b*, 110*c*, and 110*d* can be of four colors of R, G, B, and white (W), of four colors of R, G, B, and Y, or the like.

FIG. 2A illustrates an example in which one pixel 110 consists of two rows and three columns. The pixel 110 includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and another subpixel 110*d* in the center column (second column), and the subpixel 110*c* and another subpixel 110*d* in the right column (third column). Matching the positions of the subpixels in the upper row and the lower row as illustrated in FIG. 2A enables dust and the like that would be produced in the manufacturing process to be removed efficiently. Thus, a display apparatus having high display quality can be provided.

Figure 2B:
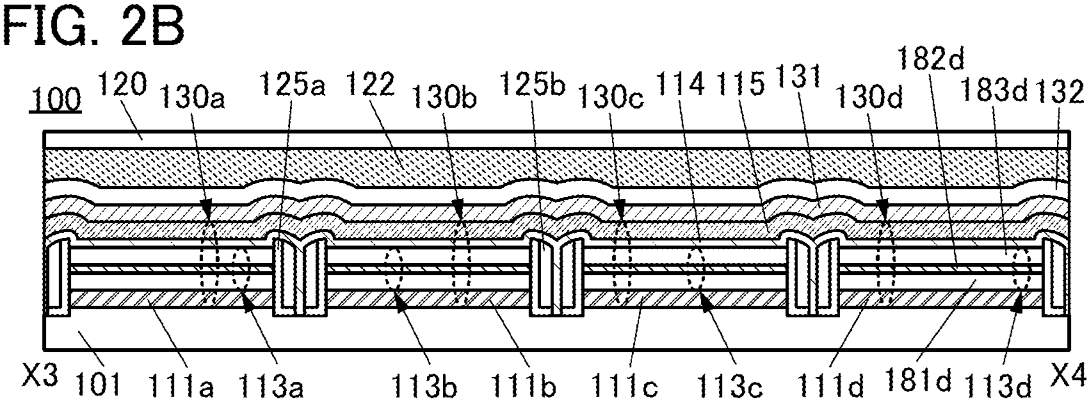
FIG. 2B is a cross-sectional view illustrating an example of the display apparatus.

FIG. 2B is a cross-sectional view along the dashed-dotted line X3-X4 in FIG. 2A. The structure illustrated in FIG. 2B is the same as that in FIG. 1B except that the light-emitting device 130*d* is provided. Therefore, the description of portions similar to those in FIG. 1B is omitted.

As illustrated in FIG. 2B, in the display apparatus 100, light-emitting devices 130*a*, 130*b*, 130*c*, and 130*d* are provided over a layer 101 including transistors and protective layers 131 and 132 are provided to cover these light-emitting devices. A substrate 120 is bonded to the protective layer 132 with a resin layer 122. In a region between adjacent light-emitting devices, the sidewall 125*a* and the sidewall 125*b* over the sidewall 125*a* are provided.

The light-emitting devices 130*a*, 130*b*, 130*c*, and 130*d* emit light of different colors from each other. Preferably, the light-emitting devices 130*a*, 130*b*, 130*c*, and 130*d* emit light of four colors, red (R), green (G), blue (B), and white (W), for example.

The light-emitting device 130*d* includes a pixel electrode 111*d* over the layer 101 including transistors, an island-shaped fourth layer 113*d* over the pixel electrode 111*d*, the fifth layer 114 over the island-shaped fourth layer 113*d*, and the common electrode 115 over the fifth layer 114.

The fourth layer 113*d* includes a first light-emitting unit 181*d* over the pixel electrode 111*d*, a charge-generation layer 182*d* over the first light-emitting unit 181*d*, and a second light-emitting unit 183*d* over the charge-generation layer 182*d*. In the light-emitting device 130*d*, the fourth layer 113*d* and the fifth layer 114 can be collectively referred to as an EL layer.

The three subpixels 110*d* may each independently include the light-emitting device 130*d* or may share one light-emitting device 130*d*. That is, the pixel 110 may include one light-emitting device 130*d* or three light-emitting devices 130*d*.

[Pixel Layout]

Next, pixel layouts different from those in FIG. 1A and FIG. 2A will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, atop surface shape of the subpixel corresponds to atop surface shape of a light-emitting region of the light-emitting device.

Figure 3A:
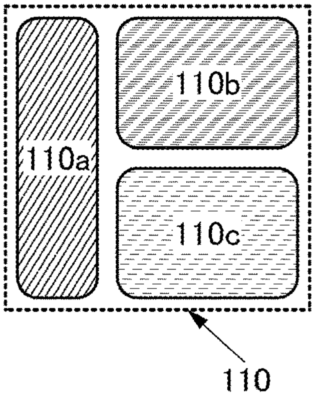
FIG. 3A to FIG. 3F are top views illustrating examples of a pixel.
Figure 4A:
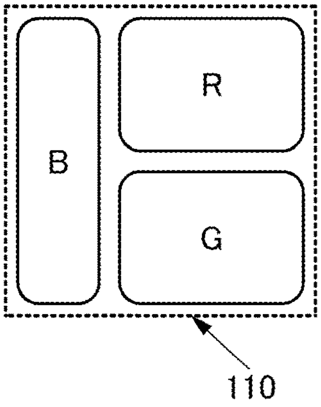
FIG. 4A to FIG. 4F are top views illustrating examples of a pixel.

The pixel 110 illustrated in FIG. 3A employs S-stripe arrangement. The pixel 110 in FIG. 3A consists of three subpixels 110*a*, 110*b*, and 110*c*. For example, as illustrated in FIG. 4A, the subpixel 110*a* may be a blue subpixel B, the subpixel 110*b* may be a red subpixel R, and the subpixel 110*c* may be a green subpixel G.

Figure 3B:
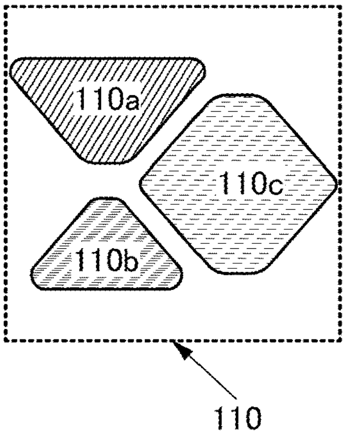
Figure 4B:
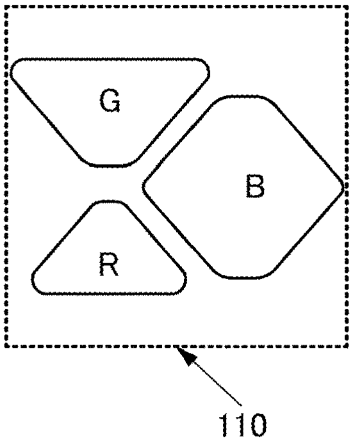

The pixel 110 illustrated in FIG. 3B includes the subpixel 110*a* whose top surface has a rough trapezoidal shape with rounded corners, the subpixel 110*b* whose top surface has a rough triangle shape with rounded corners, and the subpixel 110*c* whose top surface has a rough tetragonal or rough hexagonal shape with rounded corners. The subpixel 110*a* has a larger light-emitting area than the subpixel 110*b*. In this manner, the shapes and sizes of the subpixels can be determined independently. For example, the size of a subpixel including a light-emitting device with higher reliability can be smaller. For example, as illustrated in FIG. 4B, the subpixel 110*a* may be a green subpixel G, the subpixel 110*b* may be a red subpixel R, and the subpixel 110*c* may be a blue subpixel B.

Figure 3C:
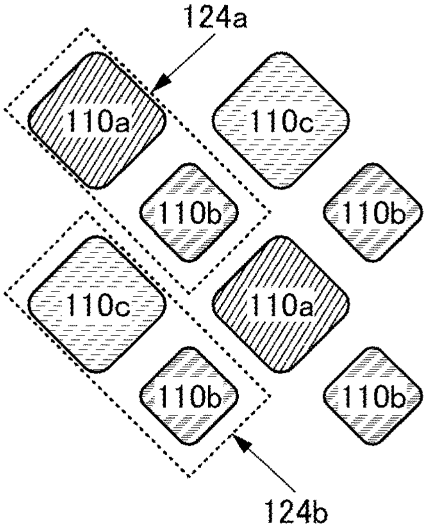
Figure 4C:
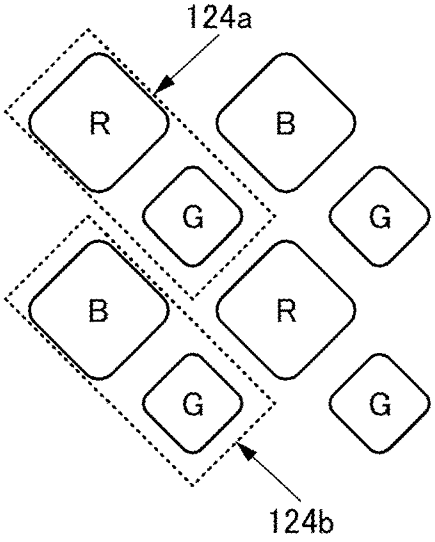

Pixels 124*a* and 124*b* illustrated in FIG. 3C employ pentile arrangement. FIG. 3C illustrates an example in which the pixels 124*a* each including the subpixels 110*a* and 110*b* and the pixels 124*b* each including the subpixels 110*b* and 110*c* are alternately arranged. For example, as illustrated in FIG. 4C, the subpixel 110*a* may be a red subpixel R, the subpixel 110*b* may be a green subpixel G, and the subpixel 110*c* may be a blue subpixel B.

Figure 3D:
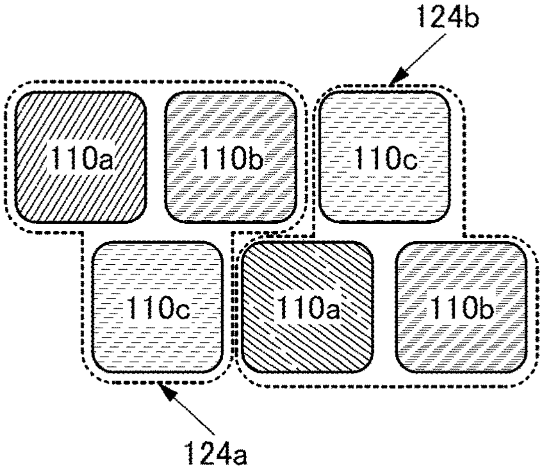
Figure 3E:
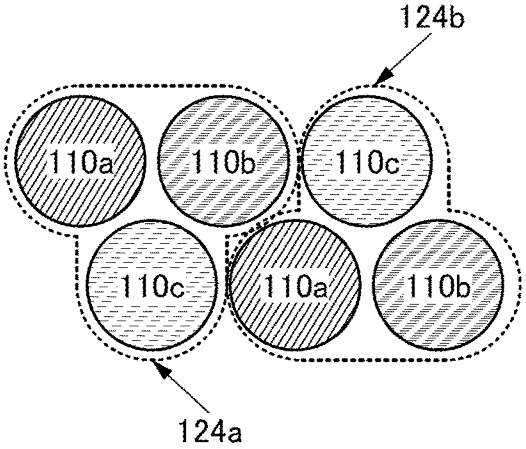
Figure 4D:
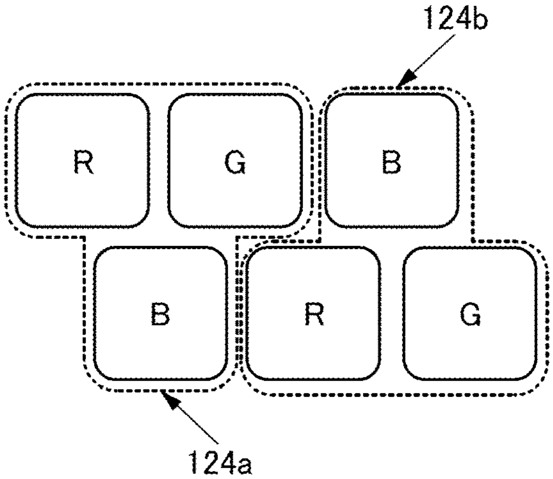

The pixels 124*a* and 124*b* illustrated in FIGS. 3D and 3E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row). For example, as illustrated in FIG. 4D, the subpixel 110*a* may be a red subpixel R, the subpixel 110*b* may be a green subpixel G, and the subpixel 110*c* may be a blue subpixel B.

FIG. 3D shows an example where the top surface of each subpixel has a rough tetragonal shape with rounded corners, and FIG. 3E shows an example where the top surface of each subpixel is circular.

Figure 3F:
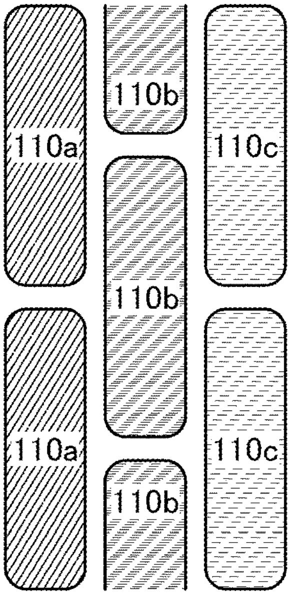
Figure 4E:
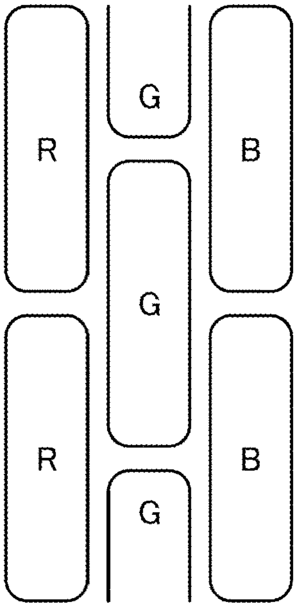

FIG. 3F illustrates an example where subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in the top view. For example, as illustrated in FIG. 4E, the subpixel 110*a* may be a red subpixel R, the subpixel 110*b* may be a green subpixel G, and the subpixel 110*c* may be a blue subpixel B.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, a circular shape, or the like.

Furthermore, in the method of manufacturing the display apparatus of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

Figure 4F:
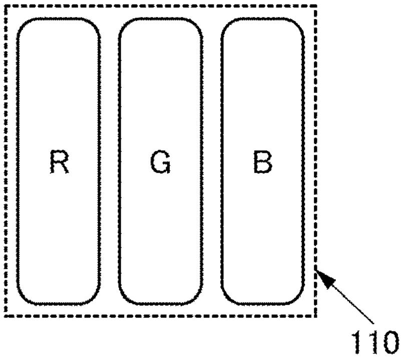

Also in the pixel 110 illustrated in FIG. 1A, which employs stripe arrangement, the subpixel 110*a* may be a red subpixel R, the subpixel 110*b* may be a green subpixel G, and the subpixel 110*c* may be a blue subpixel B as illustrated in FIG. 4F, for example.

Figure 5A:
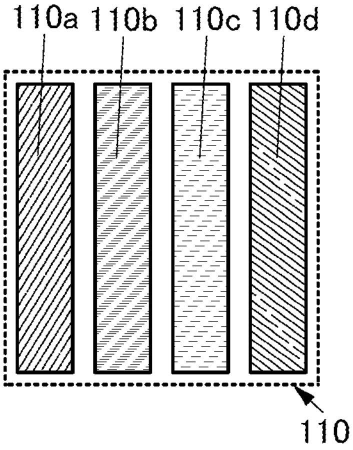
FIG. 5A to FIG. 5G are top views illustrating examples of a pixel.
Figure 5B:
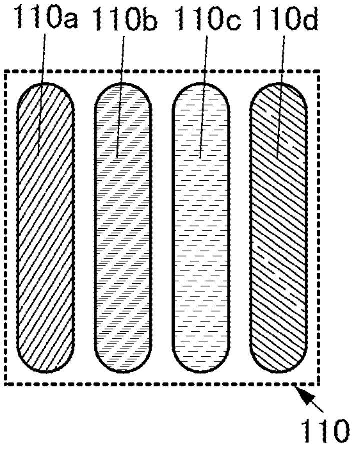
Figure 5C:
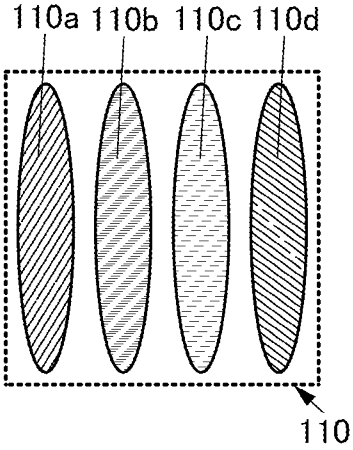

The pixels 110 illustrated in FIG. 5A to 5C each employ stripe arrangement.

FIG. 5A illustrates an example where each subpixel has a rectangular top surface. FIG. 5B illustrates an example where each subpixel has a top surface shape formed by combining two half circles and a rectangle. FIG. 5C illustrates an example where each subpixel has an elliptical top surface.

Figure 5D:
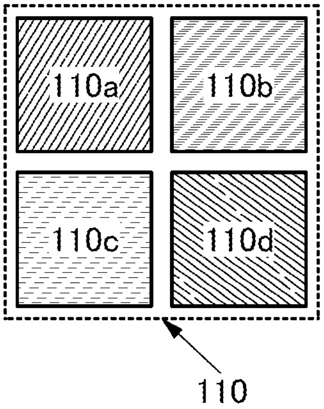
Figure 5E:
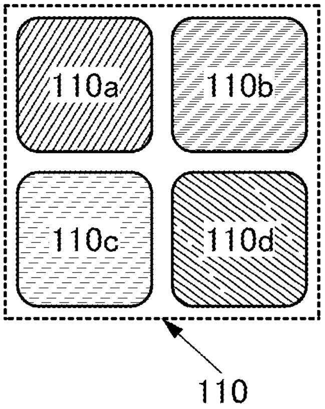
Figure 5F:
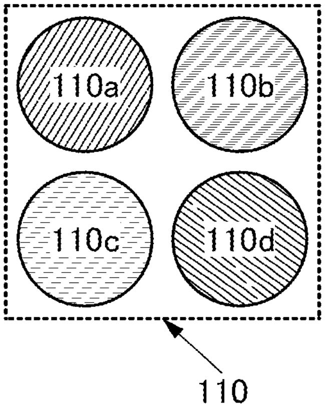

The pixels 110 illustrated in FIG. 5D to FIG. 5F each employ matrix arrangement.

FIG. 5D illustrates an example where each subpixel has a square top surface. FIG. 5E illustrates an example where each subpixel has a substantially square top surface with rounded corners. FIG. 5F illustrates an example where each subpixel has a circular top surface.

Figure 6A:
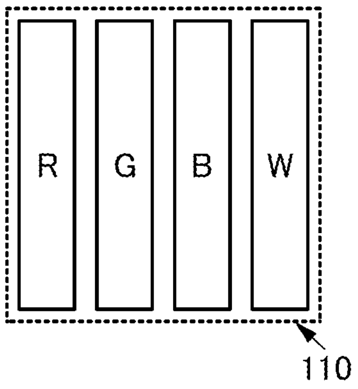
FIG. 6A to FIG. 6D are top views illustrating examples of a pixel.
Figure 6B:
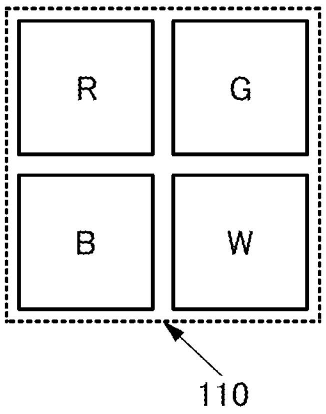

The pixel 110 illustrated in FIG. 5A to FIG. 5F consists of four subpixels 110*a*, 110*b*, 110*c*, and 110*d*. The subpixels 110*a*, 110*b*, 110*c*, and 110*d* include light-emitting devices that emit light of different colors from one another. For example, the subpixels 110*a*, 110*b*, 110*c*, and 110*d* can be red, green, blue, and white subpixels, respectively. For example, the subpixels 110*a*, 110*b*, 110*c*, and 110*d* can be red, green, blue, and white subpixels, respectively, as illustrated in FIG. 6A and FIG. 6B. Alternatively, the subpixels 110*a*, 110*b*, 110*c*, and 110*d* can be red, green, blue, and infrared-light subpixels, respectively.

Figure 5G:
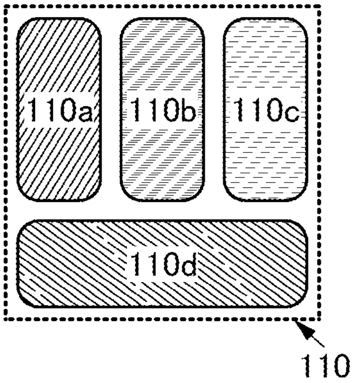

FIG. 5G illustrates an example where one pixel 110 is composed of two rows and three columns. The pixel 110 includes three subpixels (the subpixels 110*a*, 110*b*, and 110*c*) in the upper row (first row) and one subpixel (the subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

Figure 6C:
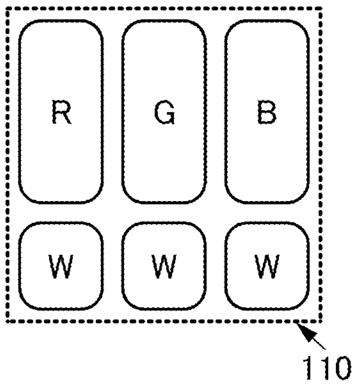
Figure 6D:
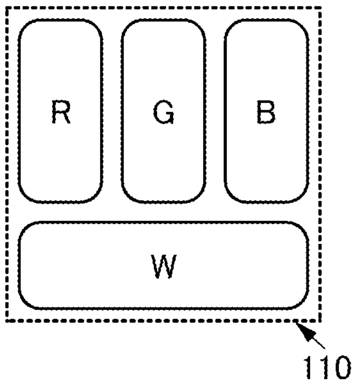

In the pixel 110 in each of FIG. 2A and FIG. 5G, for example, the subpixel 110*a* can be the red subpixel R, the subpixel 110*b* can be the green subpixel G, the subpixel 110*c* can be the blue subpixel B, and the subpixel 110*d* can be a white subpixel W, as illustrated in FIG. 6C and FIG. 6D.

The display apparatus of one embodiment of the present invention may include a light-receiving device in the pixel.

Three of the four subpixels included in the pixel 110 in FIG. 2A may include a light-emitting device and the other one may include a light-receiving device.

For example, a pn or pin photodiode can be used as the light-receiving device. The light-receiving devices function as photoelectric conversion devices (also referred to as photoelectric conversion elements) that sense light entering the light-receiving devices and generate electric charge. The amount of electric charge generated from the light-receiving devices depends on the amount of light entering the light-receiving devices.

It is particularly preferable to use an organic photodiode including a layer containing an organic compound, as the light-receiving device. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL device and the organic photodiode can be formed over the same substrate. Thus, the organic photodiode can be incorporated in the display apparatus including the organic EL device.

The light-receiving device includes at least an active layer that functions as a photoelectric conversion layer between a pair of electrodes. In this specification and the like, one of the pair of electrodes may be referred to as a pixel electrode and the other may be referred to as a common electrode.

For example, the subpixels 110*a*, 110*b*, and 110*c* may be subpixels for three colors of R, G, and B, and the subpixel 110*d* may be a subpixel including the light-receiving device. In that case, the fourth layer 113*d* includes at least an active layer.

One of the pair of electrodes of the light-receiving device functions as an anode, and the other electrode functions as a cathode. The case where the pixel electrode functions as an anode and the common electrode functions as a cathode is described below as an example. When the light-receiving device is driven by application of reverse bias between the pixel electrode and the common electrode, light entering the light-receiving device can be sensed and charge can be generated and extracted as current. Alternatively, the pixel electrode may function as a cathode and the common electrode may function as an anode.

A manufacturing method similar to that of the light-emitting device can be employed for the light-receiving device. An island-shaped active layer (also referred to as a photoelectric conversion layer) included in the light-receiving device is formed by processing a film that is to be the active layer and formed on the entire surface, not by using a fine metal mask; thus, the island-shaped active layer can have a uniform thickness. In addition, a sacrifice layer provided over the active layer can reduce damage to the active layer in the manufacturing process of the display apparatus, increasing the reliability of the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. The hole-transport layer functions as a hole-transport layer in both the light-emitting device and the light-receiving device, and the electron-transport layer functions as an electron-transport layer in both the light-emitting device and the light-receiving device.

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ fullerene and $C_{70}$ fullerene) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for the light-receiving device. Both $C_{60}$ fullerene and $C_{70}$ fullerene have a wide absorption band in the visible light region, and $C_{70}$ fullerene is especially preferable because of having a larger π-electron conjugation system and a wider absorption band in the long wavelength region than $C_{60}$ fullerene. Other examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1",4',4"-tetrahydro-di[1,4]methanonaphthaleno[1,2:2',3',56,60:2",3"][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin(II) phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron-transport property and a high hole-transport property), and the like. Without limitation to the above, the light-receiving device may further include a layer containing any of a substance having a high hole-injection property, a hole-blocking material, a substance having a high electron-injection property, an electron-blocking material, and the like.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the absorption wavelength range. The third material may be a low molecular compound or a high molecular compound.

The display apparatus can sense the touch or approach of an object while displaying an image because the pixel included in the display apparatus includes the light-emitting device and the light-receiving device and thus has a light-receiving function. For example, all the subpixels included in the display apparatus can display an image; alternatively, some of the subpixels can emit light as a light source, some of the rest of the subpixels can sense light, and the other subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by sensing light with the display portion, an image can be captured or an approach or touch of an object (e.g., a finger, a hand, or a pen) can be sensed.

Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can sense reflected light (or scattered light); thus, image capturing or touch sensing is possible even in a dark place.

In the case where the light-receiving devices are used as the image sensor, the display apparatus can capture an image with the use of the light-receiving devices. For example, the display apparatus of this embodiment can be used as a scanner.

For example, data on biological information such as a fingerprint or a palm print can be obtained with the use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can sense an approach or touch of an object with the use of the light-receiving devices.

Figure 7A:
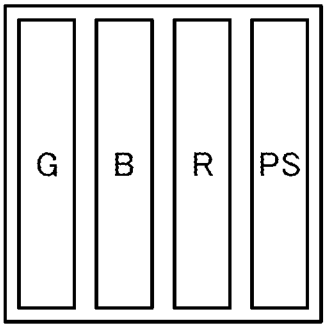
FIG. 7A to FIG. 7D are top views illustrating examples of a pixel.
Figure 7B:
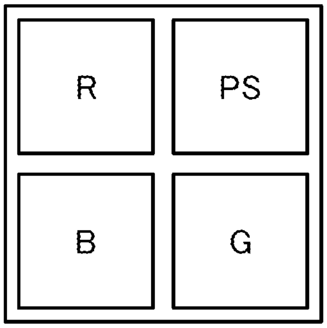

Pixels illustrated in FIG. 7A and FIG. 7B each include the subpixel G, the subpixel B, the subpixel R, and a subpixel PS.

The pixel illustrated in FIG. 7A employs stripe arrangement. The pixel illustrated in FIG. 7B employs matrix arrangement.

Figure 7C:
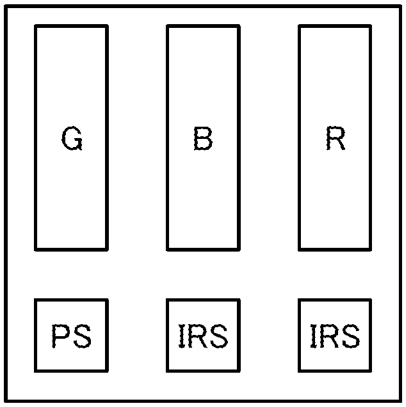
Figure 7D:
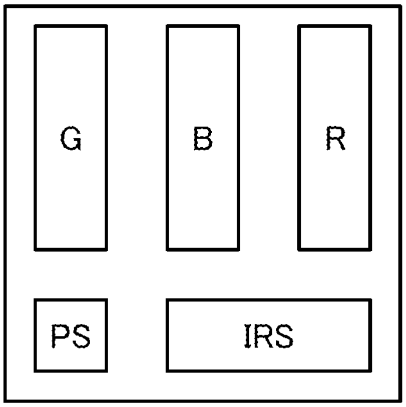

Pixels illustrated in FIG. 7C and FIG. 7D each include the subpixel G, the subpixel B, the subpixel R, the subpixel PS, and a subpixel IRS.

FIG. 7C and FIG. 7D illustrate an example in which one pixel is provided in two rows and three columns. Three subpixels (the subpixel G, the subpixel B, and the subpixel R) are provided in the upper row (first row). In FIG. 7C, three subpixels (one subpixel PS and two subpixels IRS) are provided in the lower row (second row). In FIG. 7D, two subpixels (one subpixel PS and one subpixel IRS) are provided in the lower row (second row). Aligning the positions of the subpixels in the upper row and the lower row as illustrated in FIG. 7C enables dust and the like that would be produced in the manufacturing process to be removed efficiently. Thus, a display apparatus having high display quality can be provided. Note that the layout of the subpixels is not limited to the structures illustrated in FIG. 7A to FIG. 7D.

The subpixel R includes a light-emitting device that emits red light. The subpixel G includes a light-emitting device that emits green light. The subpixel B includes a light-emitting device that emits blue light.

Each of the subpixel PS and the subpixel IRS includes a light-receiving device. The wavelength of light sensed by the subpixel PS and the subpixel IRS is not particularly limited.

In FIG. 7C, the two subpixels IRS can each independently include a light-receiving device or can include one light-receiving device in common. That is, the pixel 110 illustrated in FIG. 7C can include one light-receiving device for the subpixel PS and one or two light-receiving devices for the subpixels IRS.

The light-receiving area of the subpixel PS is smaller than the light-receiving area of the subpixel IRS. A smaller light-receiving area leads to a narrower image-capturing range, inhibits a blur in a captured image, and improves the resolution. Thus, the use of the subpixel PS enables higher-definition or higher-resolution image capturing than the use of the subpixel IRS. For example, image capturing for personal authentication with the use of a fingerprint, a palm print, the iris, the shape of a blood vessel (including the shape of a vein and the shape of an artery), a face, or the like is possible by using the subpixel PS.

The light-receiving device included in the subpixel PS preferably senses visible light, and preferably senses one or more of blue light, violet light, bluish violet light, green light, yellowish green light, yellow light, orange light, red light, and the like. The light-receiving device included in the subpixel PS may sense infrared light.

The subpixel IRS can be used in a touch sensor (also referred to as a direct touch sensor), a near touch sensor (also referred to as a hover sensor, a hover touch sensor, a contactless sensor, or a touchless sensor), or the like. The wavelength of light sensed by the subpixel IRS can be determined depending on the application purpose. For example, the subpixel IRS preferably senses infrared light. Thus, a touch can be sensed even in a dark place.

Here, the touch sensor or the near touch sensor can sense an approach or contact of an object (e.g., a finger, a hand, or a pen).

The touch sensor can sense the object when the display apparatus and the object come in direct contact with each other. Furthermore, even when an object is not in contact with the display apparatus, the near touch sensor can sense the object. For example, the display apparatus is preferably capable of sensing an object positioned in the range of 0.1 mm to 300 mm inclusive, further preferably 3 mm to 50 mm inclusive from the display apparatus. This structure enables the display apparatus to be operated without direct contact of an object, that is, enables the display apparatus to be operated in a contactless (touchless) manner. With the above-described structure, the display apparatus can have a reduced risk of being dirty or damaged, or can be operated without the object directly touching a dirt (e.g., dust or a virus) attached to the display apparatus.

The refresh rate of the display apparatus of one embodiment of the present invention can be variable. For example, the refresh rate is adjusted (adjusted in the range from 1 Hz to 240 Hz, for example) in accordance with contents displayed on the display apparatus, whereby power consumption can be reduced. The driving frequency of a touch sensor or a near touch sensor may be changed in accordance with the refresh rate. In the case where the refresh rate of the display apparatus is 120 Hz, for example, the driving frequency of a touch sensor or a near touch sensor can be higher than 120 Hz (typically, 240 Hz). This structure can achieve low power consumption and can increase the response speed of a touch sensor or a near touch sensor.

Figure 7E:
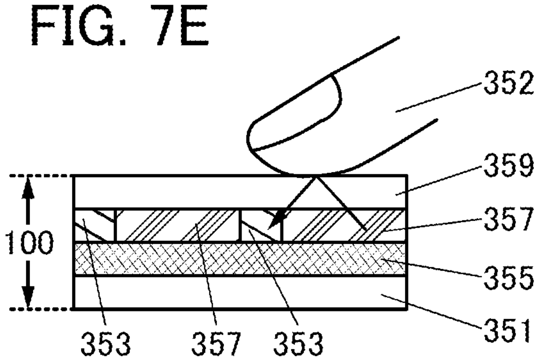
FIG. 7E to FIG. 7G are cross-sectional views illustrating examples of a display apparatus.
Figure 7F:
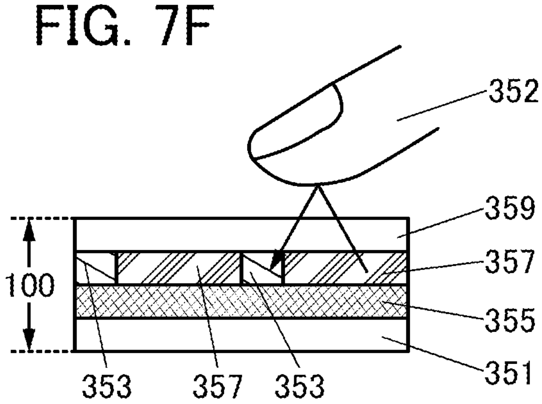
Figure 7G:
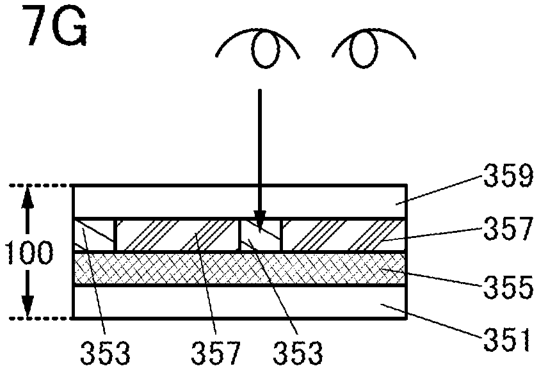

The display apparatus 100 illustrated in FIG. 7E to 7G includes a layer 353 including a light-receiving device, a functional layer 355, and a layer 357 including a light-emitting device, between a substrate 351 and a substrate 359.

The functional layer 355 includes a circuit for driving a light-receiving device and a circuit for driving a light-emitting device. A switch, a transistor, a capacitor, a resistor, a wiring, a terminal, and the like can be provided in the functional layer 355. Note that in the case where the light-emitting device and the light-receiving device are driven by a passive-matrix method, a structure not provided with a switch and a transistor may be employed.

For example, after light emitted from the light-emitting device in the layer 357 including light-emitting devices is reflected by a finger 352 that touches the display apparatus 100 as illustrated in FIG. 7E, the light-receiving device in the layer 353 including light-receiving devices senses the reflected light. Thus, the touch of the finger 352 on the display apparatus 100 can be sensed. The display apparatus may have a function of sensing an object that is close to (but is not touching) the display apparatus as illustrated in FIG. 7F and FIG. 7G or capturing an image of such an object. FIG. 7F illustrates an example in which a human finger is sensed, and FIG. 7G illustrates an example in which information on the surroundings, surface, or inside of the human eye (e.g., the number of blinks, the movement of an eyeball, and the movement of an eyelid) is sensed.

When one pixel includes two kinds of light-receiving devices, the display apparatus can have two additional functions as well as a display function, enabling a multifunctional display apparatus.

For high-definition image capturing, the subpixel PS is preferably provided in all pixels included in the display apparatus. In contrast, the subpixel IRS used for a touch sensor, a near touch sensor, or the like only needs to be provided in some pixels included in the display apparatus because sensing with the subpixel IRS is not required to have high accuracy as compared to sensing with the subpixel PS. When the number of subpixels IRS included in the display apparatus is smaller than the number of subpixels PS, higher sensing speed can be achieved.

As described above, one pixel includes two kinds of light-receiving devices in the display apparatus of one embodiment of the present invention, whereby the display apparatus can have two additional functions as well as a display function, enabling a multifunctional display apparatus. For example, a high-definition image capturing function and a sensing function of a touch sensor, a near touch sensor, or the like can be achieved. Furthermore, when a pixel including two kinds of light-receiving devices and a pixel having another structure are combined, the display apparatus can have more functions. For example, a pixel including a light-emitting device that emits infrared light, any of a variety of sensor devices, or the like can be used.

[Example of Method of Manufacturing Display Apparatus]

Figure 8A:
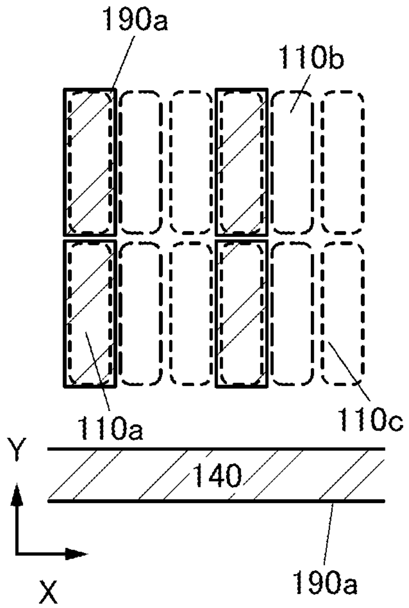
FIG. 8A to FIG. 8C are top views illustrating an example of a method of manufacturing a display apparatus.
Figure 8B:
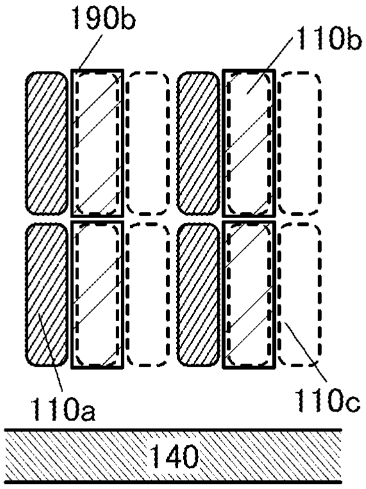
Figure 8C:
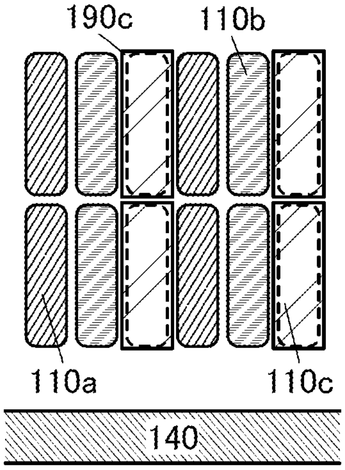
Figure 9A:
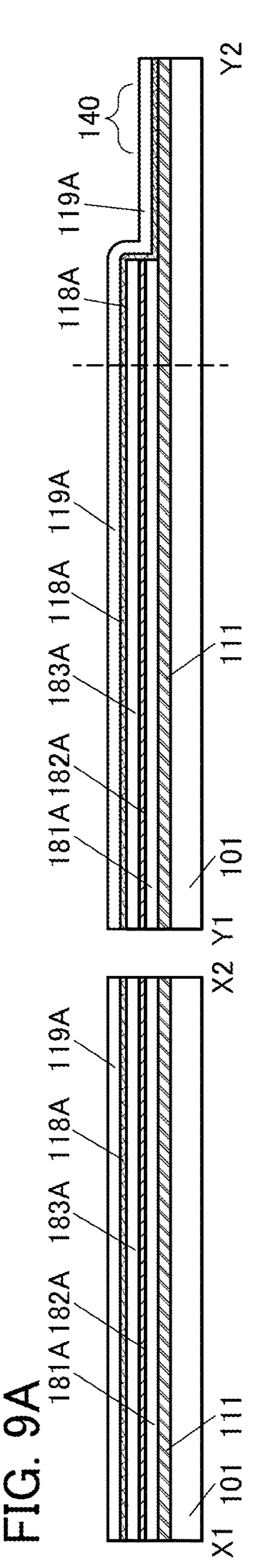
FIG. 9A to FIG. 9C are cross-sectional views illustrating an example of a method of manufacturing a display apparatus.
Figure 9B:
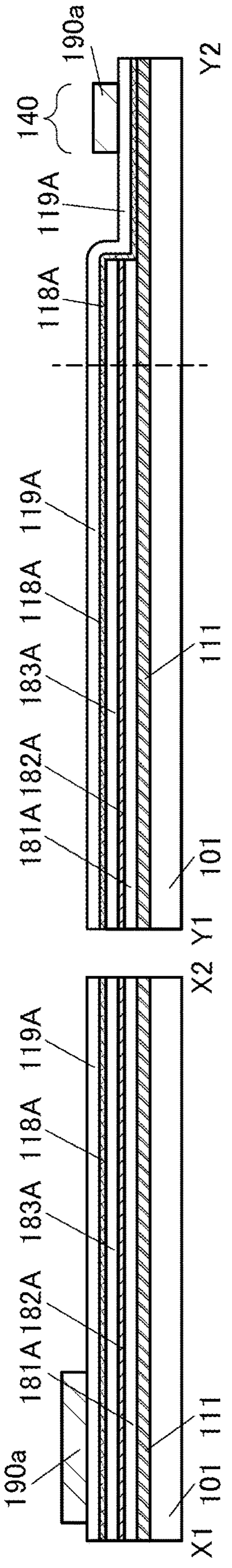
Figure 9C:
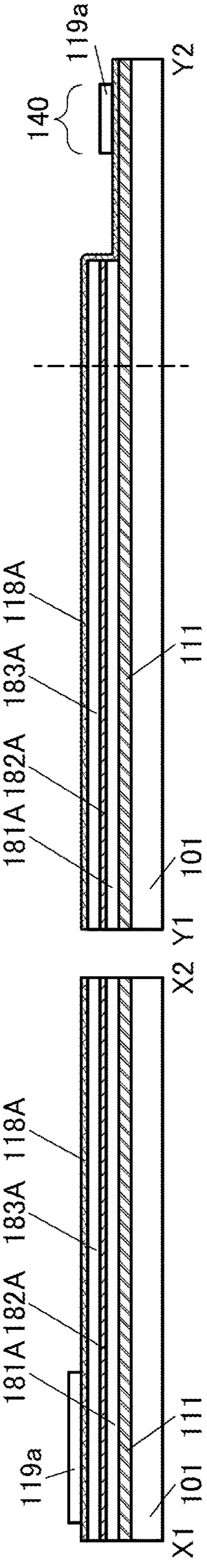

Next, an example of a method of manufacturing a display apparatus is described with reference to FIG. 8 to FIG. 14. FIG. 8A to FIG. 8C are top views illustrating the method of manufacturing a display apparatus. FIG. 9A to FIG. 9C each illustrate a cross-sectional view along the dashed-dotted line X1-X2 and a cross-sectional view along the dashed-dotted line Y1-Y2 in FIG. 1A side by side. FIG. 10 to FIG. 13 are similar to FIG. 9. FIG. 14A to FIG. 14E are cross-sectional views taken along the dashed-dotted line X1-X2 in FIG. 1A.

Thin films that form the display apparatus (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

The thin films that form the display apparatus (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

For manufacture of the light-emitting devices, a vacuum process such as an evaporation method or a solution process such as a spin coating method or an ink-jet method can be especially used. As the evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), and the like can be given. Specifically, the functional layers (e.g., the hole-injection layer, the hole-transport layer, the light-emitting layer, the electron-transport layer, and the electron-injection layer) included in the EL layers can be formed by an evaporation method (e.g., a vacuum evaporation method), a coating method (e.g., a dip coating method, a die coating method, a bar coating method, a spin coating method, or a spray coating method), a printing method (e.g., an ink-jet method, a screen printing (stencil) method, an offset printing (planography) method, a flexography (relief printing) method, a gravure printing method, or a micro-contact printing method), or the like.

When the thin films that form the display apparatus are processed, a photolithography method or the like can be used. Alternatively, a nanoimprinting method, a sandblasting method, a lift-off method, or the like may be used for the processing of the thin films. Island-shaped thin films may be directly formed by a deposition method using a blocking mask such as a metal mask.

There are the following two typical examples of a photolithography method. In one of the methods, a resist mask is formed over a thin film that is to be processed, the thin film is processed by etching or the like, and the resist mask is removed. In the other method, after a photosensitive thin film is deposited, light exposure and development are performed, so that the thin film is processed into a desired shape.

As the light used for light exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Light exposure may be performed by liquid immersion light exposure technique. As the light used for the light exposure, extreme ultraviolet (EUV) light or X-rays may be used. Furthermore, instead of the light used for the light exposure, an electron beam can also be used. It is preferable to use extreme ultraviolet light, X-rays, or an electron beam because extremely minute processing can be performed. Note that in the case of performing light exposure by scanning of a beam such as an electron beam, a photomask is not needed.

For etching of the thin film, a dry etching method, a wet etching method, a sandblasting method, or the like can be used.

First, as illustrated in FIG. 9A, a conductive film 111 is formed over the layer 101 including transistors.

Then, a first light-emitting unit 181A, a charge-generation layer 182A, and a second light-emitting unit 183A are formed in this order over the conductive film 111, a first sacrificial layer 118A is formed over the second light-emitting unit 183A, and a second sacrificial layer 119A is formed over the first sacrificial layer 118A.

As illustrated in FIG. 9A, in the cross-sectional view along Y1-Y2, the end portions of the first light-emitting unit 181A, the charge-generation layer 182A, and the second light-emitting unit 183A on the connection portion 140 side are positioned closer to the inner side than the end portion of the first sacrificial layer 118A. For example, by using a mask for defining a film formation area (also referred to as an area mask or a rough metal mask to be distinguished from a fine metal mask), the first light-emitting unit 181A, the charge-generation layer 182A, and the second light-emitting unit 183A can be formed in a region different from a region where the first sacrificial layer 118A and the second sacrificial layer 119A are formed. In one embodiment of the present invention, the light-emitting device is formed using a resist mask; by using a combination of a resist mask and an area mask as described above, the light-emitting device can be formed in a relatively simple process.

The conductive film 111 is a layer that is processed later to be the pixel electrodes 111*a*, 111*b*, and 111*c* and a conductive layer 123. Therefore, the conductive film 111 can employ the above-described structure that can be used for the pixel electrode. For formation of the conductive film 111, a sputtering method or a vacuum evaporation method can be used, for example.

The first light-emitting unit 181A, the charge-generation layer 182A, and the second light-emitting unit 183A are layers to be the first light-emitting unit 181*a*, the charge-generation layer 182*a*, and the second light-emitting unit 183*a*, respectively, later. Therefore, the first light-emitting unit 181A, the charge-generation layer 182A, and the second light-emitting unit 183A can employ the above-described structures applicable to the first light-emitting unit 181*a*, the charge-generation layer 182*a*, and the second light-emitting unit 183*a*, respectively. Each of the first light-emitting unit 181A, the charge-generation layer 182A, and the second light-emitting unit 183A can be formed by an evaporation method (including a vacuum evaporation method), a transfer method, a printing method, an inkjet method, a coating method, or the like. Each of the layers is preferably formed by an evaporation method. A premix material may be used in the film formation by an evaporation method. Note that in this specification and the like, a premix material is a composite material in which a plurality of materials are combined or mixed in advance.

As the first sacrificial layer 118A and the second sacrificial layer 119A, a film that is highly resistant to the process conditions for the first light-emitting unit 181A, the charge-generation layer 182A, the second light-emitting unit 183A, and the layers to be formed later, such as the first light-emitting unit 181B, the charge-generation layer 182B, the second light-emitting unit 183B, the first light-emitting unit 181C, the charge-generation layer 182C, and the second light-emitting unit 183C, specifically, a film having high etching selectivity with EL layers is used.

The first sacrificial layer 118A and the second sacrificial layer 119A can be formed by a sputtering method, an ALD method (including a thermal ALD method and a PEALD method), a CVD method, or a vacuum evaporation method, for example. The first sacrificial layer 118A, which is formed on and in contact with the EL layer, is preferably formed by a formation method that causes less damage to the EL layer than a formation method for the second sacrificial layer 119A. For example, the first sacrificial layer 118A is preferably formed by an ALD method or a vacuum evaporation method rather than a sputtering method. The first sacrificial layer 118A and the second sacrificial layer 119A are formed at a temperature lower than the upper temperature limit of the EL layer (typically at 200° C. or lower, preferably 100° C. or lower, further preferably 80° C. or lower).

The first sacrificial layer 118A and the second sacrificial layer 119A are preferably films that can be removed by a wet etching method. The use of a wet etching method can reduce damage to the first light-emitting unit 181A, the charge-generation layer 182A, and the second light-emitting unit 183A at the time of processing the first sacrificial layer 118A and the second sacrificial layer 119A, compared to the case of using a dry etching method.

The first sacrificial layer 118A is preferably a film having high etching selectivity with the second sacrificial layer 119A.

In the method of manufacturing a display apparatus of this embodiment, it is desirable that the layers (e.g., the hole-injection layer, the hole-transport layer, the light-emitting layer, and the electron-transport layer) included in the EL layer not be easily processed in the step of processing the sacrificial layers, and that the sacrificial layers not be easily processed in the steps of processing the layers included in the EL layer. These are preferably taken into consideration to select the materials and a processing method for the sacrificial layers and processing methods for the EL layer.

Although this embodiment shows an example in which the sacrificial layer is formed with a two-layer structure of the first sacrificial layer and the second sacrificial layer, the sacrificial layer may have a single-layer structure or a stacked-layer structure of three or more layers.

As the first sacrificial layer 118A and the second sacrificial layer 119A, it is preferable to use an inorganic film such as a metal film, an alloy film, a metal oxide film, a semiconductor film, or an inorganic insulating film, for example.

For the first sacrificial layer 118A and the second sacrificial layer 119A, it is preferable to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the first sacrificial layer 118A and the second sacrificial layer 119A is preferable, in which case the EL layer can be prevented from being irradiated with ultraviolet light and deteriorating.

For the first sacrificial layer 118A and the second sacrificial layer 119A, a metal oxide such as In—Ga—Zn oxide can be used. As the first sacrificial layer 118A or the second sacrificial layer 119A, an In—Ga—Zn oxide film can be formed by a sputtering method, for example. It is also possible to use indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon, or the like can also be used.

Note that an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium.

As the first sacrificial layer 118A and the second sacrificial layer 119A, a variety of inorganic insulating films that can be used as the protective layers 131 and 132 can be used.

In particular, an oxide insulating film is preferable because having higher adhesion to the EL layer than a nitride insulating film. For example, an inorganic insulating material such as aluminum oxide, hafnium oxide, or silicon oxide can be used for the first sacrificial layer 118A and the second sacrificial layer 119A. As the first sacrificial layer 118A or the second sacrificial layer 119A, for example, an aluminum oxide film can be formed by an ALD method. The ALD method is preferably used because damage to a base layer (particularly the EL layer or the like) can be reduced.

For example, an inorganic insulating film (e.g., an aluminum oxide film) formed by an ALD method can be used as the first sacrificial layer 118A, and an In—Ga—Zn oxide film formed by a sputtering method can be used as the second sacrificial layer 119A. Alternatively, an inorganic insulating film (e.g., an aluminum oxide film) formed by an ALD method can be used as the first sacrificial layer 118A, and an aluminum film or a tungsten film formed by a sputtering method can be used as the second sacrificial layer 119A.

A material dissolvable in a solvent that is chemically stable with respect to at least a film on the outermost side of the second light-emitting unit 183A may be used for the first sacrificial layer 118A and the second sacrificial layer 119A. Specifically, a material that will be dissolved in water or alcohol can be suitably used for the first sacrificial layer 118A and the second sacrificial layer 119A. In forming a film of such a material, it is preferable to apply the material dissolved in a solvent such as water or alcohol by a wet process and then perform heat treatment for evaporating the solvent. At this time, the heat treatment is preferably performed in a reduced-pressure atmosphere, in which case the solvent can be removed at a low temperature in a short time and thermal damage to the EL layer can be reduced accordingly.

The first sacrificial layer 118A and the second sacrificial layer 119A may be formed by a wet process such as spin coating, dipping, spray coating, ink-jetting, dispensing, screen printing, offset printing, doctor blade coating, slit coating, roll coating, curtain coating, or knife coating.

The first sacrificial layer 118A and the second sacrificial layer 119A may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

Next, a resist mask 190*a* is formed over the second sacrificial layer 119A as illustrated in FIG. 9B. The resist mask can be formed by application of a photosensitive resin (photoresist), exposure, and development.

The resist mask may be formed using either a positive resist material or a negative resist material.

As illustrated in FIG. 8A, the resist mask 190*a* is provided at a position overlapping with a region to be the subpixel 110*a* later. One island-shaped pattern is preferably provided for one subpixel 110*a* as the resist mask 190*a*. Alternatively, one band-like pattern for a plurality of subpixels 110*a* aligned in one column (aligned in the Y direction in FIG. 8A) may be formed as the resist mask 190*a*.

Note that the resist mask 190*a* is preferably provided also at a position overlapping with a region to be the connection portion 140 later. This can inhibit a region of the conductive film 111, which is to be the conductive layer 123 later, from being damaged during the manufacturing process of the display apparatus.

Next, as illustrated in FIG. 9C, part of the second sacrificial layer 119A is removed using the resist mask 190*a*, so that the second sacrificial layer 119*a* is formed. The second sacrificial layer 119*a* remains in a region to be the subpixel 110*a* later and a region to be the connection portion 140 later.

In the etching of the second sacrificial layer 119A, an etching condition with high selectivity is preferably employed so that the first sacrificial layer 118A is not removed by the etching. Since the EL layer is not exposed in processing the second sacrificial layer 119A, the range of choices of the processing method is wider than that for processing the first sacrificial layer 118A. Specifically, deterioration of the EL layer can be further suppressed even when a gas containing oxygen is used as an etching gas for processing the second sacrificial layer 119A.

After that, the resist mask 190*a* is removed. The resist mask 190*a* can be removed by ashing using oxygen plasma, for example. Alternatively, an oxygen gas and any of $CF_4$, $C_4F_8$, $SF_6$, $CHF_3$, $Cl_2$, $H_2O$, $BCl_3$, and a noble gas (also referred to as rare gas) such as He may be used. Alternatively, the resist mask 190*a* may be removed by wet etching. At this time, the first sacrificial layer 118A is positioned on the outermost surface and the first light-emitting unit 181A, the charge-generation layer 182A, and the second light-emitting unit 183A are not exposed; accordingly, the first light-emitting unit 181A, the charge-generation layer 182A, and the second light-emitting unit 183A can be prevented from being damaged in the step of removing the resist mask 190*a*. In addition, the range of choices of the method of removing the resist mask 190*a* can be widened.

Figures 10A, 10B, 10C:
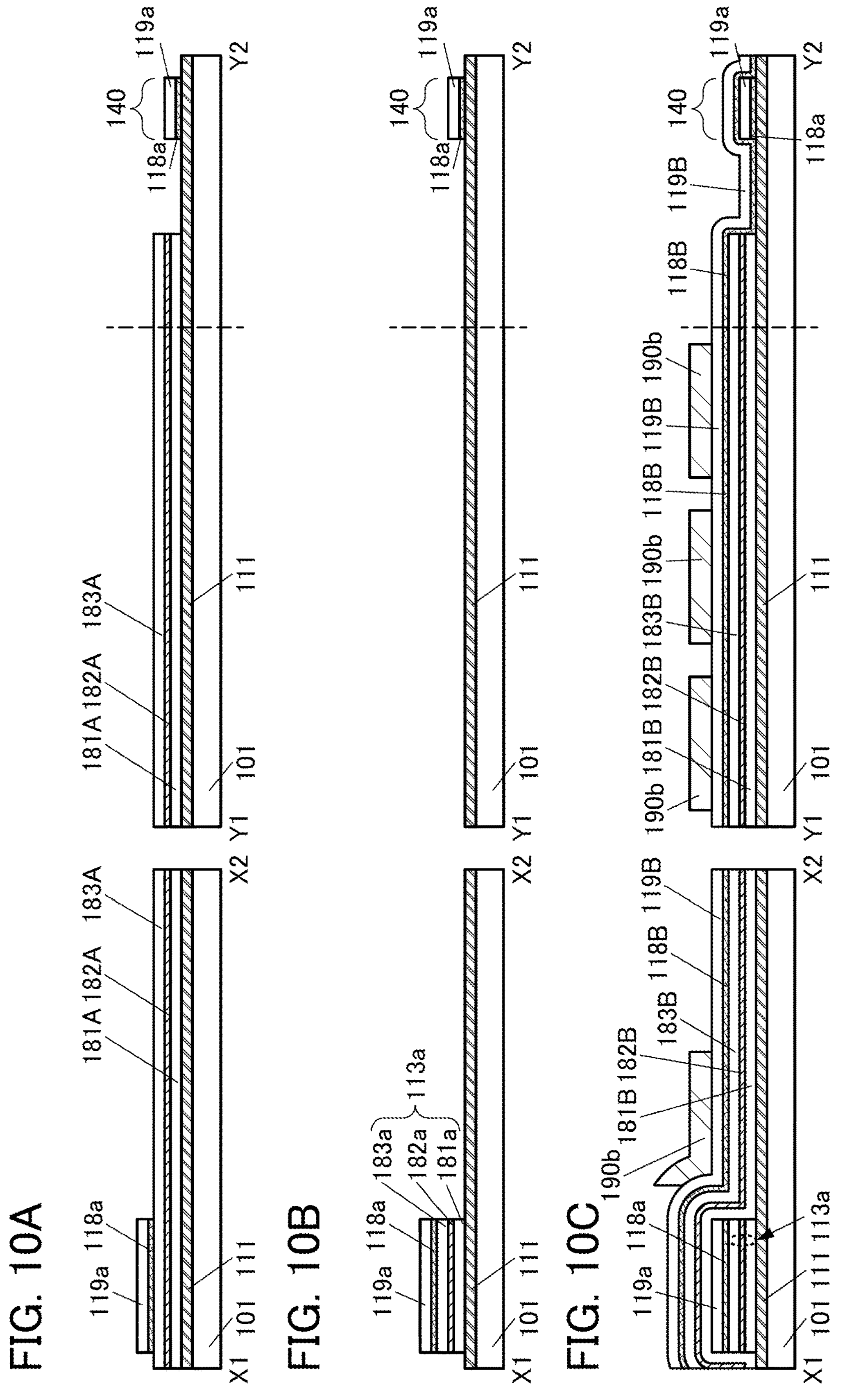
FIG. 10A to FIG. 10C are cross-sectional views illustrating an example of a method of manufacturing a display apparatus.

Next, as illustrated in FIG. 10A, part of the first sacrificial layer 118A is removed using the second sacrificial layer 119*a* as a hard mask, so that a first sacrificial layer 118*a* is formed.

The first sacrificial layer 118A and the second sacrificial layer 119A can each be processed by a wet etching method or a dry etching method. The first sacrificial layer 118A and the second sacrificial layer 119A are preferably processed by anisotropic etching.

The use of a wet etching method can reduce damage to the first light-emitting unit 181A, the charge-generation layer 182A, and the second light-emitting unit 183A in processing of the first sacrificial layer 118A and the second sacrificial layer 119A, as compared with the case of using a dry etching method. In the case of using a wet etching method, it is preferable to use a developer, an aqueous solution of tetramethylammonium hydroxide (TMAH), dilute hydrofluoric acid, oxalic acid, phosphoric acid, acetic acid, nitric acid, a chemical solution containing a mixed solution thereof, or the like, for example.

In the case of using a dry etching method, deterioration of the first light-emitting unit 181A, the charge-generation layer 182A, and the second light-emitting unit 183A can be inhibited by not using a gas containing oxygen as the etching gas. In the case of using a dry etching method, it is preferable to use a gas containing $CF_4$, $C_4F_8$, $SF_6$, $CHF_3$, $Cl_2$, $H_2O$, $BCl_3$, or a noble gas (also referred to as rare gas) such as He as the etching gas, for example.

For example, when an aluminum oxide film formed by an ALD method is used as the first sacrificial layer 118A, the first sacrificial layer 118A can be processed by a dry etching method using $CHF_3$ and He. When an In—Ga—Zn oxide film formed by a sputtering method is used as the second sacrificial layer 119A, the second sacrificial layer 119A can be processed by a wet etching method using a diluted phosphoric acid. Alternatively, the second sacrificial layer 119A may be processed by a dry etching method using $CH_4$ and Ar. Alternatively, the second sacrificial layer 119A can be processed by a wet etching method using a diluted phosphoric acid. When a tungsten film formed by a sputtering method is used as the second sacrificial layer 119A, the second sacrificial layer 119A can be processed by a dry etching method using $CF_4$ and $O_2$ or $CF_4$, $Cl_2$, and $O_2$.

Next, as illustrated in FIG. 10B, part of the first light-emitting unit 181A, part of the charge-generation layer 182A, and part of the second light-emitting unit 183A are removed with use of the second sacrificial layer 119*a* and the first sacrificial layer 118*a* as hard masks, whereby the first light-emitting unit 181*a*, the charge-generation layer 182*a*, and the second light-emitting unit 183*a* are formed.

Thus, as illustrated in FIG. 10B, in a region corresponding to the subpixel 110*a*, a stacked-layer structure of the first light-emitting unit 181*a*, the charge-generation layer 182*a*, the second light-emitting unit 183*a*, the first sacrificial layer 118*a*, and the second sacrificial layer 119*a* remains over the conductive film 111. Note that a stacked-layer structure of the first light-emitting unit 181*a*, the charge-generation layer 182*a*, and the second light-emitting unit 183*a* is also referred to as the first layer 113*a*. In a region corresponding to the connection portion 140, a stacked-layer structure of the first sacrificial layer 118*a* and the second sacrificial layer 119*a* remains over the conductive film 111.

Through the above steps, regions of the first light-emitting unit 181A, the charge-generation layer 182A, the second light-emitting unit 183A, the first sacrificial layer 118A, and the second sacrificial layer 119A which do not overlap with the resist mask 190*a* can be removed.

Note that part of the first light-emitting unit 181A, part of the charge-generation layer 182A, and part of the second light-emitting unit 183A may be removed using the resist mask 190*a*. Then, the resist mask 190*a* may be removed.

Alternatively, the next step may be performed without removing the resist mask 190*a*. In that case, when the conductive film 111 is processed in a later step, not only the sacrificial layer but also the resist mask can be used as a mask. Processing the conductive film 111 with use of the resist masks 190*a*, 190*b*, and 190*c* is easier than processing the conductive film 111 with use of only the sacrificial layer as a hard mask in some cases. For example, the selection range of conditions for processing the conductive film 111, materials for the sacrificial layer, materials for the conductive film, and the like can be broadened.

The first light-emitting unit 181A, the charge-generation layer 182A, and the second light-emitting unit 183A are preferably processed by anisotropic etching. In particular, anisotropic dry etching is preferably used. Alternatively, wet etching may be used.

In the case of using a dry etching method, deterioration of the first light-emitting unit 181A, the charge-generation layer 182A, and the second light-emitting unit 183A can be suppressed by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the first light-emitting unit 181A, the charge-generation layer 182A, and the second light-emitting unit 183A can be inhibited. Furthermore, a defect such as attachment of a reaction product generated at the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a noble gas (also referred to as a rare gas) such as He and Ar as the etching gas, for example. Alternatively, a gas containing oxygen and at least one of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas.

Next, as illustrated in FIG. 10C, the first light-emitting unit 181B, the charge-generation layer 182B, and the second light-emitting unit 183B are formed in this order over the second sacrificial layer 119*a* and the conductive film 111, a first sacrificial layer 118B is formed over the second light-emitting unit 183B, and a second sacrificial layer 119B is formed over the first sacrificial layer 118B.

As illustrated in FIG. 10C, in the cross-sectional view along Y1-Y2, the end portions of the first light-emitting unit 181B, the charge-generation layer 182B, and the second light-emitting unit 183B on the connection portion 140 side are positioned closer to the inner side than the end portion of the first sacrificial layer 118B.

The first light-emitting unit 181B, the charge-generation layer 182B, and the second light-emitting unit 183B are layers to be the first light-emitting unit 181*b*, the charge-generation layer 182*b*, and the second light-emitting unit 183*b*, respectively, later. Each of the first light-emitting unit 181*b* and the second light-emitting unit 183*b* emits light of a color different from the emission colors of the first light-emitting unit 181*a* and the second light-emitting unit 183*a*. Structures, materials, and the like which can be used for the first light-emitting unit 181*b*, the charge-generation layer 182*b*, and the second light-emitting unit 183*b* are similar to those used for the first light-emitting unit 181*a*, the charge-generation layer 182*a*, and the second light-emitting unit 183*a*, respectively. The first light-emitting unit 181B, the charge-generation layer 182B, and the second light-emitting unit 183B can be formed by methods similar to the methods for the first light-emitting unit 181A, the charge-generation layer 182A, and the second light-emitting unit 183A, respectively.

The first sacrificial layer 118B can be formed using a material that can be used for the first sacrificial layer 118A. The second sacrificial layer 119B can be formed using a material that can be used for the second sacrificial layer 119A.

Next, a resist mask 190*b* is formed over the second sacrificial layer 119B as illustrated in FIG. 10C.

As illustrated in FIG. 8B, the resist mask 190*b* is provided at a position overlapping with the region to be the subpixel 110*b* later. One island-shaped pattern is preferably provided for one subpixel 110*b* as the resist mask 190*b*. Alternatively, one band-like pattern for a plurality of subpixels 110*b* aligned in one column may be formed as the resist mask 190*b*.

The resist mask 190*b* may be provided also at a position overlapping with the region to be the connection portion 140 later.

Next, part of the second sacrificial layer 119B is removed using the resist mask 190*b*, so that a second sacrificial layer 119*b* is formed. The second sacrificial layer 119*b* remains in a region overlapping with the region to be the subpixel 110*b* later.

After that, the resist mask 190*b* is removed. Then, part of the first sacrificial layer 118B is removed with the use of the second sacrificial layer 119*b* as a hard mask, whereby a first sacrificial layer 118*b* is formed.

Figures 11A, 11B, 11C:
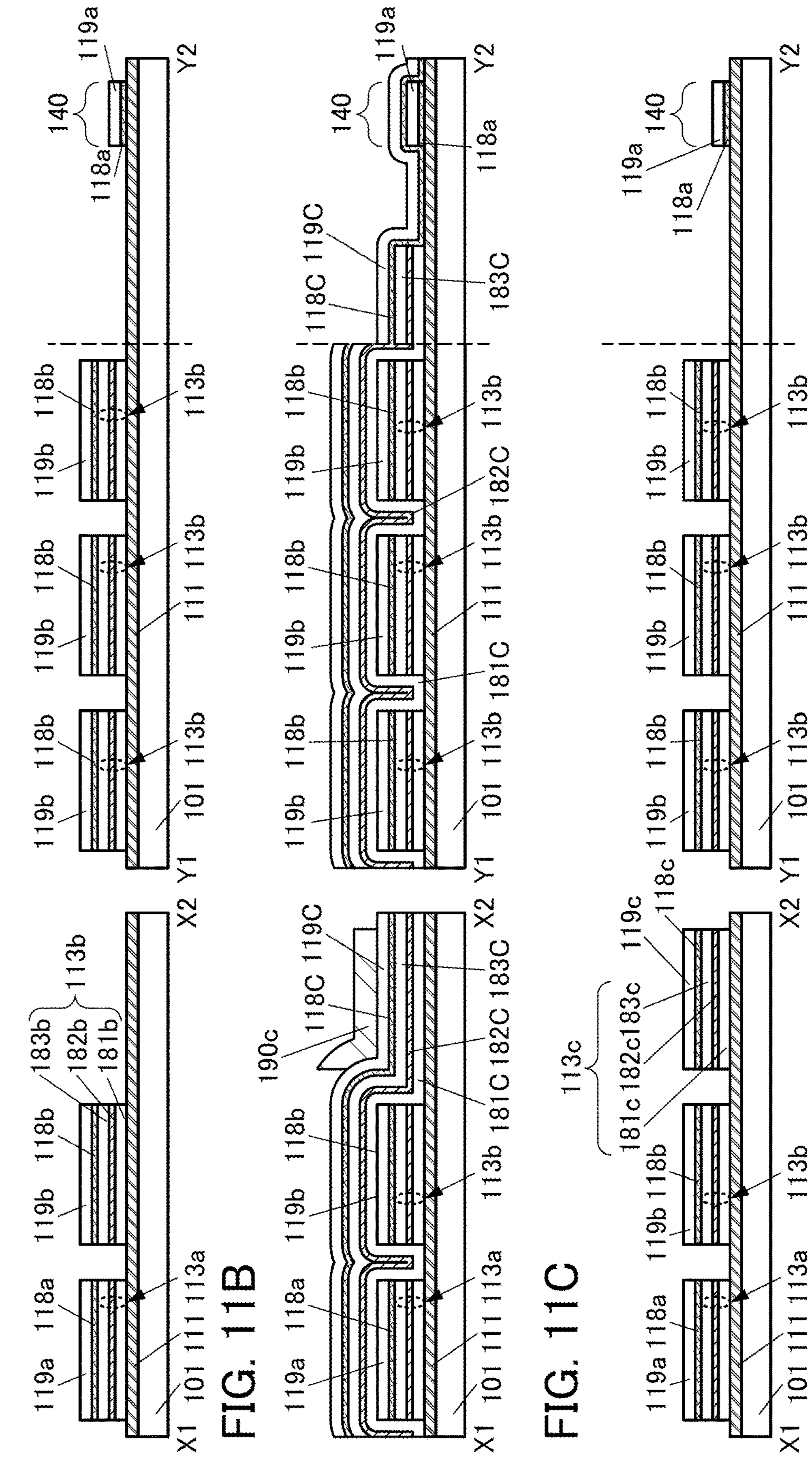
FIG. 11A to FIG. 11C are cross-sectional views illustrating an example of a method of manufacturing a display apparatus.

Then, as illustrated in FIG. 11A, part of the first light-emitting unit 181B, part of the charge-generation layer 182B, and part of the second light-emitting unit 183B are removed with use of the second sacrificial layer 119*b* and the first sacrificial layer 118*b* as hard masks, whereby the first light-emitting unit 181*b*, the charge-generation layer 182*b*, and the second light-emitting unit 183*b* are formed.

Thus, as illustrated in FIG. 11A, in a region corresponding to the subpixel 110*b*, a stacked-layer structure of the first light-emitting unit 181*b*, the charge-generation layer 182*b*, the second light-emitting unit 183*b*, the first sacrificial layer 118*b*, and the second sacrificial layer 119*b* remains over the conductive film 111. Note that a stacked-layer structure of the first light-emitting unit 181*b*, the charge-generation layer 182*b*, and the second light-emitting unit 183*b* is also referred to as the second layer 113*b*. In a region corresponding to the connection portion 140, a stacked-layer structure of the first sacrificial layer 118*a* and the second sacrificial layer 119*a* remains over the conductive film 111.

Through the above steps, regions of the first light-emitting unit 181B, the charge-generation layer 182B, the second light-emitting unit 183B, the first sacrificial layer 118B, and the second sacrificial layer 119B which do not overlap with the resist mask 190*b* can be removed. For processing of these layers, the method that can be used for processing the first light-emitting unit 181A, the charge-generation layer 182A, the second light-emitting unit 183A, the first sacrificial layer 118A, and the second sacrificial layer 119A can be used.

Next, as illustrated in FIG. 11B, the first light-emitting unit 181C, the charge-generation layer 182C, and the second light-emitting unit 183C are formed in this order over the second sacrificial layer 119*a*, the second sacrificial layer 119*b*, and the conductive film 111, a first sacrificial layer 118C is formed over the second light-emitting unit 183C, and a second sacrificial layer 119C is formed over the first sacrificial layer 118C.

As illustrated in FIG. 11B, in the cross-sectional view along YT-Y2, the end portions of the first light-emitting unit 181C, the charge-generation layer 182C, and the second light-emitting unit 183C on the connection portion 140 side are positioned closer to the inner side than the end portion of the first sacrificial layer 118C.

The first light-emitting unit 181C, the charge-generation layer 182C, and the second light-emitting unit 183C are layers to be the first light-emitting unit 181*c*, the charge-generation layer 182*c*, and the second light-emitting unit 183*c*, respectively, later. Each of the first light-emitting unit 181*c* and the second light-emitting unit 183*c* emits light of a color different from the emission colors of the first light-emitting units 181*a* and 181*b* and the second light-emitting units 183*a* and 183*b*. Structures, materials, and the like which can be used for the first light-emitting unit 181*c*, the charge-generation layer 182*c*, and the second light-emitting unit 183*c* are similar to those used for the first light-emitting unit 181*a*, the charge-generation layer 182*a*, and the second light-emitting unit 183*a*, respectively. The first light-emitting unit 181C, the charge-generation layer 182C, and the second light-emitting unit 183C can be formed by methods similar to the methods for the first light-emitting unit 181A, the charge-generation layer 182A, and the second light-emitting unit 183A, respectively.

The first sacrificial layer 118C can be formed using a material that can be used for the first sacrificial layer 118A. The second sacrificial layer 119C can be formed using a material that can be used for the second sacrificial layer 119A.

Next, a resist mask 190*c* is formed over the second sacrificial layer 119C as illustrated in FIG. 11B.

As illustrated in FIG. 8C, the resist mask 190*c* is provided at a position overlapping with a region to be the subpixel 110*c* later. One island-shaped pattern is preferably provided for one subpixel 110*c* as the resist mask 190*c*. Alternatively, one band-like pattern for a plurality of subpixels 110*c* aligned in one column may be formed as the resist mask 190*c*.

The resist mask 190*c* may be provided also at a position overlapping with a region to be the connection portion 140 later.

Next, part of the second sacrificial layer 119C is removed with use of the resist mask 190*c*, so that a second sacrificial layer 119*c* is formed. The second sacrificial layer 119*c* remains in a region to be the subpixel 110*c* later.

After that, the resist mask 190*c* is removed. Then, part of the first sacrificial layer 118C is removed with use of the second sacrificial layer 119*c* as a hard mask, whereby a first sacrificial layer 118*c* is formed.

Then, as illustrated in FIG. 11C, part of the first light-emitting unit 181C, part of the charge-generation layer 182C, and part of the second light-emitting unit 183C are removed with use of the second sacrificial layer 119*c* and the first sacrificial layer 118*c* as hard masks, whereby the first light-emitting unit 181*c*, the charge-generation layer 182*c*, and the second light-emitting unit 183*c* are formed.

Thus, as illustrated in FIG. 11C, in a region corresponding to the subpixel 110*c*, a stacked-layer structure of the first light-emitting unit 181*c*, the charge-generation layer 182*c*, the second light-emitting unit 183*c*, the first sacrificial layer 118*c*, and the second sacrificial layer 119*c* remains over the conductive film 111. Note that a stacked-layer structure of the first light-emitting unit 181*c*, the charge-generation layer 182*c*, and the second light-emitting unit 183*c* is also referred to as the third layer 113*c*. In a region corresponding to the connection portion 140, a stacked-layer structure of the first sacrificial layer 118*a* and the second sacrificial layer 119*a* remains over the conductive film 111.

Through the above process, regions of the first light-emitting unit 181C, the charge-generation layer 182C, the second light-emitting unit 183C, the first sacrificial layer 118C, and the second sacrificial layer 119C which do not overlap with the resist mask 190*c* can be removed. For processing of these layers, the method applicable to processing of the first light-emitting unit 181A, the charge-generation layer 182A, the second light-emitting unit 183A, the first sacrificial layer 118A, and the second sacrificial layer 119A can be used.

Note that the side surfaces of the charge-generation layers of the light-emitting units are preferably perpendicular to or substantially perpendicular to the formation surface. For example, the angle between the formation surface and these side surfaces is preferably greater than or equal to 600 and less than or equal to 90°.

Figures 12A, 12B, 12C:
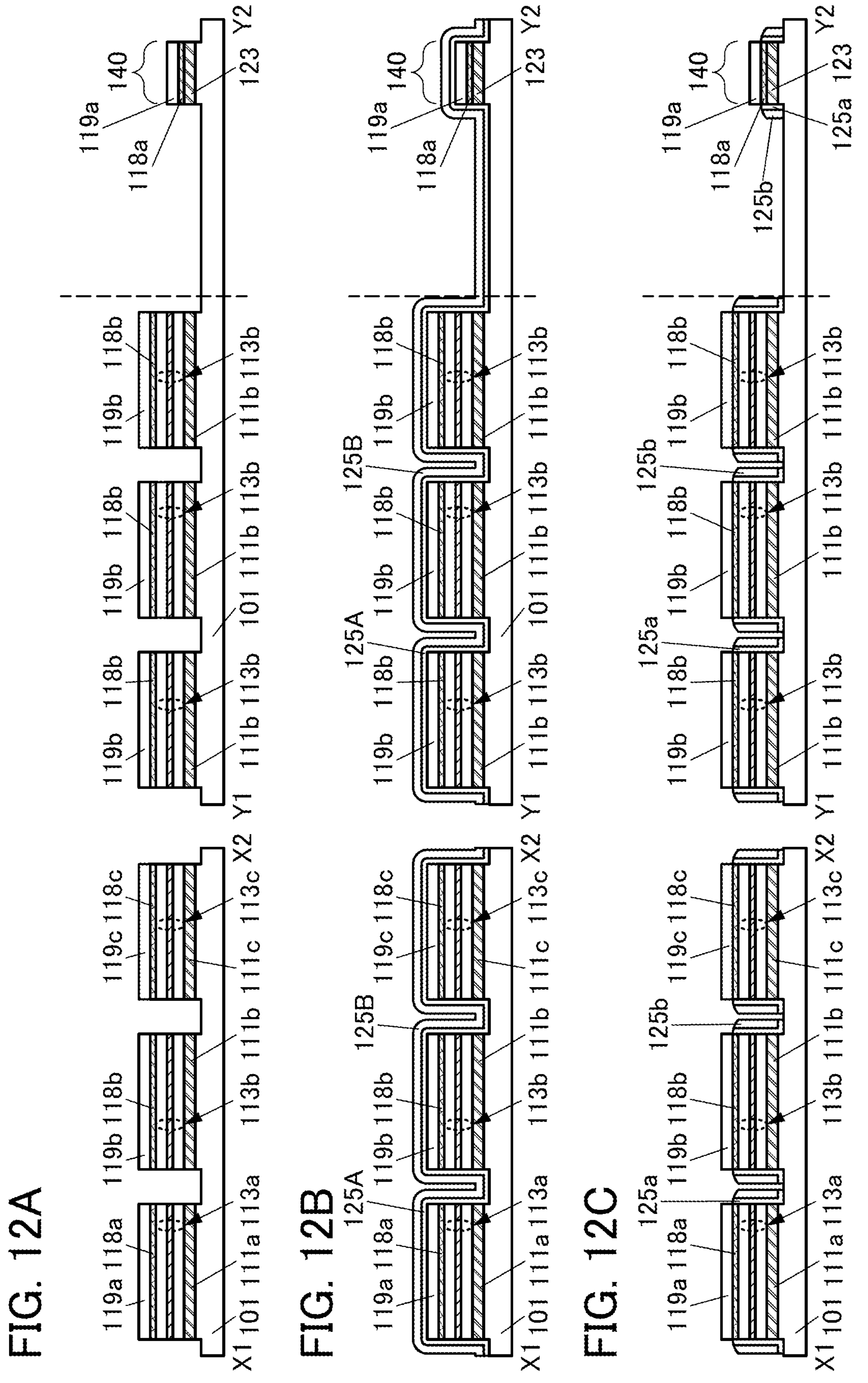
FIG. 12A to FIG. 12C are cross-sectional views illustrating an example of a method of manufacturing a display apparatus.

Then, as illustrated in FIG. 12A, the conductive film 111 is processed with the first sacrificial layers 118*a*, 118*b*, and 118*c* and the second sacrificial layers 119*a*, 119*b*, and 119*c* used as a hard mask, so that the pixel electrodes 111*a*, 111*b*, and 111*c* and the conductive layer 123 are formed.

Note that a sidewall covering side surfaces of the first layer 113*a*, the second layer 113*b*, and the third layer 113*c* may be formed before the conductive film 111 is processed. This inhibits the first layer 113*a*, the second layer 113*b*, and the third layer 113*c* from being damaged in the step of processing the conductive film 111.

In processing of the conductive film 111, part of the layer 101 including transistors (specifically, an insulating layer positioned on the outermost surface) is processed to form a depressed portion in some cases. Hereinafter, the case where a depressed portion is provided in the layer 101 including transistors is described as an example; however, the depressed portion is not necessarily provided.

Here, in order to form the conductive layer 123, any one of the first sacrificial layers 118*a*, 118*b*, and 118*c* and any one of the second sacrificial layers 119*a*, 119*b*, and 119*c* are preferably provided in the connection portion 140. Any two or all of the first sacrificial layers 118*a*, 118*b*, and 118*c* and any two or all of the second sacrificial layers 119*a*, 119*b*, and 119*c* may be provided in the connection portion 140. Providing the sacrificial layer in the connection portion 140 can inhibit a region which is to be the conductive layer 123 later in the conductive film 111 from being damaged during the manufacturing process of the display apparatus. Therefore, the first sacrificial layer 118*a* and the second sacrificial layer 119*a* whose formation processes are the earliest are preferably formed.

The conductive film 111 can be processed by a wet etching method or a dry etching method. The conductive film 111 is preferably processed by anisotropic etching.

Next, as illustrated in FIG. 12B, an insulating film 125A is formed to cover the pixel electrodes 111*a*, 111*b*, and 111*c*, the first layer 113*a*, the second layer 113*b*, the third layer 113*c*, the first sacrificial layers 118*a*, 118*b*, and 118*c*, and the second sacrificial layers 119*a*, 119*b*, and 119*c*, and an insulating film 125B is formed over the insulating film 125A.

As each of the insulating film 125A and the insulating film 125B, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a magnesium oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. Alternatively, a metal oxide film such as an indium gallium zinc oxide film may be used.

The insulating film 125A and the insulating film 125B are preferably formed by a formation method by which the EL layer is less damaged. In particular, the insulating film 125A, which is formed in contact with a side surface of the EL layer, is preferably formed by a formation method that causes less damage to the EL layer than the method of forming the insulating film 125B. The insulating film 125A and the insulating film 125B are each formed at a temperature lower than the upper temperature limit of the EL layer (typically at 200° C. or lower, preferably 100° C. or lower, further preferably 80° C. or lower). As the insulating film 125A, an aluminum oxide film can be formed by an ALD method, for example. The use of an ALD method is preferable, in which case damage by the deposition is reduced and a film with good coverage can be formed. As the insulating film 125B, a silicon oxynitride film or a silicon nitride film can be formed by a sputtering method, a CVD method, or a PECVD method, for example. These methods have higher deposition speed than an ALD method and thus can increase the productivity. The insulating film 125B is preferably thicker than the insulating film 125A.

One or both of the insulating film 125A and the insulating film 125B preferably have a function of a barrier insulating film against at least one of water and oxygen. Alternatively, one or both of the insulating film 125A and the insulating film 125B preferably have a function of inhibiting diffusion of at least one of water and oxygen. Alternatively, one or both of the insulating film 125A and the insulating film 125B preferably have a function of capturing or fixing (also referred to as gettering) at least one of water and oxygen.

Note that in this specification and the like, a barrier insulating film refers to an insulating film having a barrier property. In this specification and the like, a barrier property refers to a function of inhibiting diffusion of a targeted substance (also referred to as having low permeability). Alternatively, a barrier property refers to a function of capturing or fixing (also referred to as gettering) a targeted substance.

When one or both of the insulating film 125A and the insulating film 125B have a function of the barrier insulating film or a gettering function, entry of impurities (typically, water or oxygen) that would diffuse into the light-emitting devices from the outside can be inhibited. With such a structure, the display apparatus can have high reliability.

Then, as illustrated in FIG. 12C, the insulating film 125A and the insulating film 125B are processed, whereby the sidewall 125*a* and the sidewall 125*b* are formed. The sidewall 125*b* is formed in contact with the top surface and the side surface of the sidewall 125*a*. The sidewalls 125*a* and 125*b* are provided to cover the side surfaces of the pixel electrodes 111*a*, 111*b*, and 111*c*. This can inhibit the pixel electrodes 111*a*, 111*b*, and 111*c* from being in contact with a film to be formed later (a common electrode or a film included in the EL layer), thereby inhibiting a short circuit in the light-emitting device. Furthermore, the sidewalls 125*a* and 125*b* are preferably provided to cover the side surfaces of the first layer 113*a*, the second layer 113*b*, and the third layer 113*c*. This inhibits a film to be formed later from being in contact with the side surfaces of these layers, thereby inhibiting a short circuit in the light-emitting device. In addition, damage to the first layer 113*a*, the second layer 113*b*, and the third layer 113*c* in later steps can be inhibited.

In particular, the depressed portion is preferably provided in part of the layer 101 including transistors (specifically, an insulating layer positioned on the outermost surface), in which case the side surfaces of the pixel electrodes 111*a*, 111*b*, and 111*c* can be entirely covered with the sidewalls 125*a* and 125*b*.

The insulating film 125A and the insulating film 125B are preferably processed by a dry etching method. The insulating film 125A and the insulating film 125B are preferably processed by anisotropic etching. The insulating film 125A and the insulating film 125B can be processed using an etching gas that can be used for processing the first sacrificial layer 118A and the second sacrificial layer 119A. Since the EL layer is not exposed in processing the insulating film 125A and the insulating film 125B, the range of choices of the processing method is wider than that for processing the first sacrificial layer 118A. Specifically, deterioration of the EL layer can be further suppressed even when a gas containing oxygen is used as an etching gas for processing the insulating film 125A or the insulating film 125B.

An end portion of the sidewall 125*b* can have a rounded shape. For example, the end portion of the sidewall 125*b* is rounded as illustrated in FIG. 12C when an upper portion of the insulating film 125B is etched by anisotropic etching in formation of the insulating film 125B by a dry etching method. The rounded end portion of the sidewall 125*b* is preferable because the coverage with the fifth layer 114 or the common electrode 115 to be formed later can be increased. As illustrated in FIG. 12B, the end portion of the sidewall 125*b* is easily rounded in some cases when the thickness of the insulating film 125B is larger than the thickness of the insulating film 125A.

Although an example in which the sidewall with a two-layer structure is formed is shown here, the sidewall may have a single-layer structure or a stacked-layer structure of three or more layers.

Figures 13A, 13B, 13C:
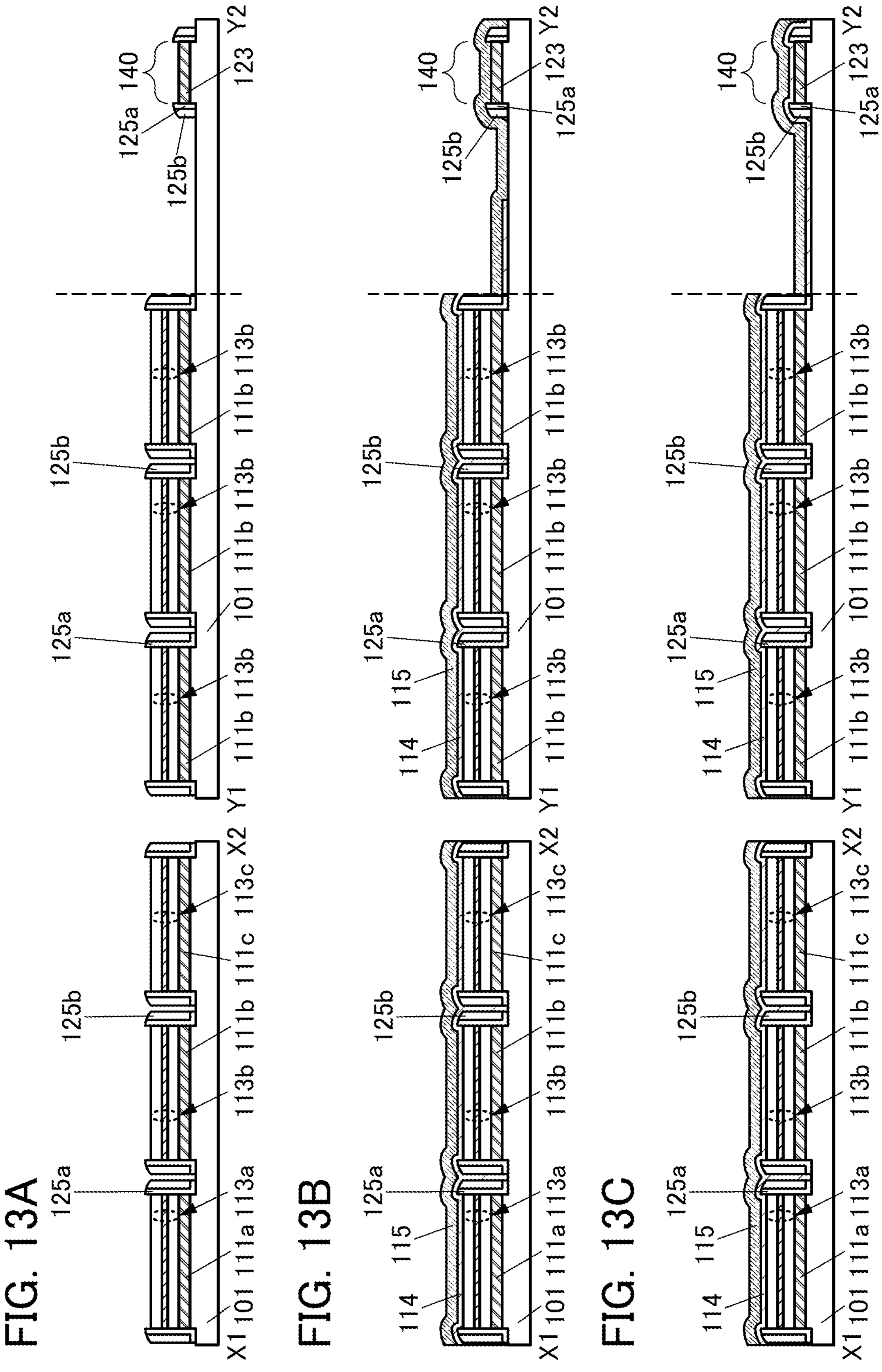
FIG. 13A to FIG. 13C are cross-sectional views illustrating an example of a method of manufacturing a display apparatus.

Subsequently, as illustrated in FIG. 13A, the first sacrificial layers 118*a*, 118*b*, and 118*c* and the second sacrificial layers 119*a*, 119*b*, and 119*c* are removed. Accordingly, the first layer 113*a* is exposed over the pixel electrode 111*a*, the second layer 113*b* is exposed over the pixel electrode 111*b*, the third layer 113*c* is exposed over the pixel electrode 111*c*, and the conductive layer 123 is exposed in the connection portion 140.

The step of removing the sacrificial layers can be performed by a method similar to that for the step of processing the sacrificial layers. In particular, the use of a wet etching method can reduce damage to the first layer 113*a*, the second layer 113*b*, and the third layer 113*c* at the time of removing the first sacrificial layer and the second sacrificial layer, as compared to the case of using a dry etching method.

The first sacrificial layer and the second sacrificial layer may be removed in different steps or the same step.

One or both of the first sacrificial layer and the second sacrificial layer may be removed by being dissolved in a solvent such as water or alcohol. Examples of alcohol include ethyl alcohol, methyl alcohol, isopropyl alcohol (IPA), and glycerin.

After the first sacrificial layer and the second sacrificial layer are removed, drying treatment may be performed to remove water included in the EL layer and water adsorbed on the surface of the EL layer. For example, heat treatment in an inert gas atmosphere or a reduced-pressure atmosphere can be performed. The heat treatment can be performed with a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Employing a reduced-pressure atmosphere is preferable, in which case drying at a lower temperature is possible.

Then, as illustrated in FIG. 13B, the fifth layer 114 is formed to cover the sidewalls 125*a* and 125*b*, the first layer 113*a*, the second layer 113*b*, and the third layer 113*c*. As illustrated in FIG. 13B, an end portion of the fifth layer 114 on the connection portion 140 side is positioned closer to the inner side than the connection portion 140 in the cross-sectional view along the line YT-Y2, and the conductive layer 123 is exposed. Note that as illustrated in FIG. 13C, the fifth layer 114 may be provided in the connection portion 140 depending on the conductivity of the fifth layer 114.

Materials that can be used for the fifth layer 114 are as described above. The fifth layer 114 can be formed by an evaporation method (including a vacuum evaporation method), a transfer method, a printing method, an inkjet method, a coating method, or the like. The fifth layer 114 may be formed using a premix material.

The fifth layer 114 is provided to cover the top surfaces of the sidewall 125*a*, the first layer 113*a*, the second layer 113*b*, and the third layer 113*c* and the top surface and the side surface of the sidewall 125*b*. Here, in the case where the fifth layer 114 has high conductivity, a short circuit in the light-emitting device might be caused when the fifth layer 114 is in contact with any of the pixel electrodes 111*a*, 111*b*, and 111*c*. Meanwhile, in the display apparatus of one embodiment of the present invention, the sidewalls 125*a* and 125*b* cover the side surfaces of the first layer 113*a*, the second layer 113*b*, the third layer 113*c*, and the pixel electrodes 111*a*, 111*b*, and 111*c*; hence, the fifth layer 114 with high conductivity can be prevented from being in contact with these layers, so that a short circuit of the light-emitting devices can be inhibited. Accordingly, the reliability of the light-emitting device can be increased.

Then, the common electrode 115 is formed over the fifth layer 114 and the conductive layer 123 as illustrated in FIG. 13B.

A mask for defining a deposition area may be used in the formation of the common electrode 115. Alternatively, the common electrode 115 may be formed without using the mask and the common electrode 115 may be processed with use of a resist mask after the formation of the common electrode 115.

Materials that can be used for the common electrode 115 are as described above. The common electrode 115 can be formed by a sputtering method or a vacuum evaporation method, for example. Alternatively, a film formed by an evaporation method and a film formed by a sputtering method may be stacked.

Figure 14A:
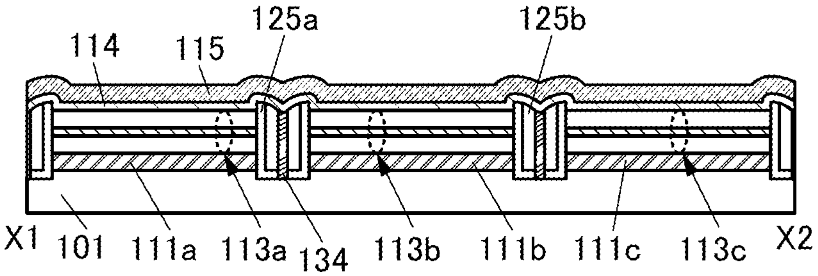
FIG. 14A to FIG. 14E are cross-sectional views illustrating an example of a method of manufacturing a display apparatus.

Note that as illustrated in FIG. 14A, a space 134 may be formed in a region between side surfaces (between the sidewalls 125*b*) of two EL layers facing to each other and in a depressed portion of the layer 101 including transistors. Specifically, in FIG. 14A, the space 134 surrounded by the layer 101 including transistors, the sidewalls 125*a* and 125*b*, and the fifth layer 114 is provided.

As described above, the space 134 is sometimes provided in the region between the side surfaces of two EL layers facing to each other and in the depressed portion of the layer 101 including transistors. The space is not formed in some cases depending on the distance between adjacent EL layers, the thickness of the fifth layer 114, the thickness of the common electrode 115, the thickness of the protective layer 131, and the like. In that case, the region between the side surfaces of two EL layers facing to each other and the depressed portion of the layer 101 including transistors are filled with at least one of the fifth layer 114, the common electrode 115, and the protective layer 131. A region to be the space may be filled with an insulator.

The space includes, for example, any one or more selected from air, nitrogen, oxygen, carbon dioxide, and Group 18 elements (typically, helium, neon, argon, xenon, and krypton). Furthermore, for example, a gas used during the deposition of the fifth layer 114 is sometimes included in the space. For example, in the case where the fifth layer 114 is deposited by a vacuum evaporation method, the space is in reduced-pressure atmosphere in some cases. In the case where a gas is included in the space, a gas can be identified with a gas chromatography method or the like.

In the case where the refractive index of the space is lower than that of the fifth layer 114, the common electrode 115, or the protective layer 131, light emitted from the first layer 113*a*, the second layer 113*b*, or the third layer 113*c* is reflected at the interface between the space and the fifth layer 114, the common electrode 115, or the protective layer 131. Thus, light emitted from the first layer 113*a*, the second layer 113*b*, or the third layer 113*c* can be inhibited from entering an adjacent pixel (or subpixel). This can inhibit mixture of light of different colors, thereby improving the display quality of the display apparatus.

A part to be the space 134 may be filled with an insulator. One or both of an organic insulating material and an inorganic insulating material can be used as the material for the insulator. At least one of a solid substance, a gelatinous substance, and a liquid substance can be used for the insulator.

Examples of an organic insulating material include an acrylic resin, an epoxy resin, a polyimide resin, a polyamide resin, a polyimide-amide resin, a polysiloxane resin, a benzocyclobutene-based resin, and a phenol resin. A variety of resins that can be used for the insulating layer 122 may also be used.

Examples of an inorganic insulating material include an oxide insulating material, a nitride insulating material, an oxynitride insulating material, and a nitride oxide insulating material. An insulating material that can be used for the protective layers 131 and 132 may also be used.

Figure 14B:
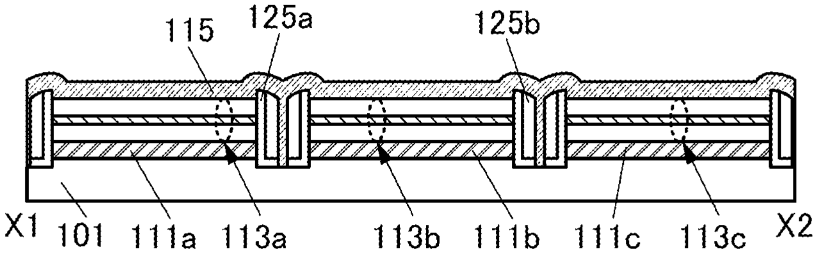

Alternatively, as illustrated in FIG. 14B, without providing the fifth layer 114, the common electrode 115 may be formed to cover the sidewalls 125*a* and 125*b*, the first layer 113*a*, the second layer 113*b*, and the third layer 113*c*. That is, all layers included in the EL layer may be separately formed in the light-emitting devices emitting light of different colors. At this time, the entire EL layer of each light-emitting device is formed in an island shape.

Here, when any of the pixel electrodes 111*a*, 111*b*, and 111*c* is in contact with the common electrode 115, the light-emitting device might be short-circuited. Meanwhile, in the display apparatus of one embodiment of the present invention, the sidewalls 125*a* and 125*b* cover the side surfaces of the first layer 113*a*, the second layer 113*b*, the third layer 113*c*, and the pixel electrodes 111*a*, 111*b*, and 111*c*; hence, the common electrode 115 can be prevented from being in contact with these layers, so that a short circuit of the light-emitting devices can be inhibited. Accordingly, the reliability of the light-emitting device can be increased.

FIG. 14B illustrates an example in which the common electrode 115 is embedded in the region between the light-emitting devices (between the sidewalls 125*b*) and in the depressed portion of the layer 101 including transistors. Alternatively, the space 134 may be provided as in FIG. 14A.

As described above, the layers formed after the formation of the sidewalls 125*a* and 125*b* have a variety of shapes without particular limitation in accordance with materials, deposition methods, and film thicknesses. In the display apparatus of one embodiment of the present invention, the sidewalls 125*a* and 125*b* are provided and thus a short circuit in the light-emitting device is inhibited. This expands the range of choices of the materials, deposition methods, and film thicknesses of layers formed after the formation of the sidewalls 125*a* and 125*b*.

Figure 14C:
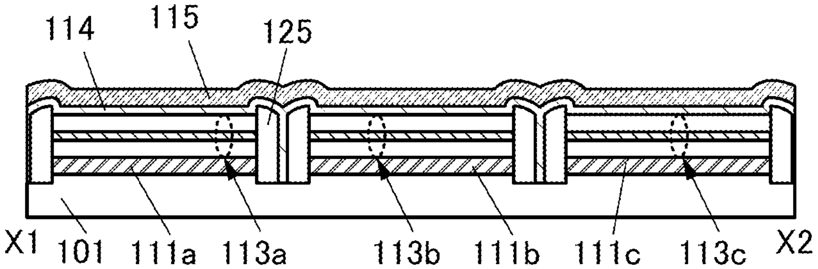

As illustrated in FIG. 14C, a sidewall 125 having a single-layer structure may be provided. As a material and a method for forming the sidewall 125, the material and the methods for forming the sidewalls 125*a* and 125*b* can be employed.

Figure 14D:
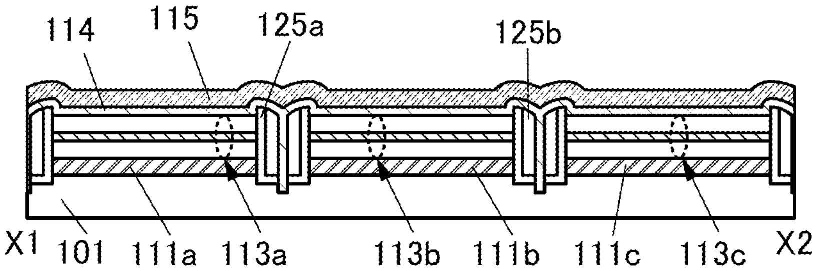

As illustrated in FIG. 14D, in processing of the insulating film 125A, part of the layer 101 including transistors (specifically, an insulating layer positioned on the outermost surface) is processed to form a depressed portion in some cases.

Figure 14E:
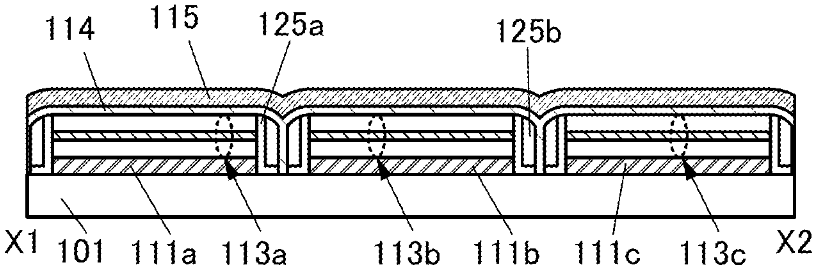

In the case where part of the layer 101 including a transistor (specifically, an insulating layer positioned on the outermost surface) is not processed at the time of processing the conductive film 111 as illustrated in FIG. 14E, a depressed portion is not provided in the layer 101 including a transistor in some cases.

After that, the protective layer 131 is formed over the common electrode 115, and the protective layer 132 is formed over the protective layer 131. Furthermore, the substrate 120 is attached to the protective layer 132 with the resin layer 122, whereby the display apparatus 100 illustrated in FIG. 1B can be manufactured.

Materials and deposition methods that can be used for the protective layers 131 and 132 are as described above. Examples of the deposition method of the protective layers 131 and 132 include a vacuum evaporation method, a sputtering method, a CVD method, and an ALD method.

The protective layer 131 and the protective layer 132 may be films formed by different deposition methods. The protective layers 131 and 132 may each have a single-layer structure or a stacked-layer structure.

As described above, in the method of manufacturing a display apparatus of one embodiment of the present invention, the island-shaped EL layers are formed not by using a fine metal mask but by processing an EL layer deposited over the entire surface, so that island-shaped EL layers can be formed to have a uniform thickness. Accordingly, a high-definition display apparatus or a display apparatus with a high aperture ratio can be achieved.

The first layer, the second layer, and the third layer included in the light-emitting devices of different colors are formed in separate steps. Accordingly, the respective EL layers can be formed to have structures (material, thickness, and the like) appropriate for the light-emitting devices of different colors. Thus, the light-emitting devices can have favorable characteristics.

The display apparatus of one embodiment of the present invention includes a sidewall that covers side surfaces of a pixel electrode, a light-emitting layer, and a carrier-transport layer. In the manufacturing process of the display apparatus, the EL layer is processed while the light-emitting layer and the carrier-transport layer are stacked; hence, damage to the light-emitting layer is reduced in the display apparatus. In addition, the sidewall inhibits the pixel electrode from being in contact with a carrier-injection layer or a common electrode, thereby inhibiting a short circuit in the light-emitting device.

This embodiment can be combined with the other embodiments as appropriate. In the case where a plurality of structure examples are described in one embodiment in this specification, the structure examples can be combined as appropriate.

Embodiment 2

In this embodiment, structure examples of a light-emitting device that can be used for the display apparatus of one embodiment of the present invention will be described with reference to FIG. 15 to FIG. 18.

Figure 15A:
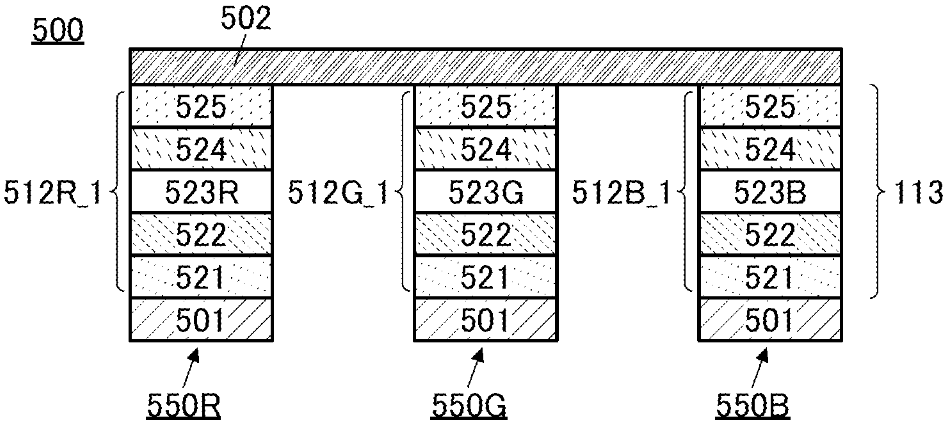
FIG. 15A to FIG. 15C are cross-sectional views illustrating examples of a display apparatus.
Figure 15B:
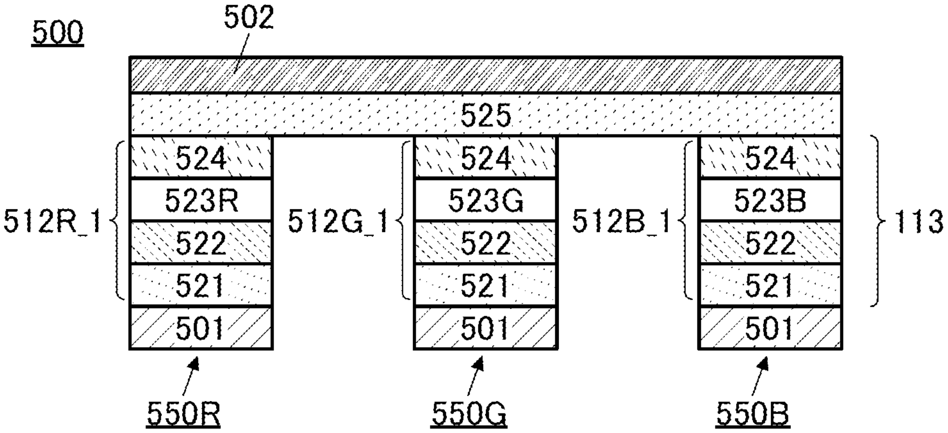
Figure 15C:
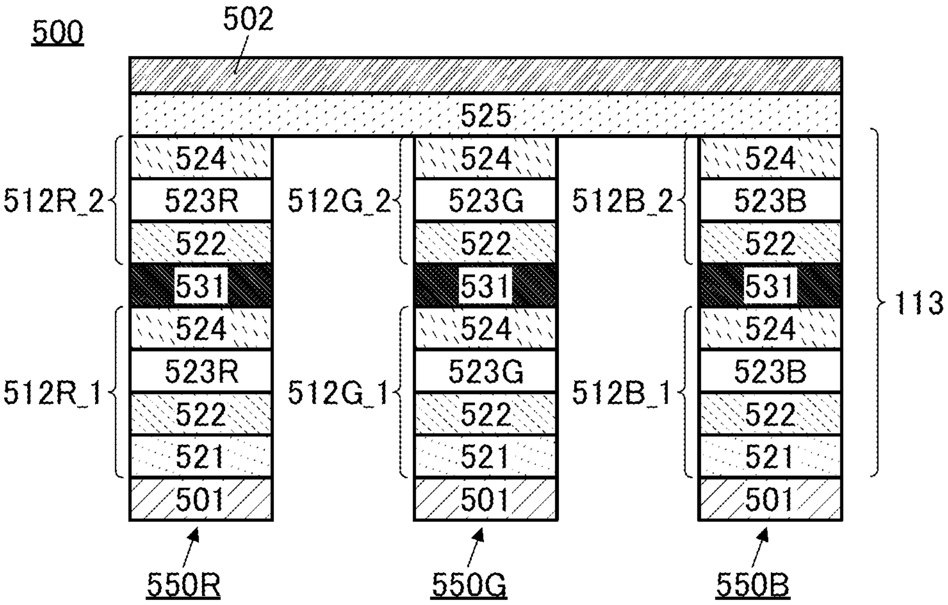

A display apparatus 500 illustrated each of in FIG. 15A to FIG. 15C includes a light-emitting device 550R that emits red light, a light-emitting device 550G that emits green light, and a light-emitting device 550B that emits blue light.

The light-emitting device 550R illustrated in each of FIG. 15A and FIG. 15B includes a light-emitting unit 512R_1 between a pair of electrodes (an electrode 501 and an electrode 502). Similarly, the light-emitting device 550G includes a light-emitting unit 512G_1, and the light-emitting device 550B includes a light-emitting unit 512B_1.

That is, each of the light-emitting devices 550R, 550G, and 550B illustrated in FIG. 15A and FIG. 15B has a single structure that includes one light-emitting unit.

The light-emitting device 550R illustrated in FIG. 15C has a structure in which between a pair of electrodes (the electrode 501 and the electrode 502), two light-emitting units (the light-emitting unit 512R_1 and a light-emitting unit 512R_2) are stacked with a charge-generation layer 531 therebetween. Similarly, the light-emitting device 550G includes the light-emitting unit 512G_1 and a light-emitting unit 512G_2, and the light-emitting device 550B includes the light-emitting unit 512B_1 and a light-emitting unit 512B_2.

That is, each of the light-emitting devices 550R, 550G, and 550B illustrated in FIG. 15C has a tandem structure that includes two light-emitting units.

A structure in which a plurality of light-emitting units are connected in series with the charge-generation layer 531 therebetween as in the light-emitting device 550R, the light-emitting device 550G, and the light-emitting device 550B illustrated in FIG. 15C is referred to as a tandem structure in this specification. A structure including one light-emitting unit between a pair of electrodes as in the light-emitting devices 550R, 550G, and 550B illustrated in FIG. 15A and FIG. 15B is referred to as a single structure. Note that in this specification and the like, the term "tandem structure" is used; however, without being limited to this, the tandem structure may be referred to as a stack structure, for example. The tandem structure enables alight-emitting device capable of high-luminance light emission. Furthermore, the tandem structure reduces the amount of current needed for obtaining the same luminance as compared with a single structure, and thus can improve the reliability.

A structure in which light-emitting layers of light-emitting devices are separately formed as in the display apparatus 500 illustrated in FIG. 15A to FIG. 15C is referred to as an SBS (Side By Side) structure in some cases.

The display apparatus 500 illustrated in FIG. 15C includes light-emitting devices with a tandem structure and has the SBS structure. Thus, the display apparatus 500 can take advantages of both the tandem structure and the SBS structure. Two light-emitting units are formed in series in the display apparatus 500 illustrated in FIG. 15C, and this structure may be referred to as a two-unit tandem structure. In the two-unit tandem structure of the light-emitting device 550R illustrated in FIG. 15C, a second light-emitting unit including a red-light-emitting layer is stacked over a first light-emitting unit including a red-light-emitting layer. Similarly, in the two-unit tandem structure of the light-emitting device 550G illustrated in FIG. 15C, a second light-emitting unit including a green-light-emitting layer is stacked over a first light-emitting unit including a green-light-emitting layer, and in the two-unit tandem structure of the light-emitting device 550B, a second light-emitting unit including a blue-light-emitting layer is stacked over a first light-emitting unit including a blue-light-emitting layer.

The electrode 501 functions as a pixel electrode and is provided in every light-emitting device. The electrode 502 functions as a common electrode and is shared by a plurality of light-emitting devices.

The light-emitting unit includes at least one light-emitting layer. The number of light-emitting layers included in the light-emitting unit is not limited and can be one, two, three, four or more.

The light-emitting unit 512R_1 includes a layer 521, a layer 522, a light-emitting layer 523R, a layer 524, and the like. FIG. 15A illustrates an example in which the light-emitting unit 512R_1 includes a layer 525, and FIG. 15B illustrates an example in which the light-emitting unit 512R_1 does not include the layer 525 and the layer 525 is shared between the light-emitting devices. In that case, the layer 525 can be referred to as a common layer. By providing one or more common layers for a plurality of light-emitting devices in this manner, the manufacturing process can be simplified, resulting in a reduction in manufacturing cost.

The light-emitting unit 512R_2 includes the layer 522, the light-emitting layer 523R, the layer 524, and the like. Although FIG. 15C illustrates an example in which the layer 525 is provided as a common layer, the layer 525 may be separately provided for each light-emitting device. That is, the layer 525 may be included in the light-emitting unit 512R_2.

The layer 521 includes, for example, a layer containing a substance with a high hole-injection property (hole-injection layer). The layer 522 includes, for example, a layer containing a substance with a high hole-transport property (hole-transport layer). The layer 524 includes, for example, a layer containing a substance with a high electron-transport property (electron-transport layer). The layer 525 includes, for example, a layer containing a substance with a high electron-injection property (electron-injection layer).

Alternatively, the layer 521 may include an electron-injection layer, the layer 522 may include an electron-transport layer, the layer 524 may include a hole-transport layer, and the layer 525 may include a hole-injection layer.

Note that in terms of the layer 522, the light-emitting layer 523R, and the layer 524, the light-emitting unit 512R_1 and the light-emitting unit 512R_2 may have the same structure (materials, thicknesses, and the like) or different structures.

FIG. 15A and the like illustrate the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

The charge-generation layer 531 has a function of injecting electrons into one of the light-emitting unit 512R_1 and the light-emitting unit 512R_2 and injecting holes into the other when voltage is applied between the electrode 501 and the electrode 502. The charge-generation layer 531 includes at least a charge-generation region.

Note that the light-emitting layer 523R included in the light-emitting device 550R contains a light-emitting substance that emits red light, a light-emitting layer 523G included in the light-emitting device 550G contains a light-emitting substance that emits green light, and a light-emitting layer 523B included in the light-emitting device 550B contains a light-emitting substance that emits blue light. Note that the light-emitting device 550G and the light-emitting device 550B have a structure in which the light-emitting layer 523R included in the light-emitting device 550R is replaced with the light-emitting layer 523G and the light-emitting layer 523B, respectively, and the other components are similar to those of the light-emitting device 550R.

The structure (material, thickness, and the like) of the layer 521, the layer 522, the layer 524, and the layer 525 may be the same or different from each other among the light-emitting devices of different colors.

In FIG. 15A and FIG. 15B, the light-emitting unit 512R_1, the light-emitting unit 512G_1, and the light-emitting unit 512B_1 can be formed as an island-shaped layer. That is, a layer 113 illustrated in FIG. 15A and FIG.

15B corresponds to the first layer 113a, the second layer 113b, or the third layer 113c illustrated in FIG. 1B or the like.

In FIG. 15C, the light-emitting unit 512R_1, the charge-generation layer 531, and the light-emitting unit 512R_2 can be formed as an island-shaped layer. The light-emitting unit 512G_1, the charge-generation layer 531, and the light-emitting unit 512G_2 can be formed as an island-shaped layer. The light-emitting unit 512B_1, the charge-generation layer 531, and the light-emitting unit 512B_2 can be formed as an island-shaped layer. That is, the layer 113 illustrated in FIG. 15C corresponds to the first layer 113a, the second layer 113b, or the third layer 113c illustrated in FIG. 1B or the like.

In FIG. 15B and FIG. 15C, the layer 525 corresponds to the fifth layer 114 in FIG. 1B.

There is no particular limitation on the light-emitting material of the light-emitting layer in the display apparatus 500. For example, in the display apparatus 500 illustrated in FIG. 15C, it is possible that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a fluorescent material, the light-emitting layer 523G included in the light-emitting unit 512G_2 contains a fluorescent material, the light-emitting layer 523B included in the light-emitting unit 512B_1 contains a fluorescent material, and the light-emitting layer 523B included in the light-emitting layer 523B included in the light-emitting unit 512B_2 contains a fluorescent material.

Alternatively, in the display apparatus 500 illustrated in FIG. 15C, it is possible that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a phosphorescent material, the light-emitting layer 523G included in the light-emitting unit 512G_2 contains a phosphorescent material, the light-emitting layer 523B included in the light-emitting unit 512B_1 contains a fluorescent material, and the light-emitting layer 523B included in the light-emitting layer 523B included in the light-emitting unit 512B_2 contains a fluorescent material.

Note that in the display apparatus of one embodiment of the present invention, all the light-emitting layers may contain fluorescent materials or all the light-emitting layers may contain phosphorescent materials.

Alternatively, the display apparatus 500 illustrated in FIG. 15C may employ a structure in which the light-emitting layer 523R included in the light-emitting unit 512R_1 contains a phosphorescent material and the light-emitting layer 523R included in the light-emitting unit 512R_2 contains a fluorescent material, or a structure in which the light-emitting layer 523R included in the light-emitting unit 512R_1 contains a fluorescent material and the light-emitting layer 523R included in the light-emitting unit 512R_2 contains a phosphorescent material, i.e., a structure in which a light-emitting layer in a first unit and a light-emitting layer in a second unit are formed using different light-emitting materials. Note that here, the light-emitting unit 512R_1 and the light-emitting unit 512R_2 are described, and the same structure can also be applied to the light-emitting unit 512G_1 and the light-emitting unit 512G_2, and the light-emitting unit 512B_1 and the light-emitting unit 512B_2.

The display apparatus 500 illustrated in each of FIG. 16 to FIG. 18 includes the light-emitting device 550R that emits red light, the light-emitting device 550G that emits green light, the light-emitting device 550B that emits blue light, and the light-emitting device 550W that emits white light.

Figure 16A:
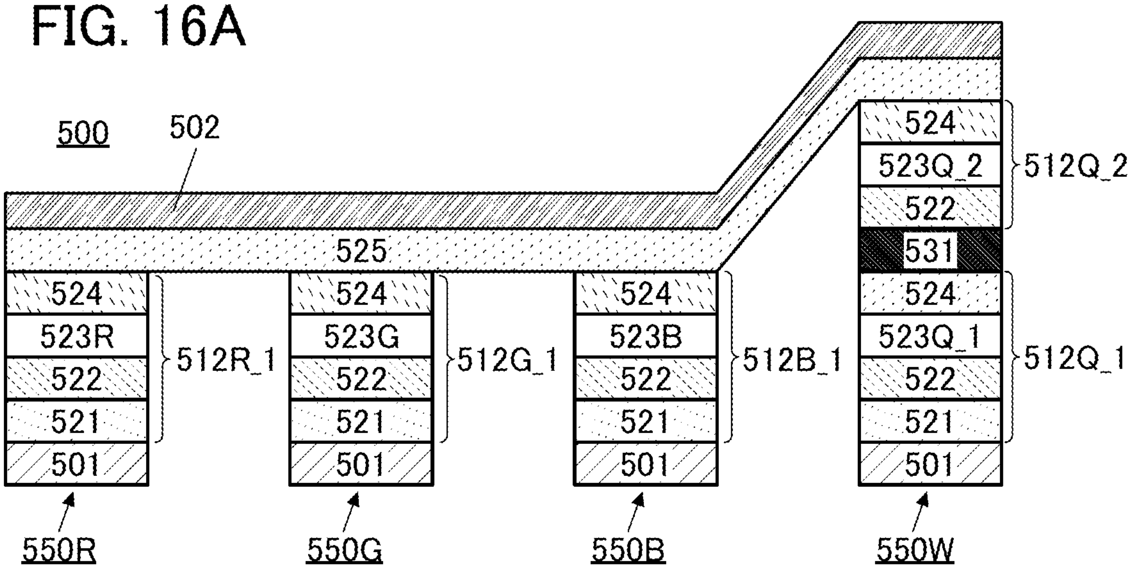
FIG. 16A and FIG. 16B are cross-sectional views illustrating examples of a display apparatus.
Figure 16B:
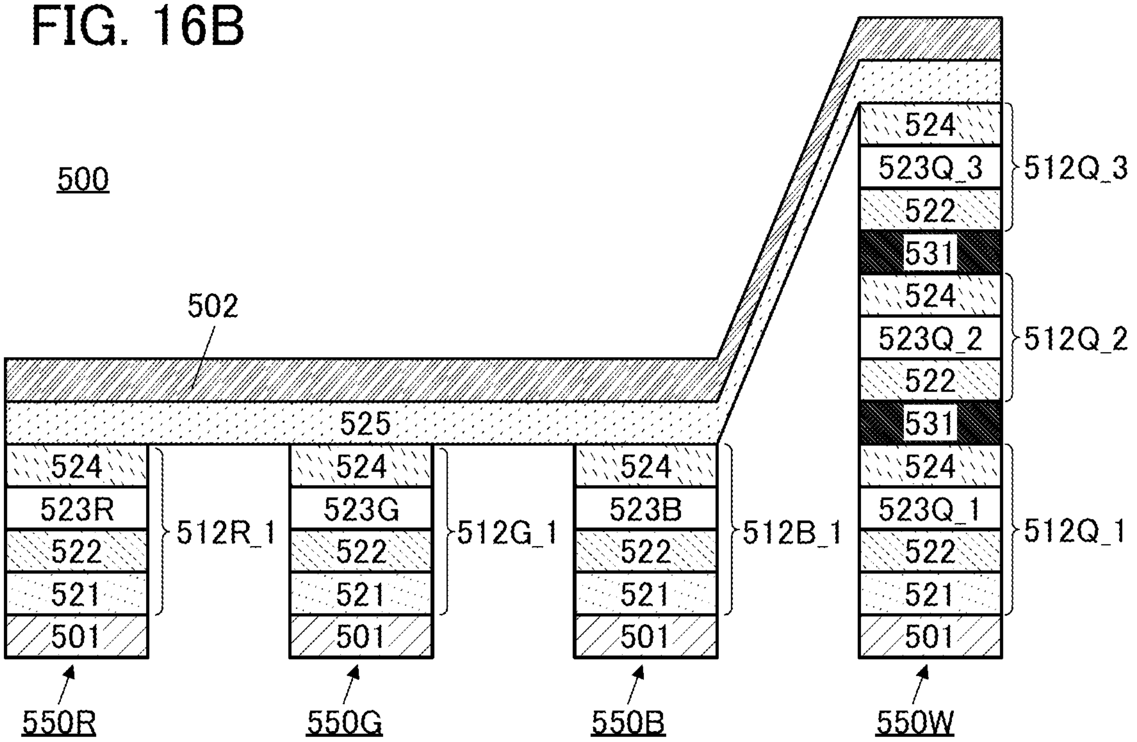

The display apparatus illustrated in each of FIG. 16A and FIG. 16B is an example in which the light-emitting device 550W that emits white light is provided in addition to the light-emitting devices 550R, 550G, and 550B illustrated in FIG. 15B. The display apparatus illustrated in FIG. 17A is an example in which the light-emitting device 550W that emits white light is provided in addition to the light-emitting devices 550R, 550G, and 550B illustrated in FIG. 15C.

Figure 17A:
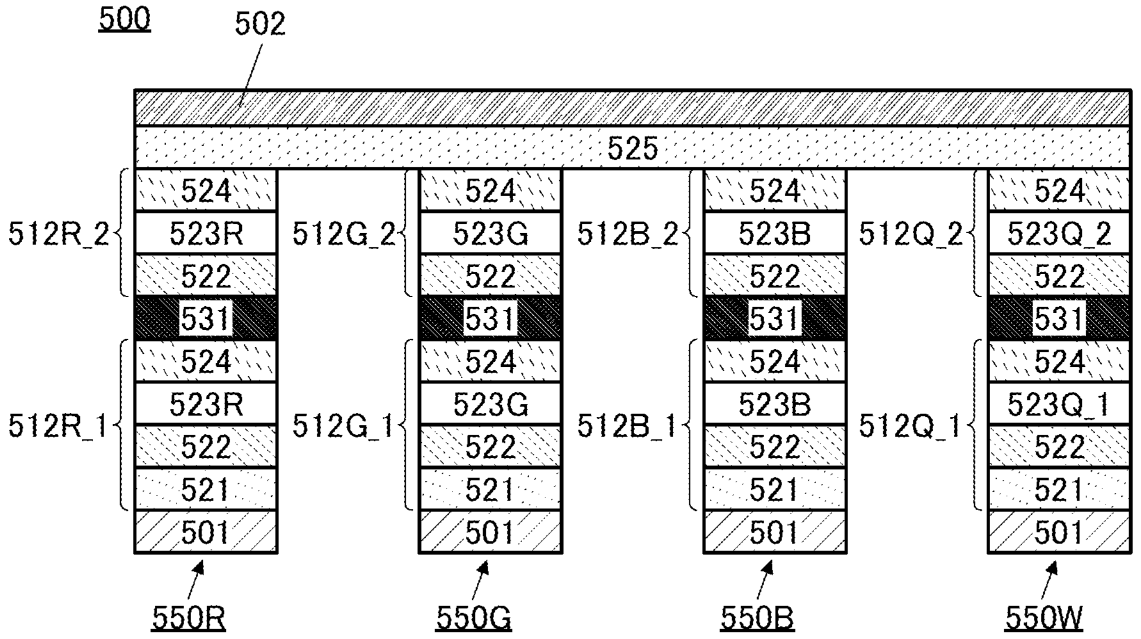
FIG. 17A and FIG. 17B are cross-sectional views illustrating examples of a display apparatus.

The light-emitting device 550W illustrated in each of FIG. 16A and FIG. 17A has a structure in which between a pair of electrodes (the electrode 501 and the electrode 502), two light-emitting units (the light-emitting unit 512Q_1 and the light-emitting unit 512Q_2) are stacked with the charge-generation layer 531 therebetween.

The light-emitting device 550W illustrated in FIG. 16B has a structure in which between a pair of electrodes (the electrode 501 and the electrode 502), three light-emitting units (the light-emitting unit 512Q_1, the light-emitting unit 512Q_2, and a light-emitting unit 512Q_3) are stacked with the charge-generation layer 531 therebetween.

The light-emitting unit 512Q_1 includes the layer 521, the layer 522, the light-emitting layer 523Q_1, the layer 524, and the like. The light-emitting unit 512Q_2 includes the layer 522, the light-emitting layer 523Q_2, the layer 524, and the like. The light-emitting unit 512Q_3 includes the layer 522, the light-emitting layer 523Q_3, the layer 524, and the like.

In the light-emitting device 550W illustrated in FIG. 16A and FIG. 17A, the light-emitting layer 523Q_1 and the light-emitting layer 523Q_2 are selected such that emission colors of the light-emitting layers are complementary colors, whereby white light emission can be obtained from the light-emitting device 550W.

In the light-emitting device 550W illustrated in FIG. 16B, white light emission can be obtained from the light-emitting device 550W by selecting the light-emitting layer 523Q_1, the light-emitting layer 523Q_2, and the light-emitting layer 523Q_3 such that emission colors of these light-emitting layers are complementary colors.

Note that the light-emitting device 550W has a structure in which the light-emitting layer 523R included in the light-emitting device 550R is replaced with the light-emitting layer 523Q_1 and the like, and the other components are similar to those of the light-emitting device 550R.

Figure 17B:
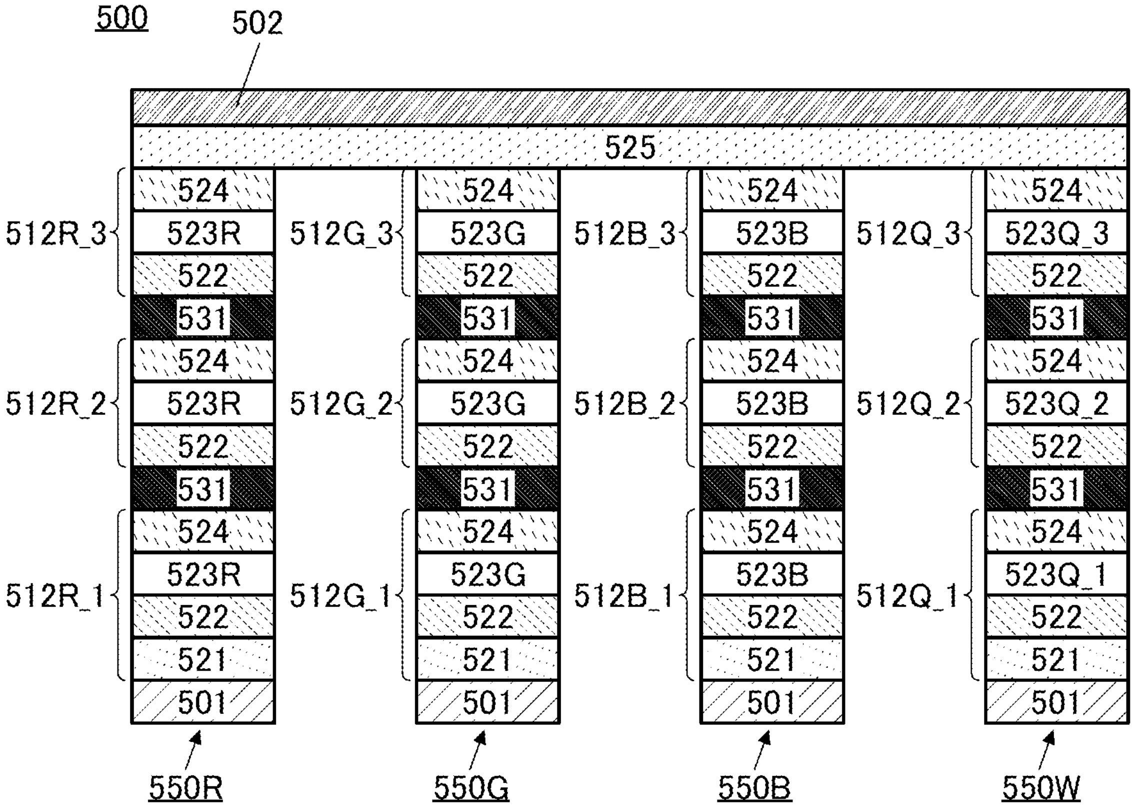

The display apparatus 500 illustrated in FIG. 17B is an example in which each of the light-emitting device 550R that emits red light, the light-emitting device 550G that emits green light, the light-emitting device 550B that emits blue light, and the light-emitting device 550W that emits white light has a three-unit tandem structure obtained by stacking three light-emitting units. In the light-emitting device 550R in FIG. 17B, a light-emitting unit 512R_3 is further stacked over the light-emitting unit 512R_2 with the charge-generation layer 531 positioned therebetween. The light-emitting unit 512R_3 includes the layer 522, the light-emitting layer 523R, the layer 524, and the like. The light-emitting unit 512R_3 can have a structure similar to that of the light-emitting unit 512R_2. The same applies to a light-emitting unit 512G_3 included in the light-emitting device 550G, a light-emitting unit 512B_3 included in the light-emitting device 550B, and a light-emitting unit 512Q_3 included in the light-emitting device 550W.

Figure 18A:
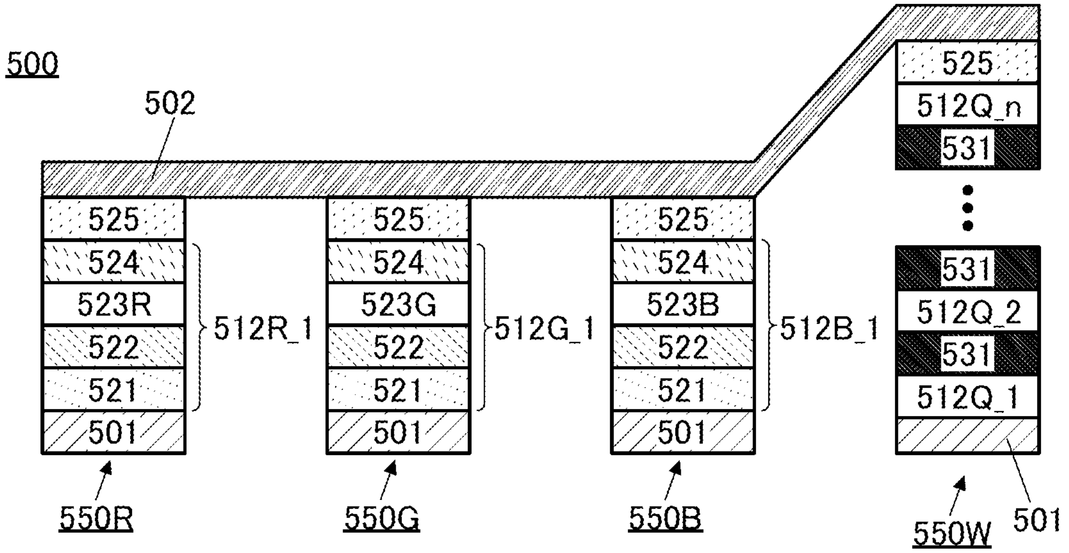
FIG. 18A and FIG. 18B are cross-sectional views illustrating examples of a display apparatus.

FIG. 18A illustrates an example in which the light-emitting device 550W that emits white light is provided in addition to the light-emitting devices 550R, 550G, and 550B illustrated in FIG. 15A.

The light-emitting device 550W illustrated in FIG. 18A has a structure in which between a pair of electrodes (the electrode 501 and the electrode 502), n light-emitting units (n is an integer greater than or equal to 2) are stacked with the charge-generation layer 531 positioned therebetween. The light-emitting device 550W includes n light-emitting units (the light-emitting unit 512Q_1 to a light-emitting unit 512Q_n), and colors of light from these light-emitting units are complementary colors, whereby the light-emitting device 550W can emit white light.

Figure 18B:
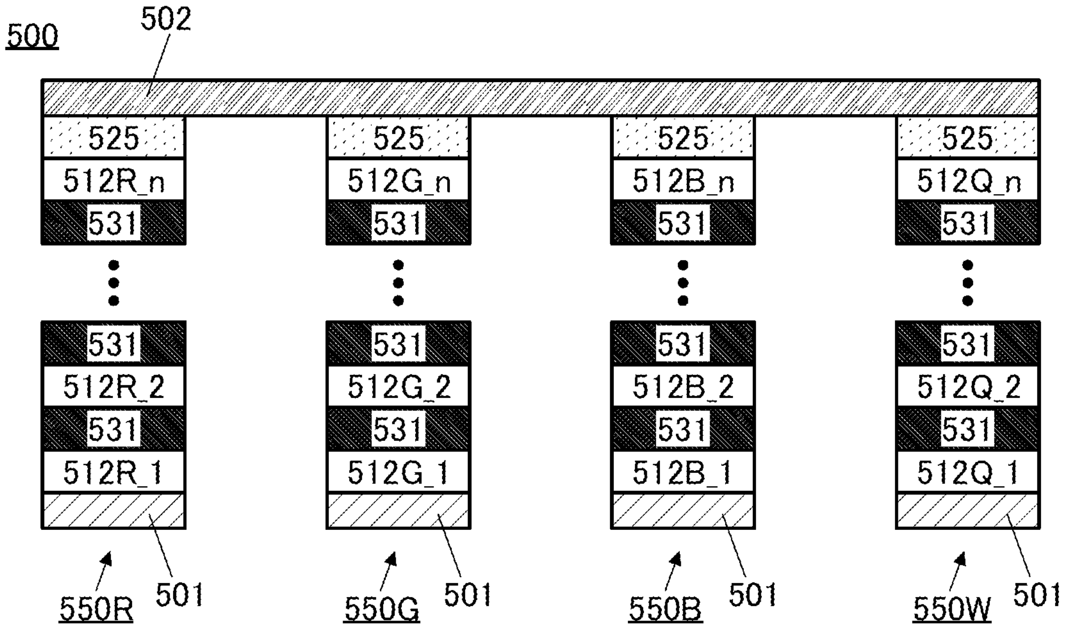

The display apparatus illustrated in FIG. 18B has a structure in which each of the light-emitting device 550R that emits red light, the light-emitting device 550G that emits green light, the light-emitting device 550B that emits blue light, and the light-emitting device 550W that emits white light has a structure in which n light-emitting units are stacked (n is an integer greater than or equal to 2). The light-emitting device 550R includes n light-emitting units (the light-emitting unit 512R_1 to a light-emitting unit 512R_n) each including a light-emitting layer emitting red light. The light-emitting device 550G includes n light-emitting units (the light-emitting unit 512G_1 to a light-emitting unit 512G_n) each including a light-emitting layer emitting green light. The light-emitting device 550B includes n light-emitting units (the light-emitting unit 512B_1 to a light-emitting unit 512B_n) each including a light-emitting layer emitting blue light.

When the number of stacked light-emitting units is increased in the above manner, luminance obtained from the light-emitting device with the same amount of current can be increased in accordance with the number of stacked layers. Moreover, increasing the number of stacked light-emitting units can reduce current necessary for obtaining the same luminance; thus, power consumption of the light-emitting device can be reduced in accordance with the number of stacked layers.

This embodiment can be combined with the other embodiments as appropriate.

Embodiment 3

In this embodiment, a display apparatus of one embodiment of the present invention is described with reference to FIG. 19 and FIG. 21.

The display apparatus in this embodiment can be a high-resolution display apparatus or large-sized display apparatus. Accordingly, the display apparatus of this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Apparatus 100A]

Figure 19:
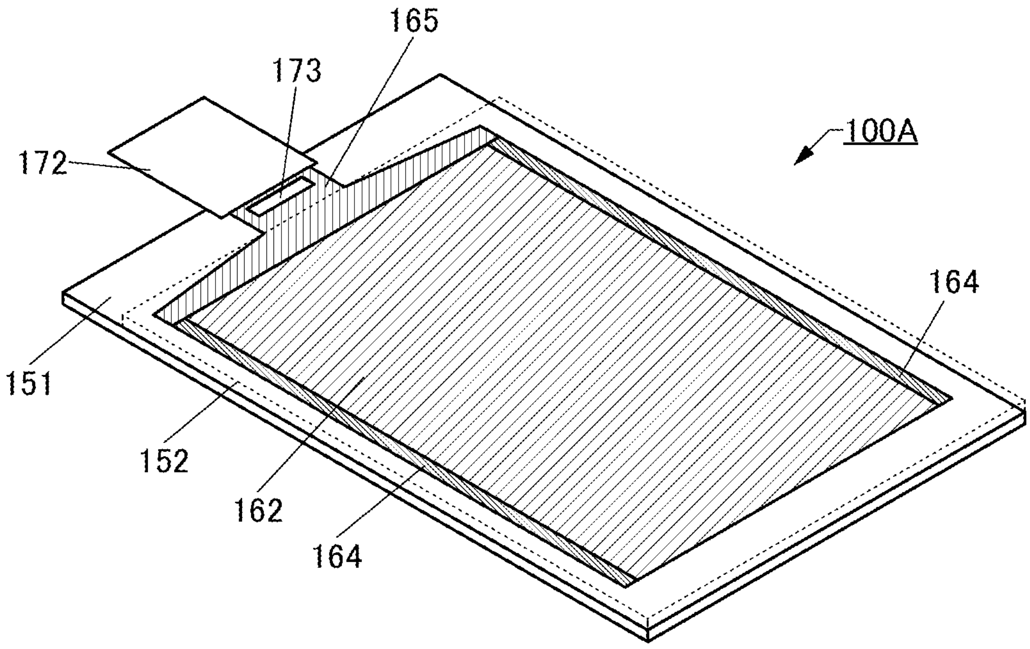
FIG. 19 is a perspective view illustrating an example of a display apparatus.

FIG. 19 is a perspective view of a display apparatus 100A, and FIG. 20A is a cross-sectional view of the display apparatus 100A.

The display apparatus 100A has a structure where a substrate 152 and a substrate 151 are bonded to each other. In FIG. 19, the substrate 152 is denoted by a dashed line.

The display apparatus 100A includes a display portion 162, a circuit 164, a wiring 165, and the like. FIG. 19 illustrates an example in which an IC 173 and an FPC 172 are mounted on the display apparatus 100A. Thus, the structure illustrated in FIG. 19 can be regarded as a display module including the display apparatus 100A, the IC (integrated circuit), and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 19 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display apparatus 100A and the display module are not necessarily provided with an IC. The IC may be mounted on the FPC by a COF method or the like.

FIG. 20A illustrates an example of cross sections of part of a region including the FPC 172, part of the circuit 164, part of the display portion 162, and part of a region including an end portion of the display apparatus 100A.

The display apparatus 100A illustrated in FIG. 20A includes a transistor 201, a transistor 205, the light-emitting device 130*a* which emits red light, the light-emitting device 130*b* which emits green light, the light-emitting device 130*c* which emits blue light, and the like between the substrate 151 and the substrate 152.

In the case where a pixel of the display apparatus includes three kinds of subpixels including light-emitting devices emitting light of different colors, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

The light-emitting devices 130*a*, 130*b*, and 130*c* each have the same structure as the stacked-layer structure illustrated in FIG. 1B except that they include an optical adjustment layer between the pixel electrodes and the EL layers. The light-emitting device 130*a* includes the optical adjustment layer 126*a*, the light-emitting device 130*b* includes the optical adjustment layer 126*b*, and the light-emitting device 130*c* includes the optical adjustment layer 126*c*. Embodiment 1 can be referred to for the details of the light-emitting devices. Side surfaces of the pixel electrodes 111*a*, 111*b*, and 111*c*, the optical adjustment layers 126*a*, 126*b*, and 126*c*, the first layer 113*a*, the second layer 113*b*, and the third layer 113*c* are covered with the sidewall 125*a* and the sidewall 125*b*. The fifth layer 114 is provided over the first layer 113*a*, the second layer 113*b*, the third layer 113*c*, and the sidewall 125*a* and the sidewall 125*b*. The common electrode 115 is provided over the fifth layer 114. The protective layer 131 is provided over the light-emitting devices 130*a*, 130*b*, and 130*c*. The protective layer 132 is provided over the protective layer 131.

FIG. 20A illustrates an example in which the thickness of the optical adjustment layer 126*a* is larger than that of the optical adjustment layer 126*b* and the thickness of the optical adjustment layer 126*b* is larger than that of the optical adjustment layer 126*c*. The thickness of each optical adjustment layer is preferably determined in the following manner: the thickness of the optical adjustment layer 126*a* is set to intensify red light, the thickness of the optical adjustment layer 126*b* is set to intensify green light, and the thickness of the optical adjustment layer 126*c* is set to intensify blue light. This achieves a microcavity structure, so that the color purity of light emitted from each light-emitting device can be increased.

The optical adjustment layer is preferably formed using a conductive material transmitting visible light among the conductive materials that can be used for the electrode of the light-emitting device.

The protective layer 132 and the substrate 152 are bonded to each other with an adhesive layer 142. A solid sealing structure, a hollow sealing structure, or the like can be employed to seal the light-emitting devices. In FIG. 20A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. The adhesive layer 142 may be provided not to overlap with the light-emitting device. The space may be filled with a resin different from that of the frame-like adhesive layer 142.

The pixel electrodes 111*a*, 111*b*, and 111*c* are each electrically connected to a conductive layer 222*b* included in the transistor 205 through an opening provided in an insulating layer 214.

The pixel electrode contains a material that reflects visible light, and the common electrode 115 (that can also be referred to as a counter electrode) contains a material that transmits visible light.

The display apparatus 100A has atop emission structure. Light from the light-emitting device is emitted toward the substrate 152. For the substrate 152, a material having a high visible-light-transmitting property is preferably used.

A stacked-layer structure including the substrate 151 and the components thereover up to the insulating layer 214 corresponds to the layer 101 including transistors in Embodiment 1.

The transistor 201 and the transistor 205 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned on the inner side compared to the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, a stacked film of an organic insulating film and an inorganic insulating film may be used as the insulating layer 214. The outermost layer of the insulating layer 214 preferably has a function of an etching protective film. Accordingly, a depressed portion can be prevented from being formed in the insulating layer 214 at the time of processing the sidewalls 125*a* and 125*b*, or the like. Alternatively, a depression portion may be formed in the insulating layer 214 at the time of processing the sidewalls 125*a* and 125*b*, or the like.

In a region 228 illustrated in FIG. 20A, an opening is formed in the insulating layer 214. This can inhibit entry of impurities into the display portion 162 from the outside through the insulating layer 214 even when an organic insulating film is used as the insulating layer 214. Consequently, the reliability of the display apparatus 100A can be increased.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as agate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display apparatus of this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer. Alternatively, it is preferable to use an oxide containing indium, tin, and zinc. Further alternatively, it is preferable to use an oxide containing indium, gallium, tin, and zinc.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

FIG. 20B and FIG. 20C illustrate other structure examples of transistors.

The transistor 209 and the transistor 210 each include the conductive layer 221 functioning as a gate, the insulating layer 211 functioning as a gate insulating layer, the semiconductor layer 231 including a channel formation region **231*i* and a pair of low-resistance regions 231*n*, the conductive layer 222*a* connected to one of the low-resistance regions 231*n*, the conductive layer 222*b* connected to the other low-resistance region 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218** covering the transistor may be provided.

FIG. 20B illustrates an example of the transistor 209 in which the insulating layer 225 covers a top surface and a side surface of the semiconductor layer 231. The conductive layer **222*a* and the conductive layer 222*b* are connected to the corresponding low-resistance regions 231*n* through openings provided in the insulating layer 225 and the insulating layer 215. One of the conductive layer 222*a* and the conductive layer 222*b*** functions as a source, and the other functions as a drain.

In the transistor 210 illustrated in FIG. 20C, the insulating layer 225 overlaps with the channel formation region **231*i* of the semiconductor layer 231 and does not overlap with the low-resistance regions 231*n*. The structure illustrated in FIG. 20C is obtained by processing the insulating layer 225 with the conductive layer 223 as a mask, for example. In FIG. 20C, the insulating layer 215 is provided to cover the insulating layer 225 and the conductive layer 223, and the conductive layer 222*a* and the conductive layer 222*b* are connected to the low-resistance regions 231*n* through the openings in the insulating layer 215**.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the pixel electrode and a conductive film obtained by processing the same conductive film as the optical adjustment layer **126*c*. On a top surface of the connection portion 204, the conductive layer 166 is exposed. Thus, the connection portion 204 and the FPC 172 can be electrically connected to each other through the connection layer 242**.

A light-blocking layer 117 is preferably provided on the surface of the substrate 152 on the substrate 151 side. A variety of optical members can be arranged on the outer surface of the substrate 152. Examples of the optical members include a polarizing plate, a retardation plate, a light diffusion layer (e.g., a diffusion film), an anti-reflective layer, and a light-condensing film.

Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

The protective layer 131 and the protective layer 132 covering the light-emitting device can inhibit an impurity such as water from entering the light-emitting device, and increase the reliability of the light-emitting device.

In the region 228 in the vicinity of the end portion of the display apparatus 100A, the insulating layer 215 and the protective layer 131 or the protective layer 132 are preferably in contact with each other through an opening in the insulating layer 214. In particular, the inorganic insulating films are preferably in contact with each other. This can inhibit entry of impurities into the display portion 162 from the outside through the organic insulating film. Consequently, the reliability of the display apparatus 100A can be enhanced.

For each of the substrate 151 and the substrate 152, glass, quartz, ceramics, sapphire, a resin, a metal, an alloy, a semiconductor, or the like can be used. The substrate on the side from which light from the light-emitting device is extracted is formed using a material that transmits the light. When the substrate 151 and the substrate 152 are formed using a flexible material, the flexibility of the display apparatus can be increased. Furthermore, a polarizing plate may be used as the substrate 151 or the substrate 152.

For each of the substrate 151 and the substrate 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a poly amide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 151 and the substrate 152.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer 142, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting device.

Examples of insulating materials that can be used for the insulating layers include a resin such as an acrylic resin or an epoxy resin, and an inorganic insulating material such as silicon oxide, silicon oxynitride, silicon nitride oxide, silicon nitride, or aluminum oxide.

[Display Apparatus 100B]

Figure 21:
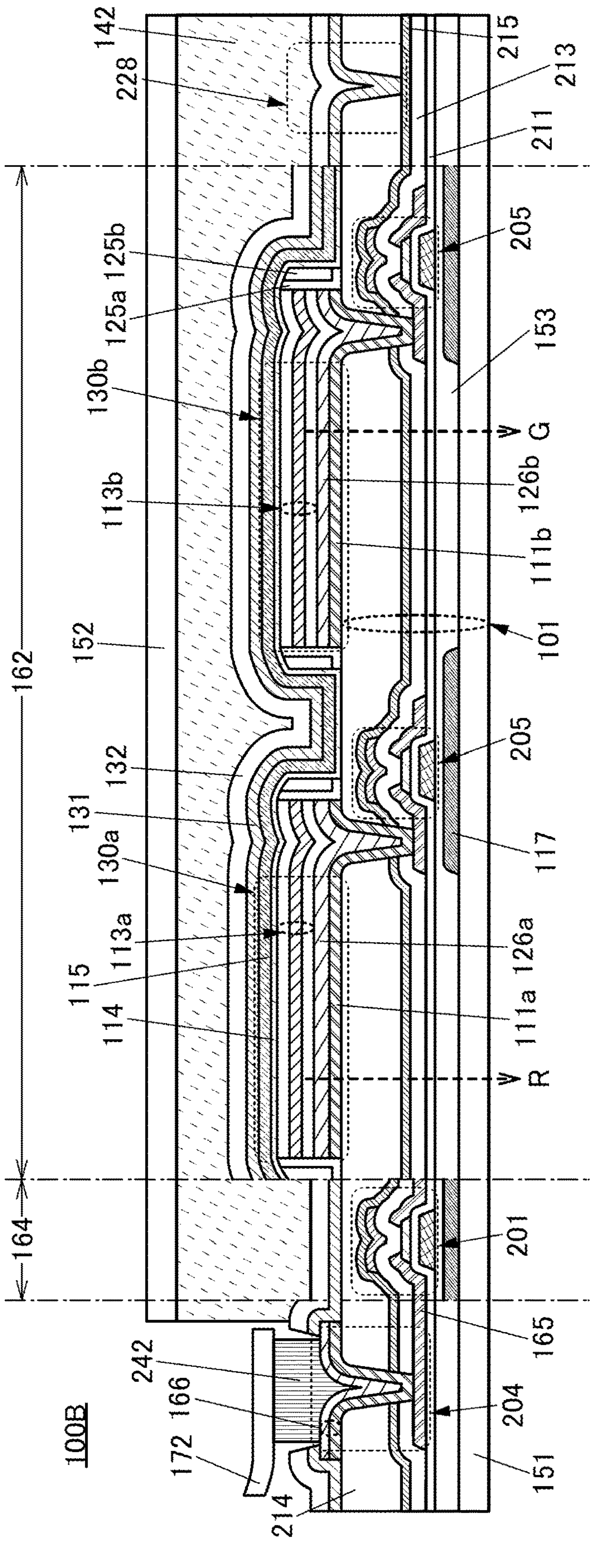
FIG. 21 is a cross-sectional view illustrating an example of a display apparatus.

A display apparatus 100B illustrated in FIG. 21 is different from the display apparatus 100A mainly in having a bottom-emission structure. Note that portions similar to those in the display apparatus 100A are not described.

Light from the light-emitting device is emitted toward the substrate 151 side. For the substrate 151, a material having a high visible-light-transmitting property is preferably used. By contrast, there is no limitation on the light-transmitting property of a material used for the substrate 152.

The light-blocking layer 117 is preferably formed between the substrate 151 and the transistor 201 and between the substrate 151 and the transistor 205. FIG. 21 illustrates an example in which the light-blocking layer 117 is provided over the substrate 151, an insulating layer 153 is provided over the light-blocking layer 117, and the transistors 201 and 205 and the like are provided over the insulating layer 153.

This embodiment can be combined with the other embodiments as appropriate.

Embodiment 4

In this embodiment, a display apparatus of one embodiment of the present invention is described with reference to FIG. 22 to FIG. 25.

The display apparatus in this embodiment can be a high-definition display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 22A:
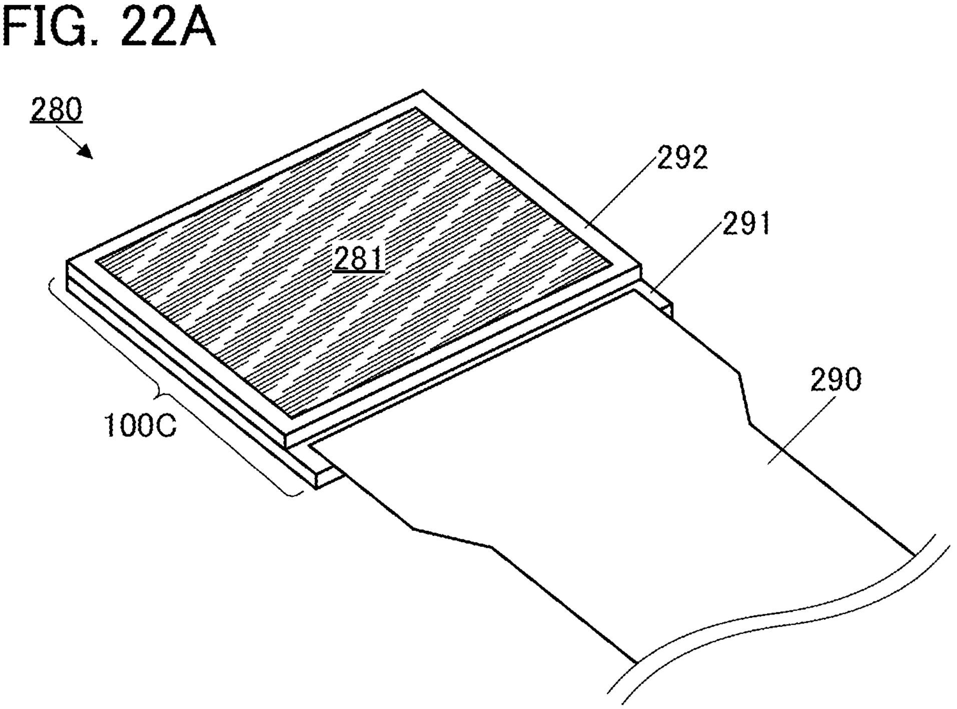
FIG. 22A and FIG. 22B are perspective views illustrating an example of a display module.

FIG. 22A is a perspective view of a display module 280. The display module 280 includes a display apparatus 100C and an FPC 290. Note that the display apparatus included in the display module 280 is not limited to the display apparatus 100C and may be any of a display apparatus 100D or a display apparatus 100E described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 22B:
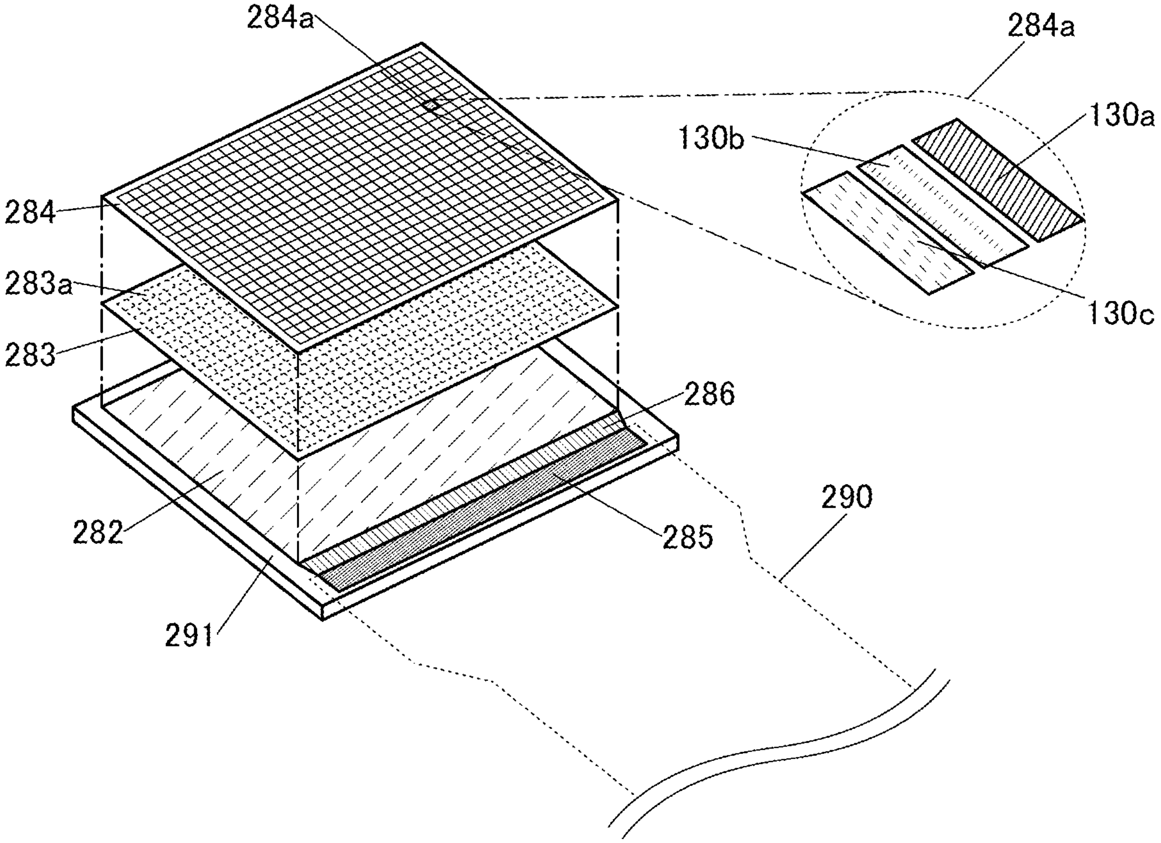

FIG. 22B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 22B. The pixel 284*a* includes the light-emitting devices 130*a*, 130*b*, and 130*c* that emit light of different colors from each other. The plurality of light-emitting devices can be arranged in a stripe pattern as illustrated in FIG. 22B. Alternatively, a variety of arrangement methods of light-emitting devices, such as a delta pattern or a PenTile pattern can be employed.

The pixel circuit portion 283 includes a plurality of pixel circuits 283*a* arranged periodically.

One pixel circuit 283*a* is a circuit that controls light emission of three light-emitting devices included in one pixel 284*a*. One pixel circuit 283*a* may be provided with three circuits each of which controls light emission of one light-emitting device. For example, the pixel circuit 283*a* can include at least one selection transistor, one current control transistor (driving transistor), and a capacitor for one light-emitting device. A gate signal is input to a gate of the selection transistor, and a source signal is input to one of a source and a drain of the selection transistor. With such a structure, an active-matrix display apparatus is achieved.

The circuit portion 282 includes a circuit for driving the pixel circuits 283*a* in the pixel circuit portion 283. For example, the circuit portion 282 preferably includes one or both of agate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high definition. For example, the pixels 284*a* are preferably arranged in the display portion 281 with a definition greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high definition, and thus can be suitably used for a VR device such as ahead-mounted display or a glasses-type AR device. For example, even with a structure in which the display portion of the display module 280 is seen through a lens, pixels of the extremely-high-definition display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Apparatus 100C]

Figure 23:
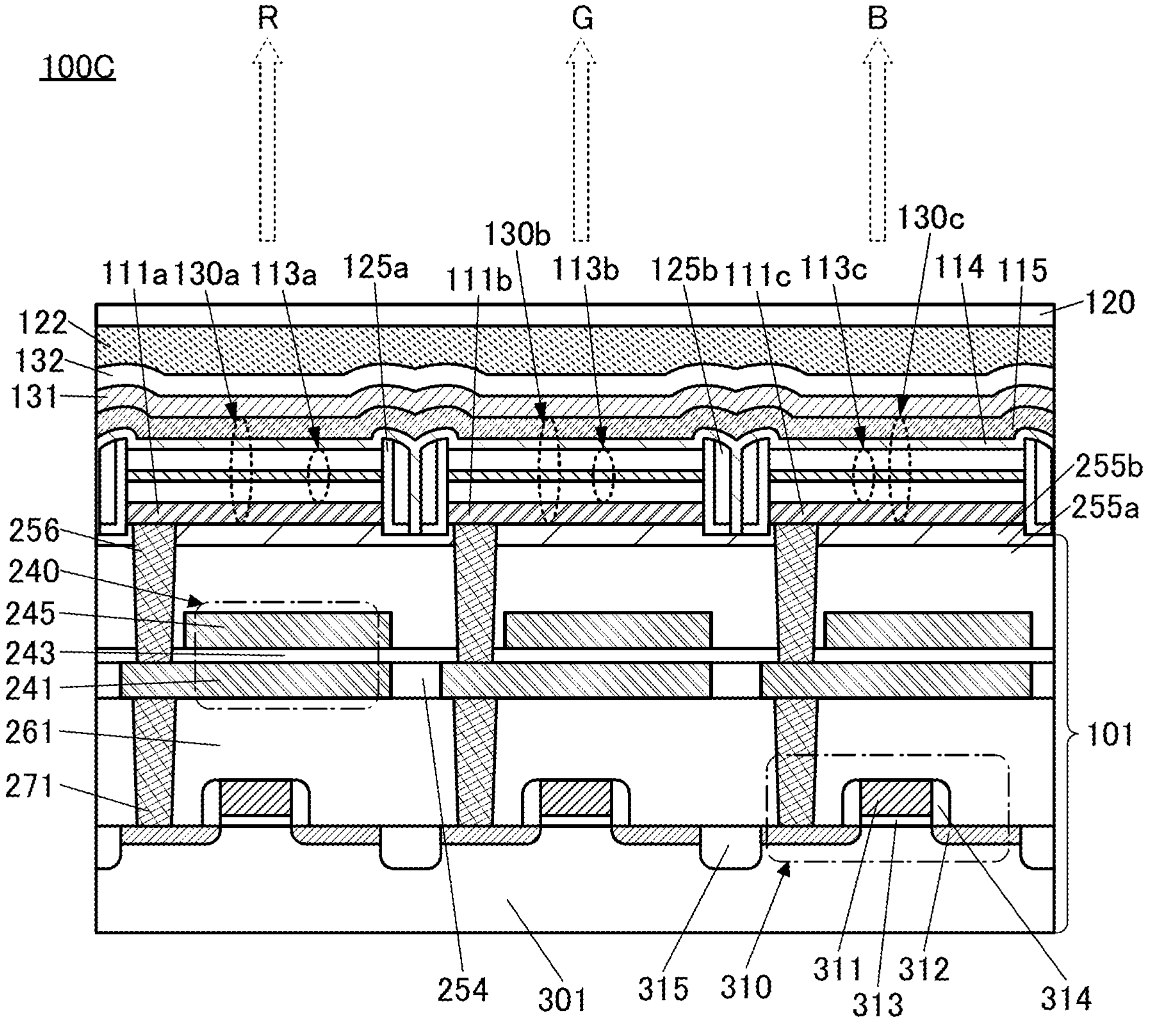
FIG. 23 is a cross-sectional view illustrating an example of a display apparatus.

The display apparatus 100C illustrated in FIG. 23 includes a substrate 301, the light-emitting devices 130*a*, 130*b*, and 130*c*, a capacitor 240, and a transistor 310.

The substrate 301 corresponds to the substrate 291 illustrated in FIG. 22A and FIG. 22B. A stacked-layer structure from the substrate 301 to an insulating layer 255*b* corresponds to the layer 101 including transistors in Embodiment 1.

The transistor 310 is a transistor whose channel formation region is in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as one of a source and a drain. The insulating layer 314 is provided to cover a side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255*a* is provided to cover the capacitor 240, the insulating layer 255*b* is provided over the insulating layer 255*a*, and the light-emitting devices 130*a*, 130*b*, and 130*c* and the like are provided over the insulating layer 255*b*. This embodiment shows an example in which the light-emitting devices 130*a*, 130*b*, and 130*c* have the same structure as the stacked-layer structure illustrated in FIG. 1B. Side surfaces of the pixel electrodes 111*a*, 111*b*, and 111*c*, the first layer 113*a*, the second layer 113*b*, and the third layer 113*c* are covered with the sidewalls 125*a* and 125*b*. The fifth layer 114 is provided over the first layer 113*a*, the second layer 113*b*, the third layer 113*c*, and the sidewalls 125*a* and 125*b*. The common electrode 115 is provided over the fifth layer 114. The protective layer 131 is provided over each of the light-emitting devices 130*a*, 130*b*, and 130*c*. The protective layer 132 is provided over the protective layer 131, and the substrate 120 is bonded to the protective layer 132 with the resin layer 122. Embodiment 1 can be referred to for details of the light-emitting devices and the components thereover up to the substrate 120. The substrate 120 corresponds to the substrate 292 illustrated in FIG. 22A.

As each of the insulating layers 255*a* and 255*b*, a variety of inorganic insulating films such as an oxide insulating film, a nitride insulating film, an oxynitride insulating film, and a nitride oxide insulating film can be suitably used. As the insulating layer 255*a*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferred that a silicon oxide film be used as the insulating layer 255*a* and a silicon nitride film be used as the insulating layer 255*b*. The insulating layer 255*b* preferably has a function of an etching protective film. Alternatively, a nitride insulating film or a nitride oxide insulating film may be used as the insulating layer 255*a*, and an oxide insulating film or an oxynitride insulating film may be used as the insulating layer 255*b*. Although this embodiment shows an example in which a depressed portion is provided in the insulating layer 255*b*, a depressed portion is not necessarily provided in the insulating layer 255*b*.

The pixel electrode of each of the light-emitting devices is electrically connected to one of the source and the drain of the transistor 310 through a plug 256 embedded in the insulating layers 255*a* and 255*b*, the conductive layer 241 embedded in the insulating layer 254, and the plug 271 embedded in the insulating layer 261. The top surface of the insulating layer 255*b* and the top surface of the plug 256 are level or substantially level with each other. Any of a variety of conductive materials can be used for the plugs.

[Display Apparatus 100D]

Figure 24:
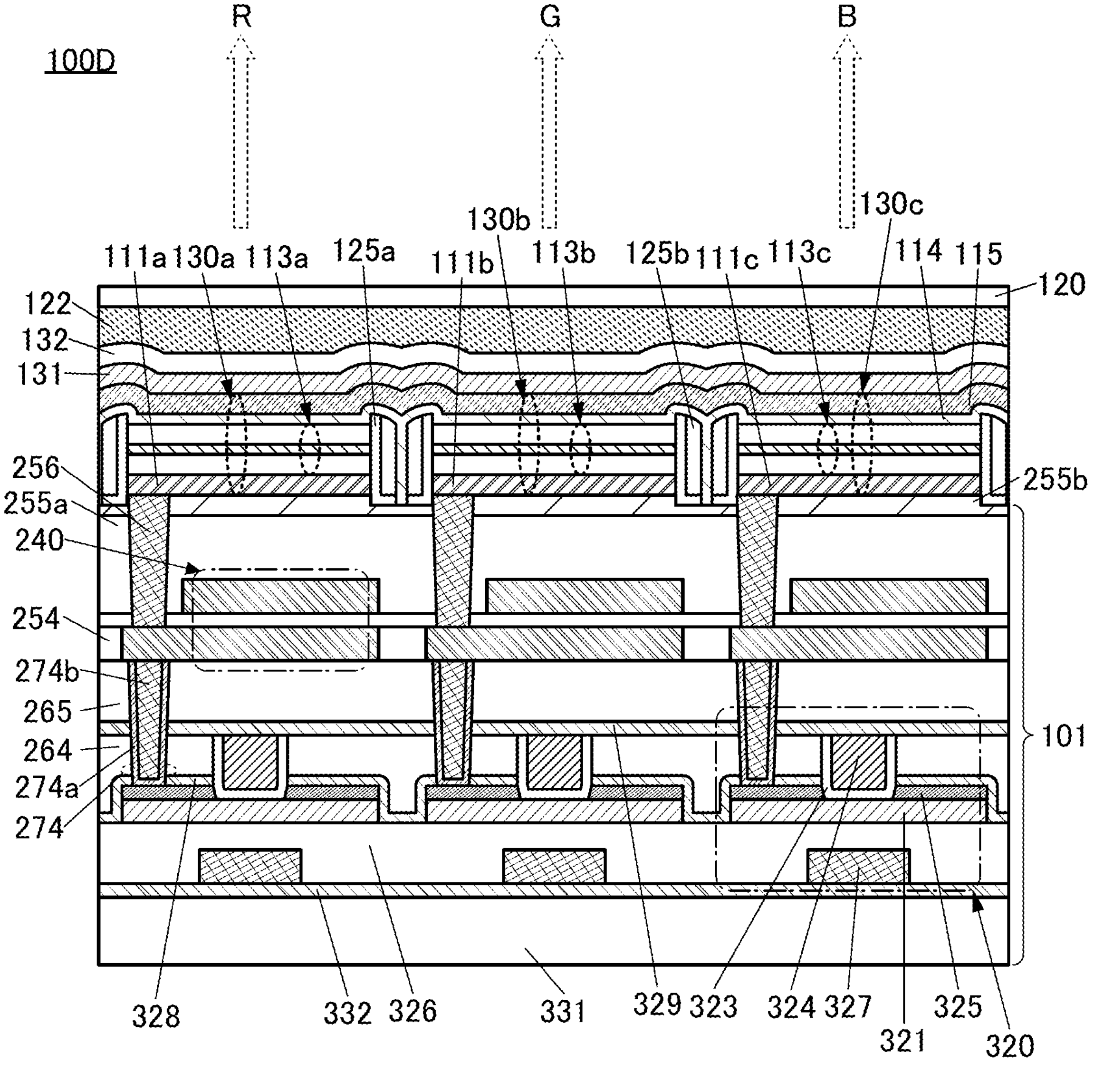
FIG. 24 is a cross-sectional view illustrating an example of a display apparatus.

The display apparatus 100D illustrated in FIG. 24 differs from the display apparatus 100C mainly in a structure of a transistor. Note that portions similar to those in the display apparatus 100C are not described in some cases.

The transistor 320 is a transistor that contains a metal oxide (also referred to as an oxide semiconductor) in a semiconductor layer where a channel is formed (i.e., an OS transistor).

The transistor 320 includes the semiconductor layer 321, the insulating layer 323, the conductive layer 324, the pair of conductive layers 325, the insulating layer 326, and the conductive layer 327.

The substrate 331 corresponds to the substrate 291 in FIG. 22A and FIG. 22B. A stacked-layer structure from the substrate 331 to the insulating layer 255*b* corresponds to the layer 101 including transistors in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as the first gate electrode of the transistor 320, and part of the insulating layer 326 functions as the first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a film of a metal oxide having semiconductor characteristics (also referred to as an oxide semiconductor). A material that can be suitably used for the semiconductor layer 321 is described in detail later.

The pair of conductive layers 325 is provided on and in contact with the semiconductor layer 321, and functions as a source electrode and a drain electrode.

The insulating layer 328 is provided to cover top and side surfaces of the pair of conductive layers 325, the side surface of the semiconductor layer 321, and the like, and the insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323, which is in contact with the side surfaces of the insulating layer 264, the insulating layer 328, and the conductive layer 325 and the top surface of the semiconductor layer 321, and the conductive layer 324 are embedded in the opening. The conductive layer 324 functions as the second gate electrode, and the insulating layer 323 functions as the second gate insulating layer.

The top surface of the conductive layer 324, the top surface of the insulating layer 323, and the top surface of the insulating layer 264 are planarized so that they are level or substantially level with each other, and the insulating layer 329 and the insulating layer 265 are provided to cover these layers.

The insulating layer 264 and the insulating layer 265 each function as an interlayer insulating layer. The insulating layer 329 functions as a barrier layer that prevents diffusion of impurities such as water or hydrogen from the insulating layer 265 or the like to the transistor 320. As the insulating layer 329, an insulating film similar to the insulating layer 328 and the insulating layer 332 can be used.

The plug 274 electrically connected to one of the pair of conductive layers 325 is provided to be embedded in the insulating layer 265, the insulating layer 329, and the insulating layer 264. Here, the plug 274 preferably includes the conductive layer 274*a* that covers side surfaces of openings formed in the insulating layer 265, the insulating layer 329, the insulating layer 264, and the insulating layer 328 and part of the top surface of the conductive layer 325, and the conductive layer 274*b* in contact with the top surface of the conductive layer 274*a*. For the conductive layer 274*a*, the conductive material in which hydrogen and oxygen are less likely to diffuse is preferably used.

The structure from the insulating layer 254 to the substrate 120 in the display apparatus 100D is similar to that in the display apparatus 100C.

[Display Apparatus 100E]

Figure 25:
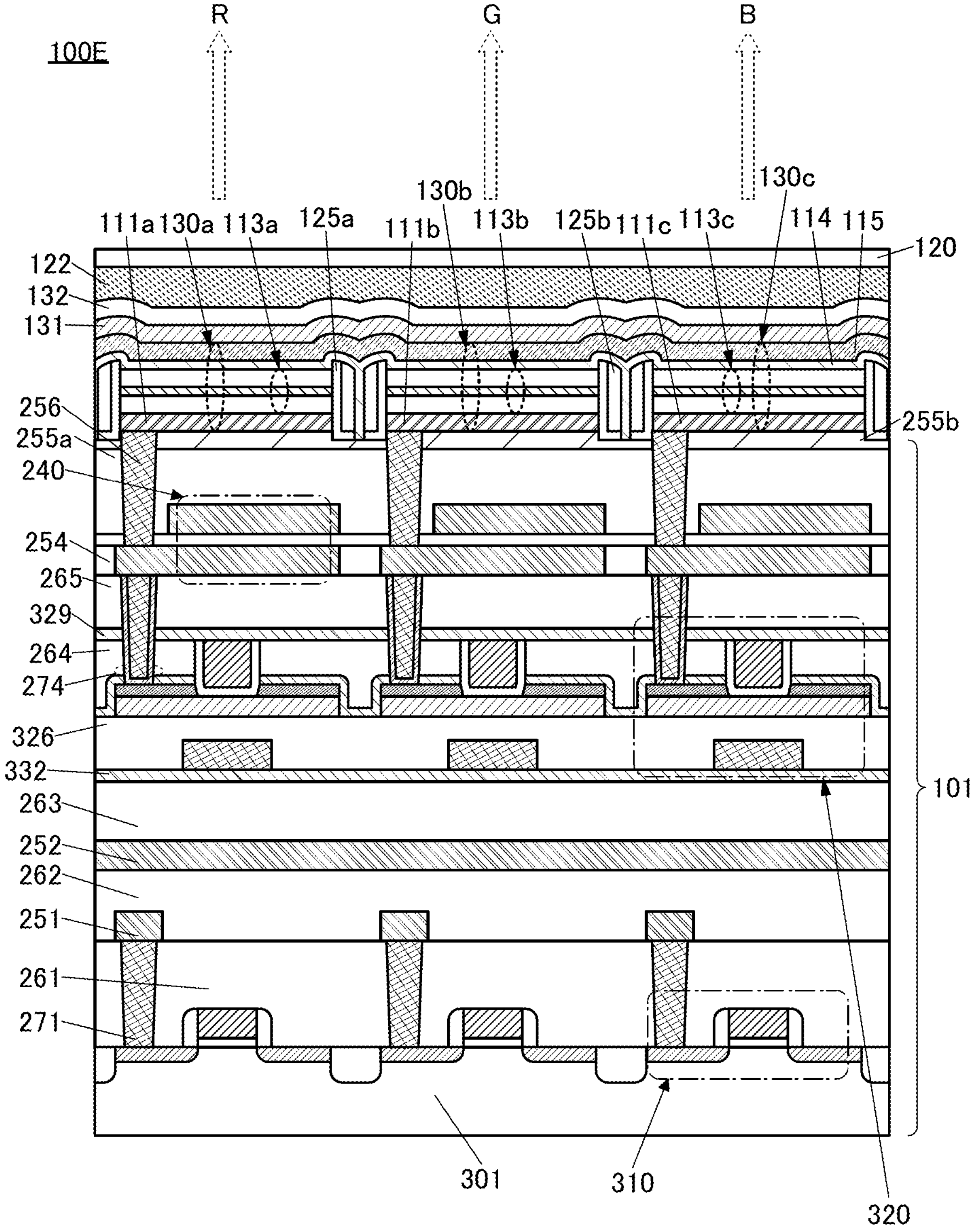
FIG. 25 is a cross-sectional view illustrating an example of a display apparatus.

The display apparatus 100E illustrated in FIG. 25 has a structure in which the transistor 310 having a channel formed in the substrate 301 and the transistor 320 including a metal oxide in a semiconductor layer where a channel is formed are stacked. Note that portions similar to those in the display apparatuses 100C and 100D are not described in some cases.

The insulating layer 261 is provided to cover the transistor 310, and the conductive layer 251 is provided over the insulating layer 261. The insulating layer 262 is provided to cover the conductive layer 251, and the conductive layer 252 is provided over the insulating layer 262. The conductive layer 251 and the conductive layer 252 each function as a wiring. The insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display region.

This embodiment can be combined with the other embodiments as appropriate.

Embodiment 5

In this embodiment, a structure example of a transistor that can be used in the display apparatus of one embodiment of the present invention will be described. Specifically, the case of using a transistor including silicon as a semiconductor where a channel is formed will be described.

One embodiment of the present invention is a display apparatus including a light-emitting device and a pixel circuit. For example, three kinds of light-emitting devices emitting light of red (R), green (G), and blue (B) are included, whereby a full-color display apparatus can be achieved.

Transistors containing silicon in their semiconductor layers where channels are formed are preferably used as all transistors included in the pixel circuit for driving the light-emitting device. As silicon, single crystal silicon, polycrystalline silicon, amorphous silicon, and the like can be given. In particular, a transistor containing low-temperature polysilicon (LTPS) in its semiconductor layer (hereinafter also referred to as an LTPS transistor) is preferably used. The LTPS transistor has high field-effect mobility and favorable frequency characteristics.

With the use of transistors containing silicon, such as LTPS transistors, a circuit required to be driven at a high frequency (e.g., a source driver circuit) can be formed on the same substrate as the display portion. Thus, external circuits mounted on the display apparatus can be simplified, whereby parts costs and mounting costs can be reduced.

It is preferable to use transistors including a metal oxide (hereinafter also referred to as an oxide semiconductor) in their semiconductor layers where channels are formed (such transistors are hereinafter also referred to as OS transistors) as at least one of the transistors included in the pixel circuit. An OS transistor has extremely higher field-effect mobility than amorphous silicon. In addition, the OS transistor has an extremely low leakage current between a source and a drain in an off state (hereinafter, also referred to as off-state current), and charge accumulated in a capacitor that is connected in series to the transistor can be retained for a long period. Furthermore, power consumption of the display apparatus can be reduced with the use of an OS transistor.

When an LTPS transistor is used as one or more of the transistors included in the pixel circuit and an OS transistor is used as the rest, a display apparatus with low power consumption and high driving capability can be achieved. As a more preferable example, it is preferable to use an OS transistor as, for example, a transistor functioning as a switch for controlling electrical continuity between wirings and an LTPS transistor as, for example, a transistor for controlling current.

For example, one of the transistors included in the pixel circuit functions as a transistor for controlling current flowing through the light-emitting device and can be referred to as a driving transistor. One of a source and a drain of the driving transistor is electrically connected to the pixel electrode of the light-emitting device. An LTPS transistor is preferably used as the driving transistor. In this case, the amount of current flowing through the light-emitting device can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

More specific structure examples are described below with reference to drawings.

Structure Example 2 of Display Apparatus

Figure 26A:
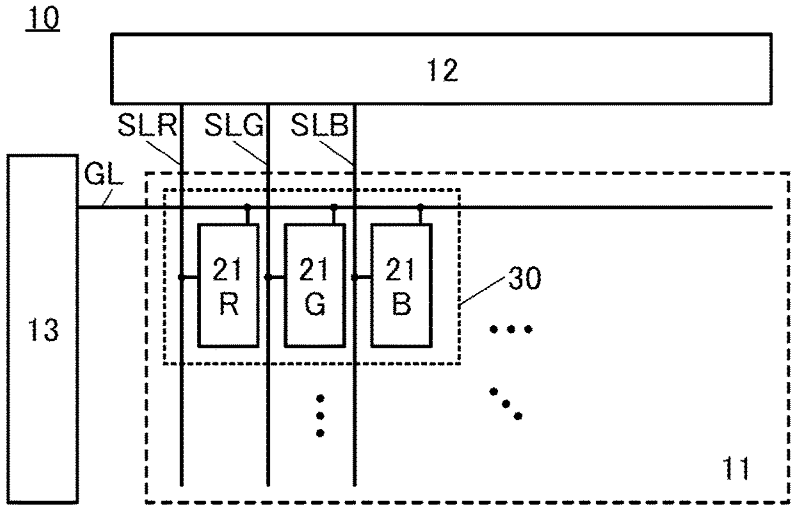
FIG. 26A is a block diagram illustrating an example of a display apparatus.

FIG. 26A illustrates a block diagram of a display apparatus 10. The display apparatus 10 includes a display portion 11, a driver circuit portion 12, a driver circuit portion 13, and the like.

The display portion 11 includes a plurality of pixels 30 arranged in a matrix. The pixels 30 each include a subpixel 21R, a subpixel 21G, and a subpixel 21B. The subpixel 21R, the subpixel 21G, and the subpixel 21B each include a light-emitting device functioning as a display device.

The pixel 30 is electrically connected to a wiring GL, a wiring SLR, a wiring SLG, and a wiring SLB. The wiring SLR, the wiring SLG, and the wiring SLB are electrically connected to the driver circuit portion 12. The wiring GL is electrically connected to the driver circuit portion 13. The driver circuit portion 12 functions as a source line driver circuit (also referred to as a source driver), and the driver circuit portion 13 functions as a gate line driver circuit (also referred to as a gate driver). The wiring GL functions as a gate line, and the wiring SLR, the wiring SLG, and the wiring SLB each function as a source line.

The subpixel 21R includes alight-emitting device emitting red light. The subpixel 21G includes a light-emitting device emitting green light. The subpixel 21B includes a light-emitting device emitting blue light. Thus, the display apparatus 10 can perform full-color display. Note that the pixel 30 may include a subpixel including a light-emitting device emitting light of another color. For example, the pixel 30 may include, in addition to the three subpixels, a subpixel including a light-emitting device emitting white light, a subpixel including a light-emitting device emitting yellow light, or the like.

The wiring GL is electrically connected to the subpixel 21R, the subpixel 21G, and the subpixel 21B arranged in a row direction (an extending direction of the wiring GL). The wiring SLR, the wiring SLG, and the wiring SLB are electrically connected to the subpixels 21R, the subpixels 21G, and the subpixels 21B (not illustrated) arranged in a column direction (an extending direction of the wiring SLR and the like), respectively.

[Structure Example of Pixel Circuit]

Figure 26B:
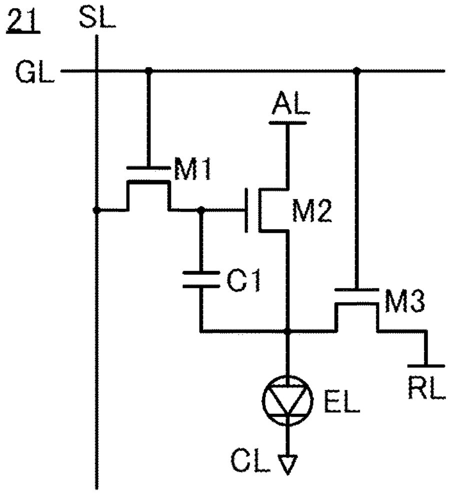
FIG. 26B to FIG. 26D are diagrams illustrating examples of a pixel circuit.

FIG. 26B illustrates an example of a circuit diagram of a pixel 21 that can be used as the subpixel 21R, the subpixel 21G, and the subpixel 21B. The pixel 21 includes a transistor M1, a transistor M2, a transistor M3, a capacitor C1, and a light-emitting device EL. The wiring GL and a wiring SL are electrically connected to the pixel 21. The wiring SL corresponds to any of the wiring SLR, the wiring SLG, and the wiring SLB illustrated in FIG. 26A.

A gate of the transistor M1 is electrically connected to the wiring GL, one of a source and a drain of the transistor M1 is electrically connected to the wiring SL, and the other thereof is electrically connected to one electrode of the capacitor C1 and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting device EL is electrically connected to a wiring CL.

A data potential is supplied to the wiring SL. A selection signal is supplied to the wiring GL. The selection signal includes a potential for bringing a transistor into a conducting state and a potential for bringing a transistor into a non-conducting state.

A reset potential is supplied to the wiring RL. An anode potential is supplied to the wiring AL. A cathode potential is supplied to the wiring CL. In the pixel 21, the anode potential is a potential higher than the cathode potential. The reset potential supplied to the wiring RL can be set such that a potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistor M1 and the transistor M3 each function as a switch. For example, the transistor M2 functions as a transistor for controlling current flowing through the light-emitting device EL. For example, it can be said that the transistor M1 functions as a selection transistor and the transistor M2 functions as a driving transistor.

Here, it is preferable to use LTPS transistors as all of the transistor M1 to the transistor M3. Alternatively, it is preferable to use OS transistors as the transistor M1 and the transistor M3 and to use an LTPS transistor as the transistor M2.

Alternatively, OS transistors may be used as all of the transistor M1 to the transistor M3. In this case, an LTPS transistor can be used as at least one of a plurality of transistors included in the driver circuit portion 12 and a plurality of transistors included in the driver circuit portion 13, and OS transistors can be used as the other transistors. For example, OS transistors can be used as the transistors provided in the display portion 11, and LTPS transistors can be used as the transistors provided in the driver circuit portion 12 and the driver circuit portion 13.

A transistor using an oxide semiconductor having a wider band gap and a lower carrier concentration than silicon can achieve an extremely low off-state current. Thus, such a low off-state current enables long-term retention of electric charge accumulated in a capacitor that is connected to the transistor in series. Therefore, it is particularly preferable to use a transistor including an oxide semiconductor as the transistor M1 and the transistor M3 each of which is connected to the capacitor C1 in series. The use of the transistor including an oxide semiconductor as each of the transistor M1 and the transistor M3 can prevent leakage of charge retained in the capacitor C1 through the transistor M1 or the transistor M3. Furthermore, since charge retained in the capacitor C1 can be retained for a long time, a still image can be displayed for a long time without rewriting data in the pixel 21.

Note that although the transistor is illustrated as an n-channel transistor in FIG. 26B, a p-channel transistor can also be used.

The transistors included in the pixel 21 are preferably formed to be arranged over the same substrate.

Note that transistors each including a pair of gates overlapping with each other with a semiconductor layer therebetween can be used as the transistors included in the pixel 21.

In the transistor including a pair of gates, the same potential is supplied to the pair of gates electrically connected to each other, which brings advantage that the transistor can have a higher on-state current and improved saturation characteristics. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 26C:
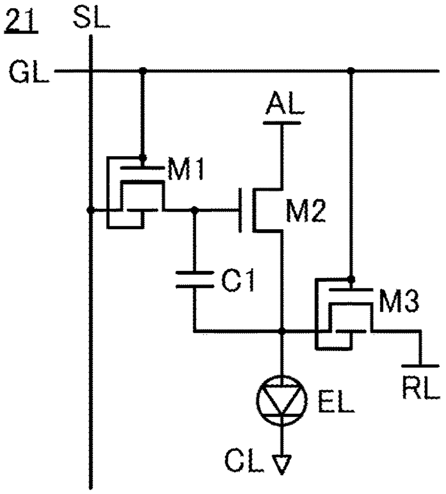

The pixel 21 illustrated in FIG. 26C is an example where a transistor including a pair of gates is used as each of the transistor M1 and the transistor M3. In each of the transistor M1 and the transistor M3, the pair of gates are electrically connected each other. Such a structure can shorten the period in which data is written to the pixel 21.

Figure 26D:
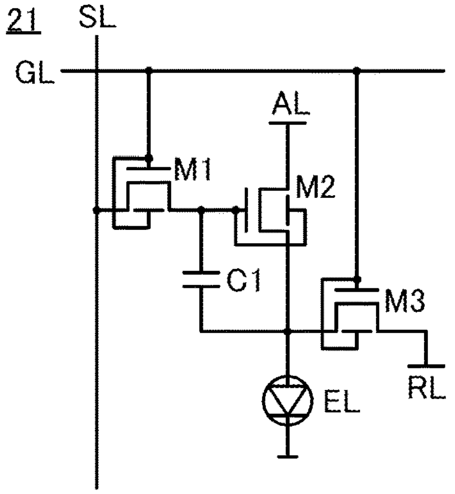

The pixel 21 illustrated in FIG. 26D is an example where a transistor including a pair of gates is used as the transistor M2 in addition to the transistor M1 and the transistor M3. A pair of gates of the transistor M2 are electrically connected to each other. When such a transistor is used as the transistor M2, the saturation characteristics are improved, whereby emission luminance of the light-emitting device EL can be controlled easily and the display quality can be increased.

[Structure Example of Transistor]

Cross-sectional structure examples of a transistor that can be used in the display apparatus described above are described below.

Structure Example 1

Figure 27A:
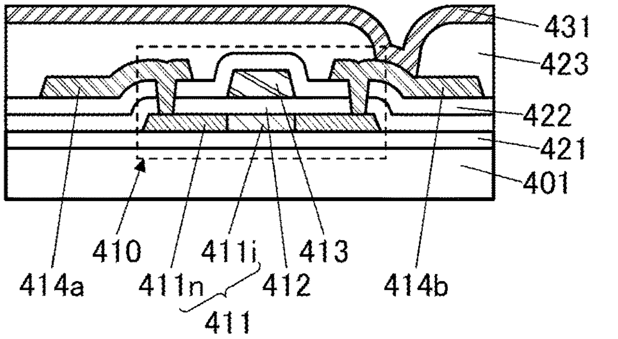
FIG. 27A to FIG. 27D are diagrams illustrating examples of a transistor.

FIG. 27A is a cross-sectional view including a transistor 410. The transistor 410 is provided over a substrate 401 and contains polycrystalline silicon in its semiconductor layer. For example, the transistor 410 corresponds to the transistor M2 in the pixel 21. In other words, FIG. 27A illustrates an example in which one of a source and a drain of the transistor 410 is electrically connected to a conductive layer 431 of the light-emitting device.

The transistor 410 includes a semiconductor layer 411, an insulating layer 412, a conductive layer 413, and the like. The semiconductor layer 411 includes a channel formation region 411*i* and low-resistance regions 411*n*. The semiconductor layer 411 contains silicon. The semiconductor layer 411 preferably contains polycrystalline silicon. Part of the insulating layer 412 functions as agate insulating layer. Part of the conductive layer 413 functions as agate electrode.

Note that the semiconductor layer 411 can include a metal oxide exhibiting semiconductor characteristics (also referred to as an oxide semiconductor). In this case, the transistor 410 can be referred to as an OS transistor.

The low-resistance region 411*n* is a region containing an impurity element. For example, in the case where the transistor 410 is an n-channel transistor, phosphorus, arsenic, or the like is added to the low-resistance region 411*n*. Meanwhile, in the case where the transistor 410 is a p-channel transistor, boron, aluminum, or the like is added to the low-resistance region 411*n*. In addition, in order to control the threshold voltage of the transistor 410, the above-described impurity may be added to the channel formation region 411*i*.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided at a position that is over the insulating layer 412 and overlaps with the semiconductor layer 411.

An insulating layer 422 is provided to cover the conductive layer 413 and the insulating layer 412. A conductive layer 414*a* and a conductive layer 414*b* are provided over the insulating layer 422. The conductive layer 414*a* and the conductive layer 414*b* are each electrically connected to the low-resistance region 411*n* in the opening portion provided in the insulating layer 422 and the insulating layer 412. Part of the conductive layer 414*a* functions as one of a source electrode and a drain electrode and part of the conductive layer 414*b* functions as the other of the source electrode and the drain electrode. An insulating layer 423 is provided to cover the conductive layer 414*a*, and the conductive layer 414*b*, and the insulating layer 422.

The conductive layer 431 functioning as a pixel electrode is provided over the insulating layer 423. The conductive layer 431 is provided over the insulating layer 423 and is electrically connected to the conductive layer 414*b* through an opening provided in the insulating layer 423. Although not illustrated here, an EL layer and a common electrode can be stacked over the conductive layer 431.

Structure Example 2

Figure 27B:
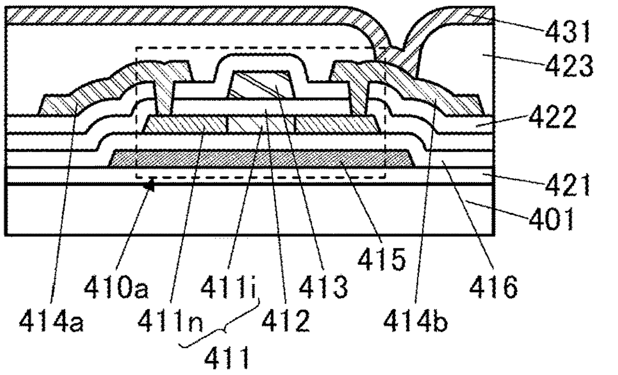

FIG. 27B illustrates a transistor 410*a* including a pair of gate electrodes. The transistor 410*a* illustrated in FIG. 27B is different from FIG. 27A mainly in including a conductive layer 415 and an insulating layer 416.

The conductive layer 415 is provided over the insulating layer 421. The insulating layer 416 is provided to cover the conductive layer 415 and the insulating layer 421. The semiconductor layer 411 is provided such that at least the channel formation region 411*i* overlaps with the conductive layer 415 with the insulating layer 416 therebetween.

In the transistor 410*a* illustrated in FIG. 27B, part of the conductive layer 413 functions as a first gate electrode, and part of the conductive layer 415 functions as a second gate electrode. At this time, part of the insulating layer 412 functions as a first gate insulating layer, and part of the insulating layer 416 functions as a second gate insulating layer.

Here, to electrically connect the first gate electrode to the second gate electrode, the conductive layer 413 is electrically connected to the conductive layer 415 through an opening portion provided in the insulating layer 412 and the insulating layer 416 in a region not illustrated. To electrically connect the second gate electrode to a source or a drain, the conductive layer 415 is electrically connected to the conductive layer 414*a* or the conductive layer 414*b* through an opening portion provided in the insulating layer 422, the insulating layer 412, and the insulating layer 416 in a region not illustrated.

In the case where LTPS transistors are used as all of the transistors included in the pixel 21, the transistor 410 illustrated in FIG. 27A as an example or the transistor 410*a* illustrated in FIG. 27B as an example can be used. In this case, the transistors 410*a* may be used as all of the transistors included in the pixels 21, the transistors 410 may be used as all of the transistors, or the transistors 410*a* and the transistors 410 may be used in combination.

Structure Example 3

Described below is an example of a structure including both a transistor containing silicon in its semiconductor layer and a transistor containing a metal oxide in its semiconductor layer.

Figure 27C:
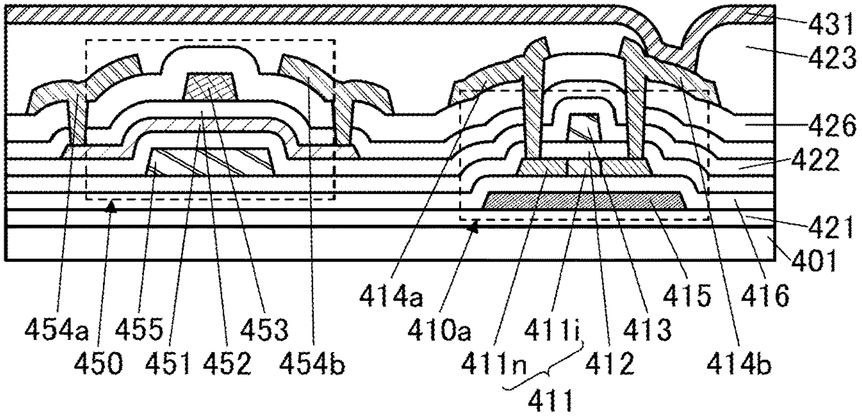

FIG. 27C is a schematic cross-sectional view including the transistor 410*a* and a transistor 450.

Structure example 1 described above can be referred to for the transistor 410*a*. Although an example using the transistor 410*a* is illustrated here, a structure including the transistor 410 and the transistor 450 or a structure including all the transistor 410, the transistor 410*a*, and the transistor 450 may alternatively be employed.

The transistor 450 is a transistor including metal oxide in its semiconductor layer. The structure in FIG. 27C illustrates an example in which the transistor 450 corresponds to the transistor M1 in the pixel 21 and the transistor 410*a* corresponds to the transistor M2. That is, FIG. 27C illustrates an example in which one of a source and a drain of the transistor 410*a* is electrically connected to the conductive layer 431.

Moreover, FIG. 27C illustrates an example in which the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping with the semiconductor layer 451 and the conductive layer 455.

An insulating layer 426 is provided to cover the insulating layer 452 and the conductive layer 453. A conductive layer 454*a* and a conductive layer 454*b* are provided over the insulating layer 426. The conductive layer 454*a* and the conductive layer 454*b* are electrically connected to the semiconductor layer 451 in openings provided in the insulating layer 426 and the insulating layer 452. Part of the conductive layer 454*a* functions as one of a source electrode and a drain electrode and part of the conductive layer 454*b* functions as the other of the source electrode and the drain electrode. The insulating layer 423 is provided to cover the conductive layer 454*a*, the conductive layer 454*b*, and the insulating layer 426.

Here, the conductive layer 414*a* and the conductive layer 414*b* electrically connected to the transistor 410*a* are preferably formed by processing the same conductive film as the conductive layer 454*a* and the conductive layer 454*b*. In FIG. 27C, the conductive layer 414*a*, the conductive layer 414*b*, the conductive layer 454*a*, and the conductive layer 454*b* are formed on the same plane (i.e., in contact with the top surface of the insulating layer 426) and contain the same metal element. In this case, the conductive layer 414*a* and the conductive layer 414*b* are electrically connected to the low-resistance regions 411*n* through openings provided in the insulating layer 426, the insulating layer 452, the insulating layer 422, and the insulating layer 412. This is preferable because the manufacturing process can be simplified.

Moreover, the conductive layer 413 functioning as the first gate electrode of the transistor 410*a* and the conductive layer 455 functioning as the second gate electrode of the transistor 450 are preferably formed by processing the same conductive film. FIG. 27C illustrates a structure where the conductive layer 413 and the conductive layer 455 are formed on the same plane (i.e., in contact with the top surface of the insulating layer 412) and contain the same metal element. This is preferable because the fabrication process can be simplified.

Figure 27D:
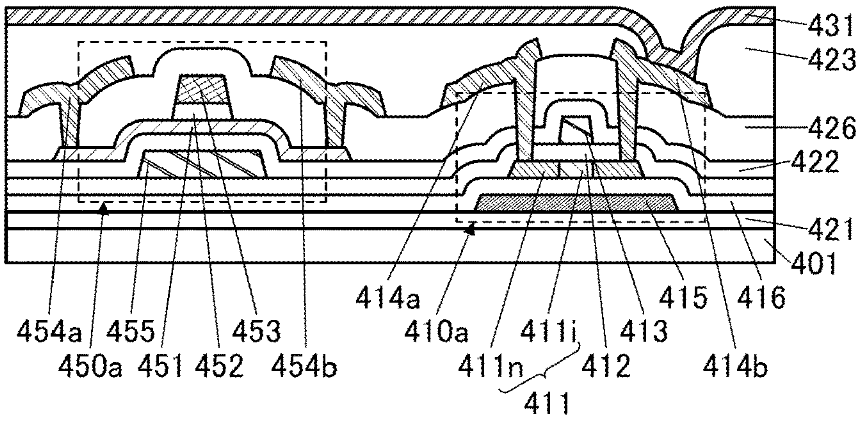

In the structure in FIG. 27C, the insulating layer 452 functioning as the first gate insulating layer of the transistor 450 covers an end portion of the semiconductor layer 451; however, the insulating layer 452 may be processed to have the same or substantially the same top surface shape as the conductive layer 453 as in the transistor 450*a* illustrated in FIG. 27D.

Note that in this specification and the like, the expression "top surface shapes are substantially the same" means that at least outlines of stacked layers partly overlap with each other. For example, the case of processing the upper layer and the lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such cases are also represented by the expression "top surface shapes are substantially the same".

Although the example in which the transistor 410*a* corresponds to the transistor M2 and is electrically connected to the pixel electrode is shown here, one embodiment of the present invention is not limited thereto. For example, a structure in which the transistor 450 or the transistor 450*a* corresponds to the transistor M2 may be employed. In that case, the transistor 410*a* corresponds to the transistor M1, the transistor M3, or another transistor.

This embodiment can be combined with the other embodiments as appropriate.

Embodiment 6

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC- OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS. Moreover, the second region has [Ga] higher than that in the composition of the CAC-OS. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using the CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

This embodiment can be combined with the other embodiments as appropriate.

Embodiment 7

In this embodiment, electronic devices of one embodiment of the present invention are described with reference to FIG. 28 to FIG. 32.

An electronic device of this embodiment is provided with the display apparatus of one embodiment of the present invention in a display portion. The display apparatus of one embodiment of the present invention can be easily increased in definition and resolution. Thus, the display apparatus of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device in addition to electronic devices with a relatively large screen, such as a television device, a desktop or laptop personal computer, a monitor of a computer or the like, digital signage, and a large game machine like a pachinko machine.

In particular, a display apparatus of one embodiment of the present invention can have a high definition, and thus can be favorably used for an electronic device having a relatively small display portion. Examples of such an electronic device include a watch-type or a bracelet-type information terminal device (wearable device), and a wearable device worn on a head, such as a device for VR such as a head mounted display, a glasses-type device for AR, and a device for MR.

The resolution of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, the resolution is preferably 4K, 8K, or higher. Furthermore, the pixel density (definition) of the display apparatus of one embodiment of the present invention is preferably higher than or equal to 100 ppi, higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With the use of such a display apparatus with one or both of high resolution and high definition, the electronic device can have higher realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices are described with reference to FIG. 28A, FIG. 28B, FIG. 29A, and FIG. 29B. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

Figure 28A:
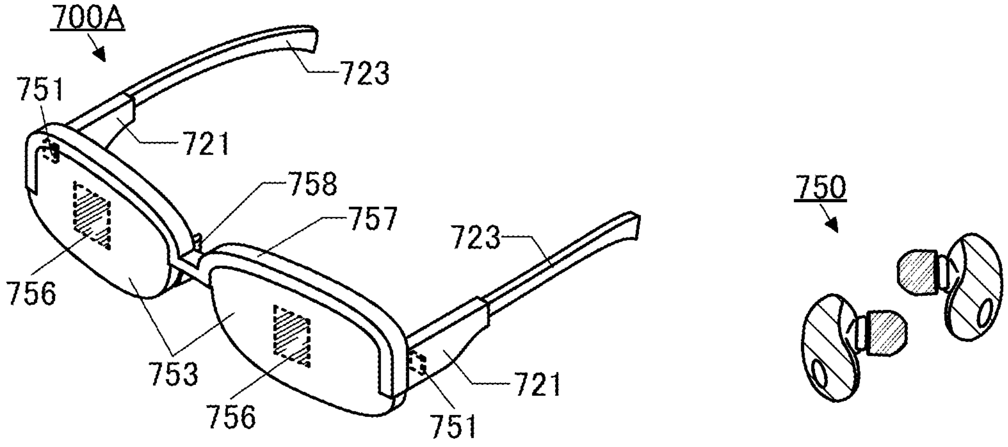
FIG. 28A and FIG. 28B are diagrams illustrating examples of electronic devices.
Figure 28B:
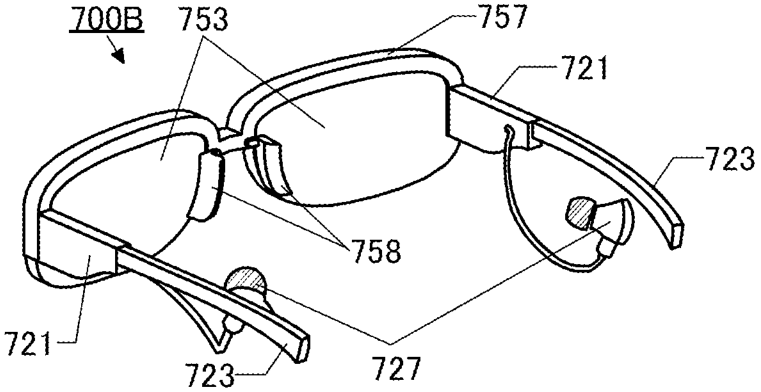

An electronic device 700A illustrated in FIG. 28A and an electronic device 700B illustrated in FIG. 28B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display apparatus of one embodiment of the present invention can be used for the display panel 751. Thus, the electronic device can perform display with extremely high definition.

The electronic device 700A and the electronic device 700B can each project an image displayed on the display panel 751 onto display regions 756 of the optical members 753. Since the optical members 753 have a light-transmitting property, a user can see images displayed on the display regions, which are superimposed on transmission images seen through the optical members 753. Accordingly, the electronic device 700A and the electronic device 700B are electronic devices capable of AR display.

In the electronic device 700A and the electronic device 700B, a camera capable of capturing images of the front side may be provided as the image capturing portion. Furthermore, when the electronic device 700A and the electronic device 700B are provided with an acceleration sensor such as a gyroscope sensor, the orientation of the user's head can be sensed and an image corresponding to the orientation can be displayed on the display region 756.

The communication portion includes a wireless communication device, and a video signal and the like can be supplied by the wireless communication device. Note that instead of or in addition to the wireless communication device, a connector to which a cable for supplying a video signal and a power supply potential can be connected may be provided.

The electronic device 700A and the electronic device 700B are provided with a battery so that they can be charged wirelessly and/or by wire.

A touch sensor module may be provided in the housing 721. The touch sensor module has a function of detecting a touch on the outer surface of the housing 721. A tap operation or a slide operation, for example, by the user can be detected with the touch sensor module, whereby a variety of processing can be executed. For example, processing such as a pause or a restart of a moving image can be executed by a tap operation, and processing such as fast forward and fast rewind can be executed by a slide operation. The touch sensor module is provided in each of the two housings 721, whereby the range of the operation can be increased.

A variety of touch sensors can be applied to the touch sensor module. Any of touch sensors of various types such as a capacitive type, a resistive type, an infrared type, an electromagnetic induction type, a surface acoustic wave type, and an optical type can be employed. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 29A:
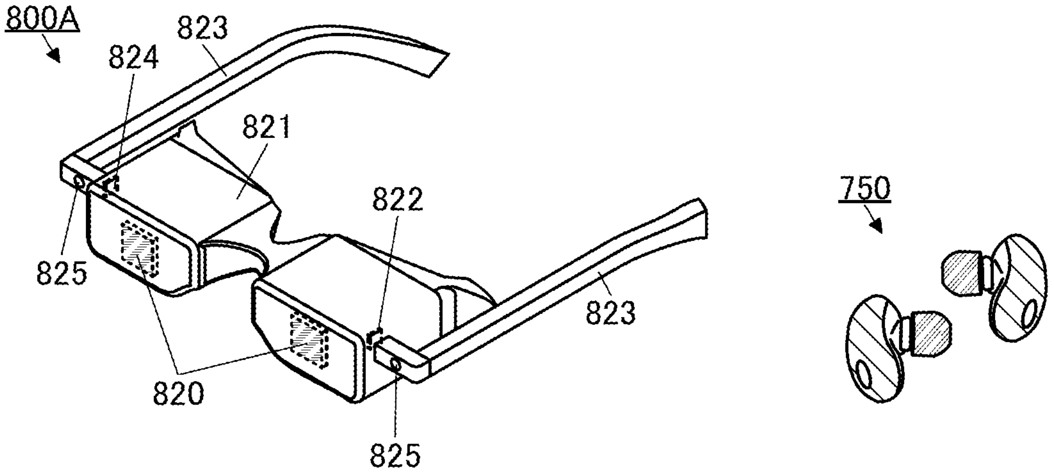
FIG. 29A and FIG. 29B are diagrams illustrating examples of electronic devices.
Figure 29B:
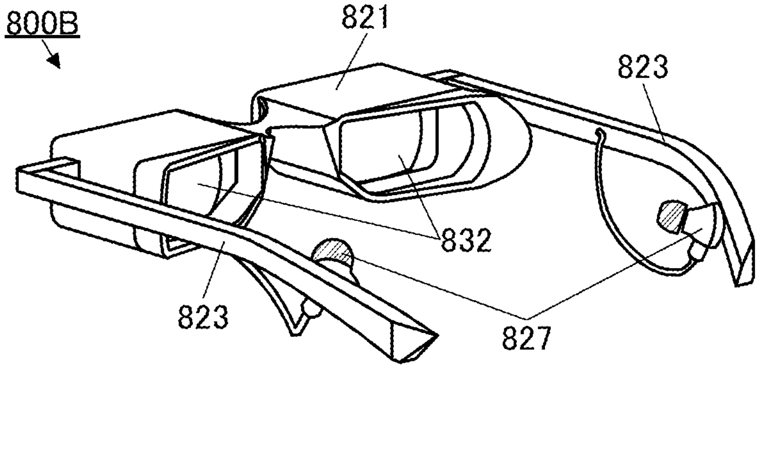

An electronic device 800A illustrated in FIG. 29A and an electronic device 800B illustrated in FIG. 29B each include a pair of display portions 820, a housing 821, a communication portion 822, a pair of wearing portions 823, a control portion 824, a pair of image capturing portions 825, and a pair of lenses 832.

A display apparatus of one embodiment of the present invention can be used in the display portions 820. Thus, the electronic device can perform display with extremely high definition. This enables a user to feel high sense of immersion.

The display portions 820 are positioned inside the housing 821 so as to be seen through the lenses 832. When the pair of display portions 820 display different images, three-dimensional display using parallax can be performed.

The electronic device 800A and the electronic device 800B can be regarded as electronic devices for VR. The user who wears the electronic device 800A or the electronic device 800B can see images displayed on the display portions 820 through the lenses 832.

The electronic device 800A and the electronic device 800B preferably include a mechanism for adjusting the lateral positions of the lenses 832 and the display portions 820 so that the lenses 832 and the display portions 820 are positioned optimally in accordance with the positions of the user's eyes. Moreover, the electronic device 800A and the electronic device 800B preferably include a mechanism for adjusting focus by changing the distance between the lenses 832 and the display portions 820.

The electronic device 800A or the electronic device 800B can be mounted on the user's head with the wearing portions 823. FIG. 29A or the like illustrates an example in which the wearing portion 823 has a shape like a temple (also referred to as a joint or the like) of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example of including the image capturing portion 825 is described here, a range sensor (hereinafter, also referred to as a sensing portion) that is capable of measuring a distance from an object may be provided. That is, the image capturing portion 825 is one embodiment of the sensing portion. As the sensing portion, an image sensor or a distance image sensor such as LIDAR (Light Detection and Ranging) can be used, for example. With the use of images obtained by the camera and images obtained by the distance image sensor, more pieces of information can be obtained and a gesture operation with higher accuracy is possible.

The electronic device 800A may include a vibration mechanism that functions as bone-conduction earphones. For example, a structure including the vibration mechanism can be applied to any one or more of the display portion 820, the housing 821, and the wearing portion 823. Thus, without additionally requiring an audio device such as headphones, earphones, or a speaker, the user can enjoy video and sound only by wearing the electronic device 800A.

The electronic device 800A and the electronic device 800B may each include an input terminal. To the input terminal, a cable for supplying a video signal from a video output device or the like, electric power for charging a battery provided in the electronic device, and the like can be connected.

The electronic device of one embodiment of the present invention may have a function of performing wireless communication with earphones 750. The earphones 750 include a communication portion (not illustrated) and have a wireless communication function. The earphones 750 can receive information (e.g., audio data) from the electronic device with the wireless communication function. For example, the electronic device 700A illustrated in FIG. 28A has a function of transmitting information to the earphones 750 with the wireless communication function. As another example, the electronic device 800A illustrated in FIG. 29A has a function of transmitting information to the earphones 750 with the wireless communication function.

The electronic device may include an earphone portion. The electronic device 700B illustrated in FIG. 28B includes earphone portions 727. For example, a structure in which the earphone portions 727 and the control portion are connected to each other by wire may be employed. Part of a wiring that connects the earphone portions 727 and the control portion may be positioned inside the housing 721 or the wearing portion 723.

Similarly, the electronic device 800B illustrated in FIG. 29B includes earphone portions 827. For example, a structure in which the earphone portions 827 and the control portion 824 are connected to each other by wire may be employed. Part of a wiring that connects the earphone portions 827 and the control portion 824 may be positioned inside the housing 821 or the wearing portion 823. The earphone portions 827 and the wearing portion 823 may include magnets. This is preferable because the earphone portions 827 can be fixed to the wearing portion 823 with magnetic force and thus can be easily housed.

Note that the electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic device 700A and the electronic device 700B) and the goggles-type device (e.g., the electronic device 800A and the electronic device 800B) are preferable as the electronic device of one embodiment of the present invention.

The electronic device of one embodiment of the present invention can transmit information to earphones by wire or wirelessly.

Figure 30A:
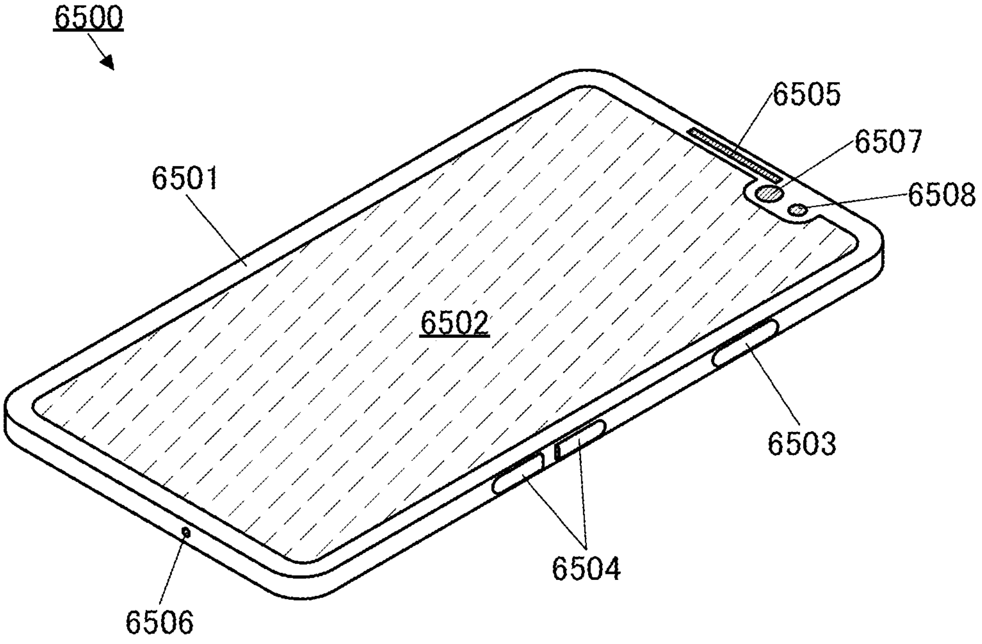
FIG. 30A and FIG. 30B are diagrams illustrating an example of an electronic device.

An electronic device 6500 illustrated in FIG. 30A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 30B:
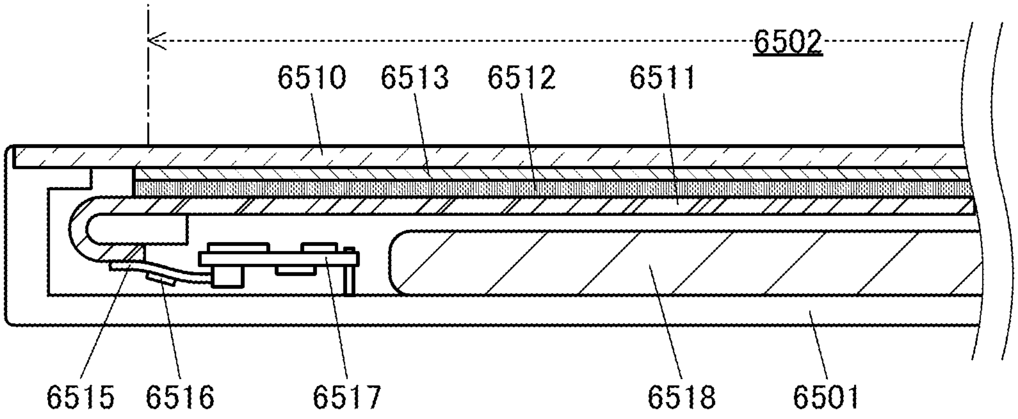

FIG. 30B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is reduced. Moreover, part of the display panel 6511 is folded back so that a connection portion with the FPC 6515 is provided on the back side of the pixel portion, whereby an electronic device with a narrow bezel can be achieved.

Figure 31A:
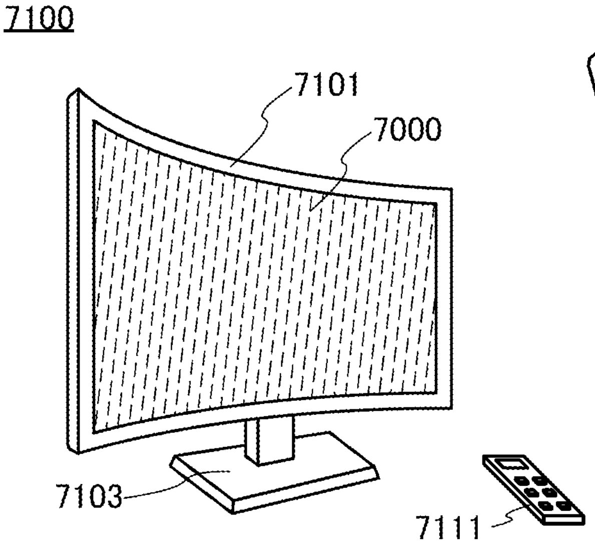
FIG. 31A to FIG. 31D are diagrams illustrating examples of electronic devices.

FIG. 31A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 31A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 31B:
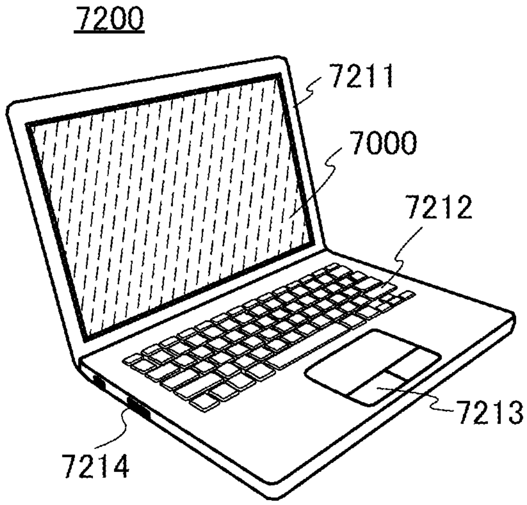

FIG. 31B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

Figure 31C:
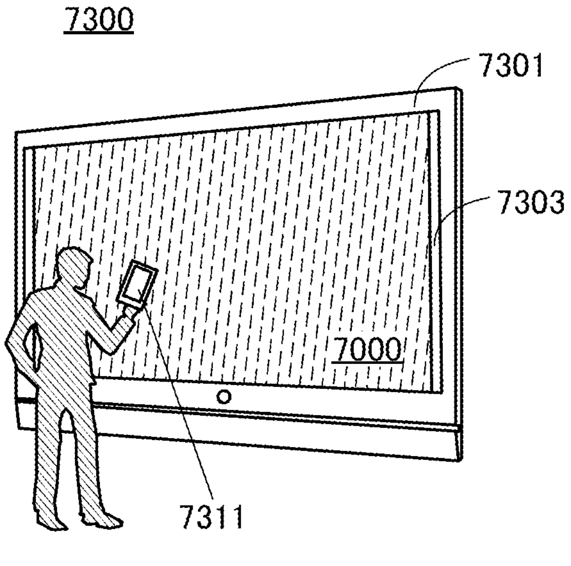
Figure 31D:
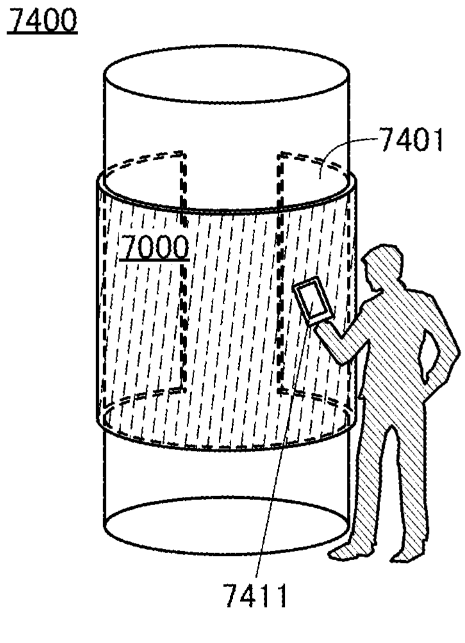

FIG. 31C and FIG. 31D illustrate examples of digital signage.

Digital signage 7300 illustrated in FIG. 31C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 31D is digital signage 7400 attached to a cylindrical pillar 7401. The digital signage 7400 includes the display portion 7000 provided along a curved surface of the pillar 7401.

The display apparatus of one embodiment of the present invention can be used for the display portion 7000 in FIG. 31C and FIG. 31D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 31C and FIG. 31D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 32A to FIG. 32G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The display apparatus of one embodiment of the present invention can be used for the display portion 9001 in FIG. 32A to FIG. 32G.

The electronic devices illustrated in FIG. 32A to FIG. 32G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The electronic devices illustrated in FIG. 32A to FIG. 32G are described in detail below.

Figure 32A:
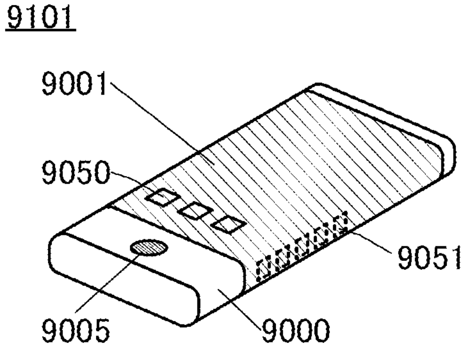
FIG. 32A to FIG. 32G are diagrams illustrating examples of electronic devices.

FIG. 32A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 32A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 32B:
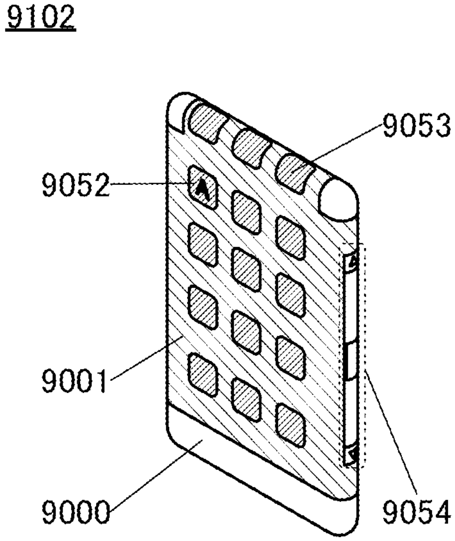

FIG. 32B is a perspective view showing a portable information terminal 9102. The portable information terminal 9102 has a function of displaying information on three or more surfaces of the display portion 9001. Shown here is an example in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 32C:
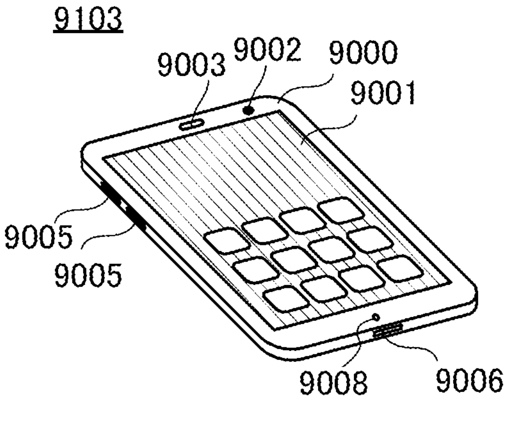

FIG. 32C is a perspective view of a tablet terminal 9103. The tablet terminal 9103 is capable of executing a variety of applications such as mobile phone calls, e-mailing, viewing and editing texts, music reproduction, Internet communication, and a computer game. The tablet terminal 9103 includes the display portion 9001, a camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 32D:
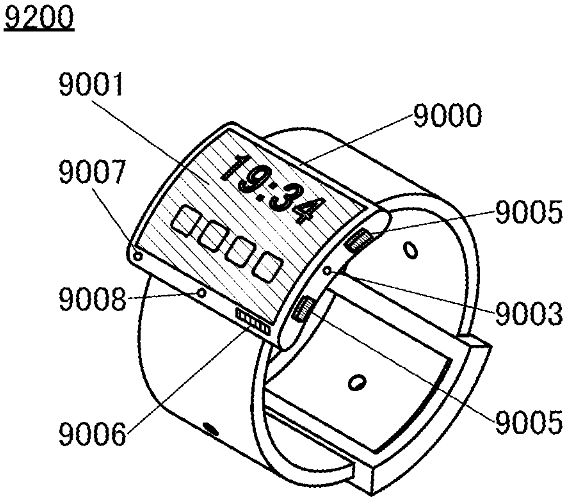

FIG. 32D is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Furthermore, intercommunication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 32E:
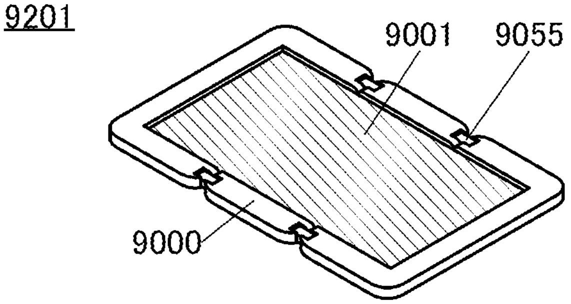
Figure 32F:
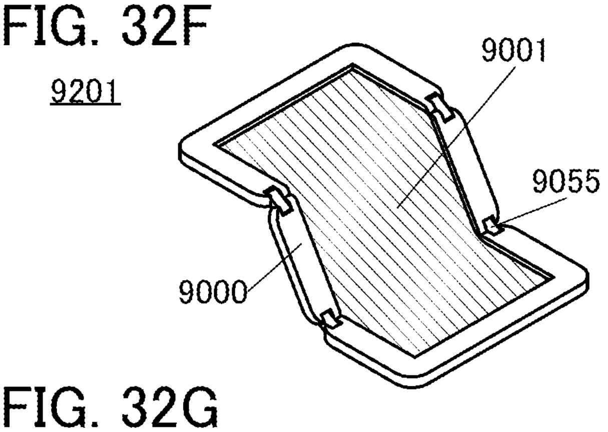
Figure 32G:
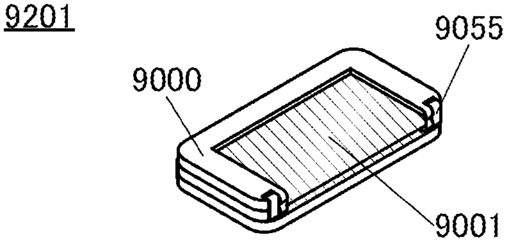

FIG. 32E to FIG. 32G are perspective views illustrating a foldable portable information terminal 9201. FIG. 32E is a perspective view of an opened state of the portable information terminal 9201, FIG. 32G is a perspective view of a folded state thereof, and FIG. 32F is a perspective view of a state in the middle of change from one of FIG. 32E and FIG. 32G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with the other embodiments as appropriate.

REFERENCE NUMERALS

AL: wiring, CL: wiring, GL: wiring, IRS: subpixel, PS: subpixel, RL: wiring, SL: wiring, SLB: wiring, SLG: wiring, SLR: wiring, 10: display apparatus, 11: display portion, 12: driver circuit portion, 13: driver circuit portion, 21B: subpixel, 21G: subpixel, 21R: subpixel, 21: pixel, 30: pixel, 100A: display apparatus, 100B: display apparatus, 100C: display apparatus, 100D: display apparatus, 100E: display apparatus, 100: display apparatus, 101: layer, 110*a*: subpixel, 110*b*: subpixel, 110*c*: subpixel, 110*d*: subpixel, 110: pixel, 111*a*: pixel electrode, 111*b*: pixel electrode, 111*c*: pixel electrode, 111*d*: pixel electrode, 111: conductive film, 113*a*: first layer, 113*b*: second layer, 113*c*: third layer, 113*d*: fourth layer, 113: layer, 114: fifth layer, 115: common electrode, 117: light-blocking layer, 118A: first sacrificial layer, 118*a*: first sacrificial layer, 118B: first sacrificial layer, 118*b*: first sacrificial layer, 118C: first sacrificial layer, 118*c*: first sacrificial layer, 119A: second sacrificial layer, 119*a*: second sacrificial layer, 119B: second sacrificial layer, 119*b*: second sacrificial layer, 119C: second sacrificial layer, 119*c*: second sacrificial layer, 120: substrate, 122: resin layer, 123: conductive layer, 124*a*: pixel, 124*b*: pixel, 125*a*: sidewall, 125A: insulating film, 125*b*: sidewall, 125B: insulating film, 125: sidewall, 126*a*: optical adjustment layer, 126*b*: optical adjustment layer, 126*c*: optical adjustment layer, 130*a*: light-emitting device, 130*b*: light-emitting device, 130*c*: light-emitting device, 130*d*: light-emitting device, 131: protective layer, 132: protective layer, 134: space, 140: connection portion, 142: adhesive layer, 151: substrate, 152: substrate, 153: insulating layer, 162: display portion, 164: circuit, 165: wiring, 166: conductive layer, 172: FPC, 173: IC, 181A: first light-emitting unit, 181*a*: first light-emitting unit, 181B: first light-emitting unit, 181*b*: first light-emitting unit, 181C: first light-emitting unit, 181*c*: first light-emitting unit, 181*d*: first light-emitting unit, 182A: charge-generation layer, 182*a*: charge-generation layer, 182B: charge-generation layer, 182*b*: charge-generation layer, 182C: charge-generation layer, 182*c*: charge-generation layer, 182*d*: charge-generation layer, 183A: second light-emitting unit, 183*a*: second light-emitting unit, 183B: second light-emitting unit, 183*b*: second light-emitting unit, 183C: second light-emitting unit, 183*c*: second light-emitting unit, 183*d*: second light-emitting unit, 190*a*: resist mask, 190*b*: resist mask, 190*c*: resist mask, 190*d*: resist mask, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231*i*: channel formation region, 231*n*: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255*a*: insulating layer, 255*b*: insulating layer, 256: plug, 261: insulating layer, 262: insulating layer, 263: insulating layer, 264: insulating layer, 265: insulating layer, 271: plug, 274*a*: conductive layer, 274*b*: conductive layer, 274: plug, 280: display module, 281: display portion, 282: circuit portion, 283*a*: pixel circuit, 283: pixel circuit portion, 284*a*: pixel, 284: pixel portion, 285: terminal portion, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 351: substrate, 352: finger, 353: layer, 355: functional layer, 357: layer, 359: substrate, 401: substrate, 410*a*: transistor, 410: transistor, 411*i*: channel formation region, 411*n*: low-resistance region, 411: semiconductor layer, 412: insulating layer, 413: conductive layer, 414*a*: conductive layer, 414*b*: conductive layer, 415: conductive layer, 416: insulating layer, 421: insulating layer, 422: insulating layer, 423: insulating layer, 426: insulating layer, 431: conductive layer, 450*a*: transistor, 450: transistor, 451: semiconductor layer, 452: insulating layer, 453: conductive layer, 454*a*: conductive layer, 454*b*: conductive layer, 455: conductive layer, 500: display apparatus, 501: electrode, 502: electrode, 512B_1: light-emitting unit, 512B_2: light-emitting unit, 512B_3: light-emitting unit, 512B_n: light-emitting unit, 512G_1: light-emitting unit, 512G_2: light-emitting unit, 512G_3: light-emitting unit, 512G_n: light-emitting unit, 512Q_1: light-emitting unit, 512Q_2: light-emitting unit, 512Q_3: light-emitting unit, 512Q_n: light-emitting unit, 512R_1: light-emitting unit, 512R_2: light-emitting unit, 512R_3: light-emitting unit, 512R_n: light-emitting unit, 521: layer, 522: layer, 523B: light-emitting layer, 523G: light-emitting layer, 523Q_1: light-emitting layer, 523Q_2: light-emitting layer, 523Q_3: light-emitting layer, 523R: light-emitting layer, 524: layer, 525: layer, 531: charge-generation layer, 550B: light-emitting device, 550G: light-emitting device, 550R: light-emitting device, 550W: light-emitting device, 700A: electronic device, 700B: electronic device, 721: housing, 723: wearing portion, 727: earphone portion, 750: earphone, 751: display panel, 753: optical member, 756: display region, 757: frame, 758: nose pad, 800A: electronic device, 800B: electronic device, 820: display portion, 821: housing, 822: communication portion, 823: wearing portion, 824: control portion, 825: image capturing portion, 827: earphone portion, 832: lens, 6500: electronic device, 6501: housing, 6502: display portion, 6503: power supply button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9002: camera, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9103: tablet terminal, 9200: portable information terminal, 9201: portable information terminal

The invention claimed is:

1. A method of manufacturing a display apparatus, comprising the steps of:

forming an insulating layer;

forming a conductive film over the insulating layer;

forming a first layer over the conductive film;

forming a first sacrificial layer over the first layer;

processing the first layer and the first sacrificial layer to expose part of the conductive film;

forming a second layer over the first sacrificial layer and the conductive film;

forming a second sacrificial layer over the second layer;

processing the second layer and the second sacrificial layer to expose part of the conductive film;

processing the conductive film to form a first pixel electrode overlapping with the first sacrificial layer and a second pixel electrode overlapping with the second sacrificial layer;

forming a first insulating film covering at least a side surface of the first pixel electrode, a side surface of the second pixel electrode, a side surface of the first layer, a side surface of the second layer, a side surface and a top surface of the first sacrificial layer, and a side surface and a top surface of the second sacrificial layer;

forming a second insulating film over the first insulating film;

processing the first insulating film and the second insulating film to form a first sidewall covering at least the side surface of the first pixel electrode and the side surface of the first layer and a second sidewall over the first sidewall;

removing the first sacrificial layer and the second sacrificial layer; and forming a common electrode over the first layer and the second layer.

2. The method of manufacturing a display apparatus, according to claim 1, wherein a first sacrificial film and a second sacrificial film over the first sacrificial film are formed as the first sacrificial layer, wherein a first resist mask is formed over the second sacrificial film and then the second sacrificial film is processed with use of the first resist mask, wherein the first resist mask is removed, wherein the first sacrificial film is processed with use of the processed second sacrificial film as a hard mask, and wherein the first layer is processed with use of the processed first sacrificial film as a hard mask.

3. The method of manufacturing a display apparatus, according to claim 1, wherein the conductive film is processed with use of the first sacrificial layer and the second sacrificial layer as hard masks.

4. The method of manufacturing a display apparatus, according to claim 1, wherein the first layer comprises a first light-emitting unit, a charge-generation layer over the first light-emitting unit, and a second light-emitting unit over the charge-generation layer, and wherein the first light-emitting unit and the second light-emitting unit comprise light-emitting layers emitting light of the same color.

5. The method of manufacturing a display apparatus, according to claim 1, wherein a protective layer is formed over the common electrode.

6. The method of manufacturing a display apparatus, according to claim 1, wherein after the first sacrificial layer and the second sacrificial layer are removed, a third layer is formed over the first layer and the second layer, and wherein the common electrode is formed over the third layer.

7. The method of manufacturing a display apparatus, according to claim 1, wherein a depressed portion is formed on the insulating layer in the step of processing the conductive film.

* * * * *